(12) United States Patent
Shiraishi et al.

(10) Patent No.: US 10,204,899 B2
(45) Date of Patent: Feb. 12, 2019

(54) SEMICONDUCTOR DEVICE WITH FIRST AND SECOND CHIPS AND CONNECTIONS THEREOF AND A MANUFACTURING METHOD OF THE SAME

(71) Applicant: RENESAS ELECTRONICS CORPORATION, Tokyo (JP)

(72) Inventors: Masaki Shiraishi, Hitachi (JP); Tomoaki Uno, Takasaki (JP); Nobuyoshi Matsuura, Takasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/700,679

(22) Filed: Sep. 11, 2017

(65) Prior Publication Data

US 2017/0373055 A1    Dec. 28, 2017

Related U.S. Application Data

(63) Continuation of application No. 15/265,940, filed on Sep. 15, 2016, now Pat. No. 9,793,265, which is a (Continued)

(30) Foreign Application Priority Data

Jul. 30, 2004    (JP) .................................. 2004-223664

(51) Int. Cl.
*H01L 27/06* (2006.01)
*H01L 23/31* (2006.01)
(Continued)

(52) U.S. Cl.
CPC .... *H01L 27/0629* (2013.01); *H01L 21/28035* (2013.01); *H01L 21/823475* (2013.01); (Continued)

(58) Field of Classification Search
None
See application file for complete search history.

(56) References Cited

U.S. PATENT DOCUMENTS

| 4,823,172 A | 4/1989 | Mihara |
| 5,814,884 A | 9/1998 | Cheah et al. |

(Continued)

FOREIGN PATENT DOCUMENTS

| CN | 157022 A | 12/2004 |
| JP | 09-102602 | 4/1997 |

(Continued)

OTHER PUBLICATIONS

Japanese Office Action received in JP2011-114841 dated Feb. 19, 2013.

(Continued)

*Primary Examiner* — Bilkis Jahan
(74) *Attorney, Agent, or Firm* — Mattingly & Malur, PC

(57) ABSTRACT

In a non-insulated DC-DC converter having a circuit in which a power MOS•FET high-side switch and a power MOS•FET low-side switch are connected in series, the power MOS•FET low-side switch and a Schottky barrier diode to be connected in parallel with the power MOS•FET low-side switch are formed within one semiconductor chip. The formation region SDR of the Schottky barrier diode is disposed in the center in the shorter direction of the semiconductor chip, and on both sides thereof, the formation regions of the power MOS•FET low-side switch are disposed. From the gate finger in the vicinity of both long sides on the main surface of the semiconductor chip toward the formation region SDR of the Schottky barrier diode, a plurality of gate fingers are disposed so as to interpose the formation region SDR between them.

4 Claims, 40 Drawing Sheets

Related U.S. Application Data continuation of application No. 14/857,596, filed on Sep. 17, 2015, now Pat. No. 9,461,163, which is a continuation of application No. 14/340,198, filed on Jul. 24, 2014, now Pat. No. 9,153,686, which is a continuation of application No. 14/072,047, filed on Nov. 5, 2013, now Pat. No. 8,853,846, which is a continuation of application No. 13/588,538, filed on Aug. 17, 2012, now Pat. No. 8,592,904, which is a continuation of application No. 13/396,073, filed on Feb. 14, 2012, now Pat. No. 8,519,533, which is a continuation of application No. 12/686,595, filed on Jan. 13, 2010, now Pat. No. 8,138,598, which is a continuation of application No. 11/192,069, filed on Jul. 29, 2005, now Pat. No. 7,687,902.

(51) Int. Cl.

| | | |
|---|---|---|
| *H01L 23/495* | (2006.01) | |
| *H01L 23/00* | (2006.01) | |
| *H01L 29/78* | (2006.01) | |
| *H02M 7/00* | (2006.01) | |
| *H01L 21/28* | (2006.01) | |
| *H01L 21/8234* | (2006.01) | |
| *H01L 29/49* | (2006.01) | |
| *H01L 29/66* | (2006.01) | |
| *H02M 3/155* | (2006.01) | |
| *H01L 29/10* | (2006.01) | |
| *H01L 29/417* | (2006.01) | |
| *H01L 29/423* | (2006.01) | |
| *H01L 29/45* | (2006.01) | |
| *H01L 29/872* | (2006.01) | |

(52) U.S. Cl.
CPC .... *H01L 23/3107* (2013.01); *H01L 23/49524* (2013.01); *H01L 23/49562* (2013.01); *H01L 23/49575* (2013.01); *H01L 24/06* (2013.01); *H01L 24/37* (2013.01); *H01L 24/40* (2013.01); *H01L 24/49* (2013.01); *H01L 24/73* (2013.01); *H01L 29/4236* (2013.01); *H01L 29/45* (2013.01); *H01L 29/4916* (2013.01); *H01L 29/66143* (2013.01); *H01L 29/66734* (2013.01); *H01L 29/7806* (2013.01); *H01L 29/7813* (2013.01); *H02M 3/155* (2013.01); *H02M 7/003* (2013.01); *H01L 24/45* (2013.01); *H01L 24/48* (2013.01); *H01L 29/1095* (2013.01); *H01L 29/41741* (2013.01); *H01L 29/4232* (2013.01); *H01L 29/4238* (2013.01); *H01L 29/456* (2013.01); *H01L 29/872* (2013.01); *H01L 2224/0401* (2013.01); *H01L 2224/04042* (2013.01); *H01L 2224/05554* (2013.01); *H01L 2224/05624* (2013.01); *H01L 2224/371* (2013.01); *H01L 2224/37124* (2013.01); *H01L 2224/37147* (2013.01); *H01L 2224/40095* (2013.01); *H01L 2224/40245* (2013.01); *H01L 2224/40247* (2013.01); *H01L 2224/45015* (2013.01); *H01L 2224/45144* (2013.01); *H01L 2224/48011* (2013.01); *H01L 2224/48091* (2013.01); *H01L 2224/48095* (2013.01); *H01L 2224/48137* (2013.01); *H01L 2224/48247* (2013.01); *H01L 2224/48253* (2013.01); *H01L 2224/48624* (2013.01); *H01L 2224/4903* (2013.01); *H01L 2224/49051* (2013.01); *H01L 2224/49111* (2013.01); *H01L 2224/49171* (2013.01); *H01L 2224/49175* (2013.01); *H01L 2224/73221* (2013.01); *H01L 2224/8385* (2013.01); *H01L 2224/8485* (2013.01); *H01L 2224/84801* (2013.01); *H01L 2924/00* (2013.01); *H01L 2924/00012* (2013.01); *H01L 2924/00014* (2013.01); *H01L 2924/01002* (2013.01); *H01L 2924/01004* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01015* (2013.01); *H01L 2924/01021* (2013.01); *H01L 2924/01022* (2013.01); *H01L 2924/01023* (2013.01); *H01L 2924/01027* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01057* (2013.01); *H01L 2924/01072* (2013.01); *H01L 2924/01074* (2013.01); *H01L 2924/01078* (2013.01); *H01L 2924/01079* (2013.01); *H01L 2924/01082* (2013.01); *H01L 2924/12032* (2013.01); *H01L 2924/1305* (2013.01); *H01L 2924/1306* (2013.01); *H01L 2924/13091* (2013.01); *H01L 2924/14* (2013.01); *H01L 2924/1532* (2013.01); *H01L 2924/181* (2013.01); *H01L 2924/19041* (2013.01); *H01L 2924/19043* (2013.01); *H01L 2924/20753* (2013.01); *H01L 2924/20755* (2013.01); *H01L 2924/3011* (2013.01); *H01L 2924/30105* (2013.01); *H01L 2924/30107* (2013.01)

(56) References Cited

U.S. PATENT DOCUMENTS

| | | | |
|---|---|---|---|
| 5,905,370 | A | 5/1999 | Bryson |
| 6,097,046 | A | 8/2000 | Plumton |
| 6,184,585 | B1 | 2/2001 | Martinez et al. |
| 6,448,643 | B2 | 9/2002 | Cheah et al. |
| 6,552,390 | B2* | 4/2003 | Kameda ............ H01L 29/7835 257/335 |
| 6,552,429 | B2 | 4/2003 | Arai et al. |
| 6,600,194 | B2* | 7/2003 | Hueting ............ H01L 27/088 257/330 |
| 6,603,291 | B2 | 8/2003 | Wheeler et al. |
| 6,775,164 | B2 | 8/2004 | Wong et al. |
| 6,806,548 | B2* | 10/2004 | Shirai ............ H01L 29/475 257/473 |
| 6,867,494 | B2 | 3/2005 | Kameda et al. |
| 6,882,047 | B2 | 4/2005 | Hata et al. |
| 6,940,724 | B2 | 9/2005 | Divakar et al. |
| 6,979,865 | B2* | 12/2005 | Peake ............ H01L 27/0727 257/341 |
| 7,078,782 | B2 | 7/2006 | Shirai et al. |
| 7,126,169 | B2 | 10/2006 | Kitabatake |
| 7,145,224 | B2 | 12/2006 | Kawashima et al. |
| 7,224,022 | B2 | 5/2007 | Tokano et al. |
| 7,348,228 | B2 | 3/2008 | Wu |
| 7,423,298 | B2* | 9/2008 | Mariyama ........... H01L 31/1113 257/113 |
| 7,436,070 | B2 | 10/2008 | Uno et al. |
| 7,518,208 | B2 | 4/2009 | Shirai et al. |
| 7,829,946 | B2 | 11/2010 | Shirai et al. |
| 7,863,756 | B2 | 1/2011 | Uno et al. |
| 8,138,598 | B2 | 3/2012 | Shiraishi et al. |
| 8,853,846 | B2 | 10/2014 | Shiraishi |
| 2001/0048154 | A1* | 12/2001 | Cheah ............ H01L 23/49562 257/723 |
| 2002/0021560 | A1* | 2/2002 | Jauregui ............ H01L 24/49 361/760 |
| 2002/0024134 | A1* | 2/2002 | Arai ............ H01L 24/49 257/723 |
| 2002/0093094 | A1 | 7/2002 | Takagawa et al. |

(56) References Cited

U.S. PATENT DOCUMENTS

| | | |
|---|---|---|
| 2002/0094670 A1 | 7/2002 | Maruoka |
| 2002/0195640 A1* | 12/2002 | Kameda ............... H01L 29/7835 257/306 |
| 2003/0016505 A1 | 1/2003 | Jauregui |
| 2003/0040144 A1 | 2/2003 | Blanchard et al. |
| 2003/0080355 A1* | 5/2003 | Shirai ................ H01L 29/0696 257/200 |
| 2004/0012049 A1* | 1/2004 | Shirai ................ H01L 23/4824 257/330 |
| 2005/0029584 A1 | 2/2005 | Shiraishi et al. |
| 2005/0156204 A1* | 7/2005 | Uno ..................... H01L 25/165 257/213 |
| 2005/0167742 A1 | 8/2005 | Challa et al. |
| 2005/0218489 A1 | 10/2005 | Satou et al. |
| 2006/0006432 A1 | 1/2006 | Shiraishi et al. |

FOREIGN PATENT DOCUMENTS

| | | |
|---|---|---|
| JP | 10-150140 | 6/1998 |
| JP | 2002-153079 A | 5/2002 |
| JP | 2002-170955 A | 6/2002 |
| JP | 2002-217416 A | 8/2002 |
| JP | 2002-238260 A | 8/2002 |
| JP | 2003-007843 A | 1/2003 |
| JP | 2003-124436 | 4/2003 |
| JP | 2003-133557 A | 5/2003 |
| JP | 2003-332518 A | 11/2003 |
| JP | 2004-055756 | 2/2004 |
| JP | 2004-055812 A | 2/2004 |
| JP | 2004-519187 A | 6/2004 |
| TW | 583773 | 4/2004 |
| WO | 03-067665 A2 | 8/2003 |
| WO | 03/079527 A2 | 9/2003 |
| WO | 2004/008532 A2 | 1/2004 |

OTHER PUBLICATIONS

Japanese Office Action received in Japanese Application No. 2013-142925 dated Aug. 5, 2014.

Taiwanese Office Action received in corresponding Taiwanese Application No. 10420747790 dated Jun. 5, 2015.

Taiwanese Office Action received in corresponding Taiwanese Application No. 104142353 dated Nov. 28, 2016.

Taiwanese Office Action received in corresponding Taiwanese Application No. 106116570 dated Jul. 24, 2017.

* cited by examiner

SEMICONDUCTOR DEVICE WITH FIRST AND SECOND CHIPS AND CONNECTIONS THEREOF AND A MANUFACTURING METHOD OF THE SAME

CROSS REFERENCE TO RELATED APPLICATIONS

This application is a continuation of U.S. patent application Ser. No. 15/265,940, filed Sep. 15, 2016, which is a continuation of U.S. patent application Ser. No. 14/857,596, filed Sep. 17, 2015, now U.S. Pat. No. 9,461,163, which is a continuation of U.S. patent application Ser. No. 14/340,198, filed Jul. 24, 2014, now U.S. Pat. No. 9,153,686, which is a continuation of U.S. patent application Ser. No. 14/072,047, filed Nov. 5, 2013, now U.S. Pat. No. 8,853,846, which is a continuation of U.S. patent application Ser. No. 13/588,538, filed Aug. 17, 2012, now U.S. Pat. No. 8,592,904, which is a continuation of U.S. patent application Ser. No. 13/396,073, filed Feb. 14, 2012, now U.S. Pat. No. 8,519,533, which is a continuation of U.S. patent application Ser. No. 12/686,595, filed Jan. 13, 2010, now U.S. Pat. No. 8,138,598, which is a continuation of U.S. patent application Ser. No. 11/192,069, filed Jul. 29, 2005, now U.S. Pat. No. 7,687,902, which the present application claims priority from Japanese patent application No. 2004-223664 filed on 30 Jul. 2004, the contents of which is hereby incorporated by reference into this application.

BACKGROUND OF THE INVENTION

The present invention relates to a semiconductor device and a manufacturing technology thereof, particularly to a technology effective when applied to a semiconductor device having a power supply circuit and a manufacturing method thereof.

A DC-DC converter widely used as one of power supply circuits has a high-side power MOS•FET (Metal Oxide Semiconductor Field Effect Transistor) and a low-side power MOS•FET connected to each other in series. The high-side power MOS•FET has a switching function for controlling a DC-DC converter, while the low-side power MOS•FET has a switching function for synchronous rectification. These two power MOS•FETs perform voltage conversion by being alternately turned ON/OFF while being synchronized with each other.

A non-insulated type DC-DC converter to be used in a power supply circuit of, for example, desktop personal computers, servers and game machines tends to have a larger current and higher frequency with a demand for an increase in the current flowing into a CPU (Central Processing Unit) or the like to be driven and size reductions of passive elements such as choke coil and input/output capacitance. With an advance of a current increase and frequency heightening, however, a conduction loss and a recovery loss of a body diode parasitic to the low-side power MOS•FET increase during the term (dead time term) when both the high-side power MOS•FET and low-side power MOS•FET are turned OFF. In order to overcome this problem, a conduction loss and a recovery loss of the diode are reduced by connecting a Schottky barrier diode (which will hereinafter be abbreviated as "SBD") to the low-side power MOS•FET in parallel and causing a current to flow through not the body diode but the SBD.

There is a description on a DC-DC converter, for example, in Japanese Unexamined Patent Publication No. Hei 10(1998)-150140. The DC-DE converter described therein has a structure in which an MOS•FET and an SBD connected in parallel with each other are formed on respective semiconductor dies and these two semiconductor dies are contained in one package (refer to Patent Document 1).

For example, in Japanese Unexamined Patent Publication No. 2003-124436, described is a DC-DC converter in which a semiconductor chip having, formed thereover, a high-side power MOS•FET and a semiconductor chip having, formed thereover, a low-side power MOS•FET and an SBD connected in parallel therewith are contained in one package (Refer to Patent Document 2).

In Japanese Unexamined Patent Publication No. Hei 9(1997)-102602, described is a semiconductor chip having, formed thereover, a low-side MOS•FET and an SBD connected in parallel therewith, wherein the SBD is formed in an active cell of the low-side MOS•FET (refer to Patent Document 3).

[Patent Document 1] Japanese Unexamined Patent Publication No. Hei 10(1998)-150140
[Patent Document 2] Japanese Unexamined Patent Publication No. 2003-124436
[Patent Document 3] Japanese Unexamined Patent Publication No. Hei 9(1997)-102602

SUMMARY OF THE INVENTION

When the technology as disclosed in the Patent Document 1 in which the low-side power MOS•FET and SBD are formed on respective semiconductor chips, a current transferring to the SBD during the dead time decreases owing to the influence of an inductance of an interconnect connecting between the low-side power MOS•FET and SBD. As a result, even the connection of the SBD having a forward voltage lower than that of a body diode does not bring about sufficient effects for reducing the conduction loss or recovery loss of the diode.

At present, less attention is paid on the gate resistance of the low-side power MOS•FET compared with the gate resistance of the high-side power MOS•FET. The present inventors have however found for the first time that when the gate resistance of the low-side power MOS•FET exceeds a predetermined value as a result of a current increase and frequency heightening as described above, a self turn-on phenomenon becomes rapidly eminent, causing a drastic increase in these losses. The self turn-on is a phenomenon that when a low-side power MOS•FET is turned OFF and a high-side power MOS•FET is turned ON, a potential of an interconnect connecting between the low-side power MOS•FET and the high-side power MOS•FET increases and a gate voltage of the low-side power MOS•FET rises, depending on a ratio of a drain-gate capacitance of the low-side power MOS•FET to a source-gate capacitance, thereby causing the low side switch to malfunction. Based on the investigation by the present inventors, it is preferred to extend and dispose a plurality of metal interconnects (gate fingers) also in the active cell region on the main surface of a semiconductor chip in order to lower the gate resistance of the low-side power MOS•FET. In the Patent Document 2, the formation of a low-side power MOS•FET and an SBD connected in parallel therewith on one semiconductor chip is disclosed, but there is no disclosure concerning frequent occurrence of self turn-on phenomena caused by a current increase and frequency heightening, a loss increase attributable to these phenomena, constitution of a gate finger to overcome these problems, and preferable arrangement of an SBD region, power MOS•FET region and gate finger.

In Patent Document 3, formation of an SBD in the active cell of a low-side MOS•FET is disclosed. Since there is no disclosure about the ohmic contact between the channel layer of the low-side power MOSFET and Schottky metal, a description on the formation means of the ohmic contact cannot be found. There is also no disclosure on an increase in the leak current at a Schottky contact portion of the SBD. No description on the reducing means of the leak current can therefore be found in the document.

An object of the present invention is to provide a technology capable of improving a conversion efficiency of a power supply voltage of a semiconductor device.

The above-described and other objects and novel features of the present invention will be apparent by the description herein and accompanying drawings.

Typical inventions, of the inventions disclosed by the present invention, will next be described briefly.

In one aspect of the present invention, there is thus provided a semiconductor device comprising a semiconductor chip equipped with a field effect transistor and an SBD, wherein a plurality of transistor cell formation regions constituting the field effect transistor are placed so as to interpose an SBD arrangement region therewith; and a plurality of metal gate interconnects to be electrically connected with gate electrodes of the plurality of transistor cells, respectively are placed in the plurality of transistor cell formation regions so as to interpose the SBD arrangement region between the plurality of metal gate interconnects.

In another aspect of the present invention, there is also provided a semiconductor device comprising a first power supply terminal for supplying a first potential; a second power supply terminal for supplying a second potential lower than the first potential; first and second field effect transistors connected in series between the first and second power supply terminals; a control circuit electrically connected to the inputs of these first and second field effect transistors and controlling the operation of these first and second field effect transistors; an output interconnect portion connected to an interconnect for connecting the first and second field effect transistors, and an SBD existing between the output interconnect portion and the second power supply terminal and connected in parallel with the second field effect transistor; wherein the second field effect transistor and the SBD are formed on one semiconductor chip; a plurality of transistor cell formation regions are disposed on the semiconductor chip so as to interpose the SBD arrangement region between the plurality of transistor cell formation regions; and a plurality of metal gate interconnects to be electrically connected with gate electrodes of the plurality of transistor cells, respectively are placed in the plurality of transistor cell formation regions so as to interpose the SBD arrangement region between the plurality of metal gate interconnects.

In a further aspect of the present invention, there is also provided a semiconductor device comprising a first power supply terminal for supplying a first potential; a second power supply terminal for supplying a second potential lower than the first potential; first and second field effect transistors connected in series between the first and second power supply terminals; a control circuit electrically connected to the inputs of these first and second field effect transistors and controlling the operation of these first and second field effect transistors; an output interconnect portion connected to an interconnect for connecting the first and second field effect transistors, and an SBD existing between the output interconnect portion and the second power supply terminal and connected in parallel with the second field effect transistor; wherein the first field effect transistor is formed on a first semiconductor chip, the second field effect transistor and the SBD are formed on a second semiconductor chip; the control circuit is formed on a third semiconductor chip; a plurality of transistor cell formation regions constituting the second field effect transistor are disposed on the second semiconductor chip so as to interpose the SBD arrangement region between the plurality of transistor cell formation regions; a plurality of metal gate interconnects to be electrically connected with gate electrodes of the plurality of transistor cells, respectively are placed in the plurality of transistor cell formation regions so as to interpose the SBD arrangement region between the plurality of metal gate interconnects; and the first, second and third semiconductor chips are sealed with one sealant.

In a still further aspect of the present invention, there is also provided a semiconductor device having a semiconductor chip equipped with a field effect transistor and an SBD, wherein the SBD is formed in a plurality of transistor cell formation regions constituting the field effect transistor; and at a contact portion between a metal constituting the SBD and a semiconductor substrate constituting the semiconductor chip, a semiconductor region having an impurity concentration lower than that of the semiconductor substrate is formed.

In a still further aspect of the present invention, there is also provided a semiconductor device having a semiconductor chip equipped with a field effect transistor and an SBD, wherein the SBD is formed in a plurality of transistor cell formation regions constituting the field effect transistor; at a contact portion between a metal constituting the SBD and a channel layer of each of the plurality of transistor cells, a first semiconductor region having an impurity concentration higher than that of the channel layer is formed; and at a contact portion between the metal constituting the SBD and a semiconductor substrate constituting the semiconductor chip, a second semiconductor region having an impurity concentration lower than that of the semiconductor substrate is formed.

Advantages available by the typical inventions, of those disclosed by the present application, will next be described.

Since the SBD can be formed satisfactorily in a semiconductor chip having the field effect transistor and metal gate interconnect, an inductance of the interconnect for connecting the field effect transistor and the SBD can be reduced. This leads to an improvement in the conversion efficiency of the power supply voltage of a semiconductor device.

DETAILED DESCRIPTION OF THE PREFERRED EMBODIMENTS

Figure 1:
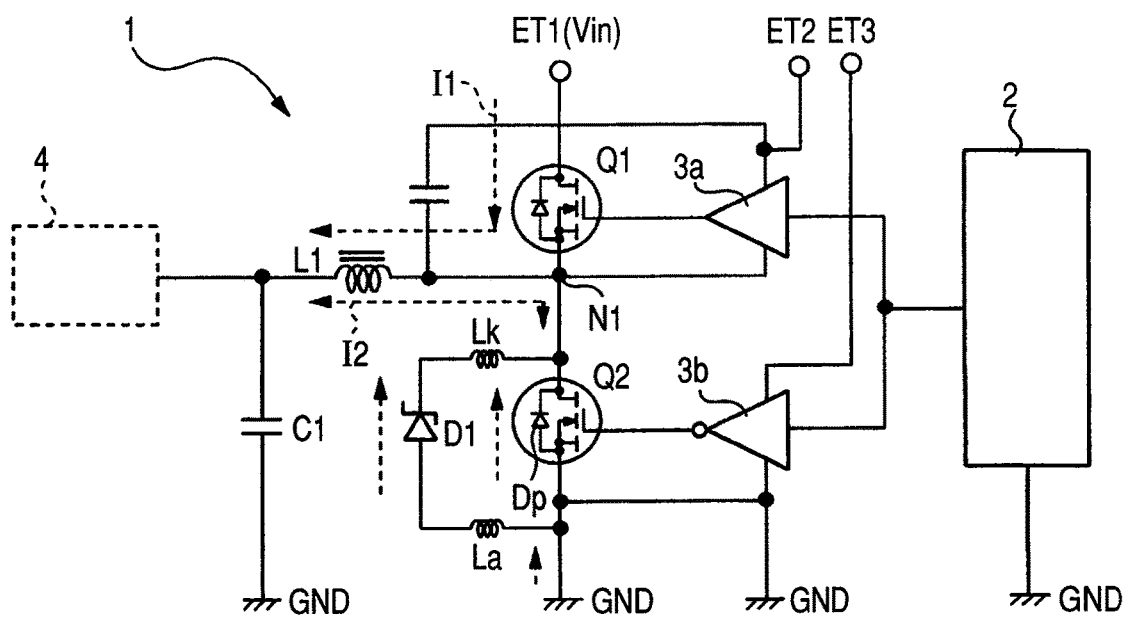
FIG. 1 is a circuit diagram illustrating one example of a semiconductor device according to one embodiment of the present invention.

In the below-described embodiments, a description will be made after divided in plural sections or in plural embodiments if necessary for convenience's sake. These plural sections or embodiments are not independent of each other, but in a relation such that one is a modification example, details or complementary description of a part or whole of the other one unless otherwise specifically indicated. In the below-described embodiments, when a reference is made to the number of elements (including the number, value, amount and range), the number is not limited to a specific number but can be greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential. Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range. In all the drawings for describing the below-described embodiments, elements having like function will be identified by like reference numerals and overlapping descriptions will be omitted. In these embodiments, MOS•FET (Metal Oxide Semiconductor Field Effect Transistor) representative of field effect transistors will be abbreviated as MOS. The embodiments of the present invention will hereinafter be described in detail based on accompanying drawings.

(Embodiment 1)

A semiconductor device according to Embodiment 1 is a non-insulated DC-DC converter to be used in a power supply circuit of electronic devices such as desktop personal computers, laptop personal computers, servers and game machines. FIG. 1 illustrates one example of a circuit diagram of the non-insulated DC-DC converter 1. The non-insulated DC-DC converter 1 has elements such as control circuit 1, driver circuits (first and second control circuits) 3a, 3b, power MOS (first and second field effect transistors) Q1, Q2, SBD (Schottky Barrier Diode) D1, coil L1 and condenser C1.

Figure 2:
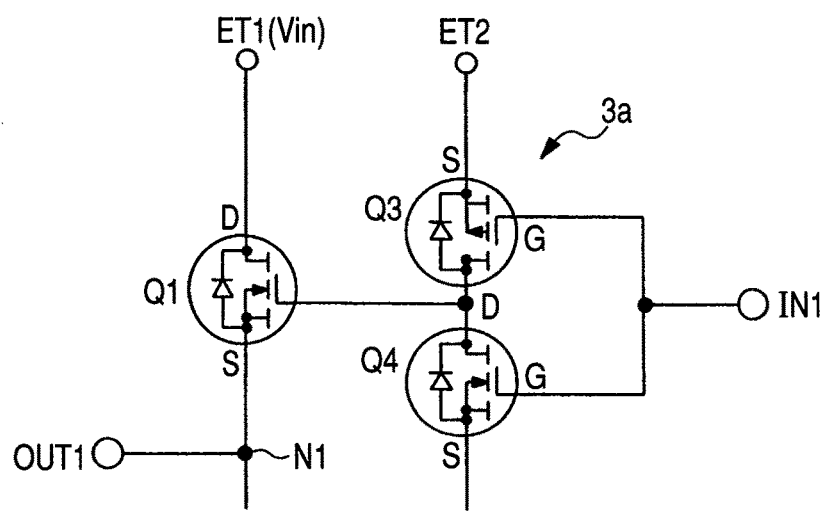
FIG. 2 is a circuit diagram illustrating one example of a control circuit of the semiconductor device of FIG. 1.

The control circuit 2 is a circuit for supplying a signal controlling the width (on time) of a voltage switch-on of the power MOS Q1, Q2 such as pulse width modulation (PWM) circuit. This control circuit 2 is housed in a package different from that of the power MOS Q1, Q2. The outputs (terminals for control signal) of this control circuit 2 are electrically connected to the inputs of the driver circuits 3a, 3b. The outputs of the driver circuits 3a, 3b are electrically connected to the gates of the power MOS Q1, Q2. The driver circuits 3a, 3b control the potential of the gate of each power MOS Q1, Q2 by a control signal fed from the control circuit 2, and thereby controlling the operation of the power MOS Q1, Q2. The driver circuits 3a, 3b are formed, for example, by a CMOS inverter circuit. FIG. 2 is one example of a circuit diagram of the driver circuit 3a. The driver circuit 3a has a circuit constitution in which a p channel power MOS Q3 and an n channel power MOS Q4 are complementarily connected in series. The driver circuit 3a is controlled based on an input signal IN1 for control, while controlling the level of an output signal OUT1 via the power MOS Q1. In the diagrams, G, D and S mean a gate, a drain and a source, respectively. The operation of the driver circuit 3b is much the same with that of the driver circuit 3a so that a description on it is omitted.

The power MOS Q1, Q2 as illustrated in FIG. 1 are connected in series between a terminal (first power supply terminal) ET1 for supplying an input power supply potential (first power supply potential) Vin and a terminal (second power supply terminal) for supplying a reference potential (second power supply potential) GND. Described specifically, the source•drain path of the power MOS Q1 is disposed to be connected in series between the terminal ET1 and output node (output terminal) N1, while the source•drain path of the power MOS Q2 is disposed so as to be connected in series between the output node N1 and terminal for supplying ground potential GND. The input power supply potential Vin is, for example, from about 5 to 12V. The reference potential GND is, for example, a lower power supply potential than the input power supply potential, for example, 0 (zero) V as a ground potential. The operating frequency (frequency at which the power MOS Q1, Q2 are turned ON or OFF) of the non-insulated DC-DC converter 1 is, for example, about 1 MHz.

The power MOS Q1 is a power transistor for high-side switch (on the high potential side: first operation voltage) and has a switching function for storing energy in the coil L1, which feeds electric power to the output (input of a load circuit 4) of the non-insulated DC-DC converter 1. This power MOS Q1 is constituted of a vertical field effect transistor having a channel formed in the thickness direction of the semiconductor chip. According to the investigation by the present inventors, in the power MOS Q1 for high-side switch, a switching loss (turn-on loss and turn-off loss) seems large with an increase in the operating frequency of the non-insulated DC-DC converter 1, depending on a parasitic loss to be added to the MOS Q1. In the ordinary circumstances, it is therefore desired to use a horizontal field effect transistor, which has a channel formed along the main surface (a surface crossing relative to the thickness direction of the semiconductor chip) of a semiconductor chip, as a field effect transistor for high-side switch in consideration of a switching loss, because in the horizontal field effect transistor, an overlap area of a gate electrode and a drain region is smaller than that of the vertical field effect transistor and a parasitic capacitance (gate parasitic capacitance) to be added between the gate and drain can therefore be reduced. For adjustment of the resistance (on resistance) upon operation of the horizontal field effect transistor to an equal level of the vertical field effect transistor, however, the cell area of the horizontal field effect transistor must be increased to at least 2.5 times as large as that of the vertical field effect transistor, which is disadvantageous for downsizing of the device. On the other hand, the channel width, per unit area, of the vertical field effect transistor can be made greater than that of the horizontal field effect transistor and the on resistance can therefore be reduced. In other words, by constituting the power MOS Q1 for high-side switch using a vertical field effect transistor, the downsizing of the device can be actualized, leading to the downsizing of a package.

Figure 3:
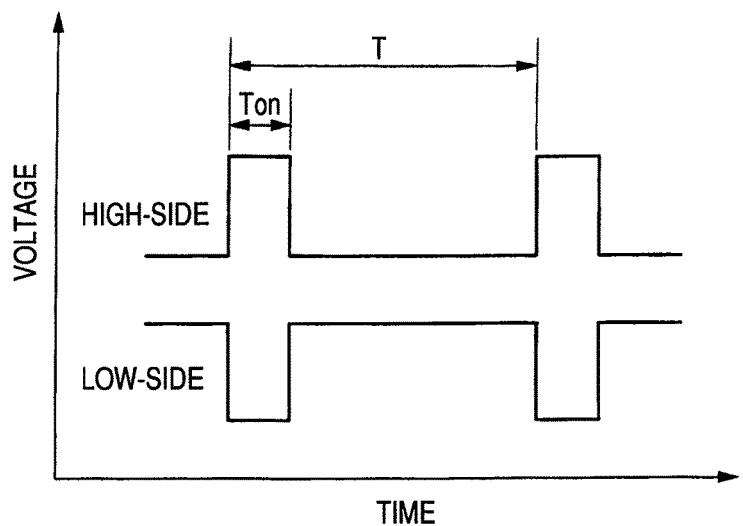
FIG. 3 is an explanatory view of one example of a timing chart upon operation of the semiconductor device of FIG. 1.

The power MOS Q2 is a power transistor for low-side switch (low potential side; second operating voltage), is a transistor used for the rectification of the non-insulated DC-DC converter 1 and has a function of performing rectification by lowering the resistance of the transistor synchronously with the frequency from the control circuit 2. This power MOS Q2 is, similar to the power MOS Q1, constituted of a vertical power MOS having a channel formed in the thickness direction of the semiconductor chip, for example, because of the following reason. FIG. 3 illustrates one example of a timing chart of the non-insulated DC-DC converter 1, in which "Ton" represents a pulse width at the time when the power MOS Q1 for high-side switch is turned ON, and "T" represents a pulse cycle. As illustrated in FIG. 3, the on-time (time during a voltage is applied) of the low-side power MOS Q2 is longer than the on-time of the high-side power MOS Q1. In the power MOS Q2, a loss due to the on-resistance seems greater than a switching loss so that use of a vertical field effect transistor which is able to have an increased channel width per unit area compared with that of a horizontal field effect transistor is advantageous. In other words, by constituting the power MOS Q2 for low-side switch from a vertical field effect transistor, the on-resistance can be reduced, whereby a voltage conversion efficiency can be improved even if a current passing through the non-insulated DC-DC converter 1 increases.

The output node N1 for supplying an output power supply potential to the outside is disposed in the interconnect between the source of the power MOS Q1 and the drain of the power MOS Q2 of the non-insulated DC-DC converter 1 as illustrated in FIG. 1. The output node N1 is electrically connected to the coil L1 via an output interconnect and is electrically connected further to a load circuit 4 via the output interconnect. Between the output interconnect for connecting the output node N1 and coil L1 and a terminal for supplying a reference potential GND, the SBD D1 is electrically connected in parallel with the power MOS Q2. This SBD D1 is a diode having a forward voltage Vf lower than that of a parasitic diode Dp of the power MOS Q2. The anode of the SBD D1 is electrically connected to a terminal for supplying a reference potential GND and its cathode is electrically connected to the output interconnect for connecting the output anode N1 and the drain of the power MOS Q2. Connection of the SBD D1 as described above makes it possible to decrease a voltage reduction during a dead time when the power MOS Q2 is turned OFF, reduce a conduction loss of the diode and reduce a diode recovery loss by the speedup of reverse recovery time (trr).

Between the output interconnect for connecting the coil L1 and load circuit 4 and the referential potential GND supplying terminal, the condenser C1 is electrically connected. As the load circuit 4, a CPU (Central Processing Unit) or DSP (Digital Signal Processor) of the above-described electronic device can be given as one example. The terminals ET2, ET3 in FIG. 1 are power voltage supplying terminals to the driver circuits 3a, 3b, respectively.

In such a circuit, conversion of power supply voltage is performed by alternately turning on/off while synchronizing by the power MOS Q1, Q2. Described specifically, when the power MOS Q1 for high-side switch is turned ON, a current (first current) I1 flows from the terminal ET1 electrically connected to the drain of the power MOS Q1 to the output node N1 via the power MOS Q1. When the power MOS Q1 for high-side switch is turned OFF, a current I2 flows by the counter electromotive force of the coil L1. A voltage drop can be reduced by turning ON the power MOS Q2 for low-side switch when this current I2 flows. The above-described current I1 is a large electric current of, for example, about 20A.

Figure 4:
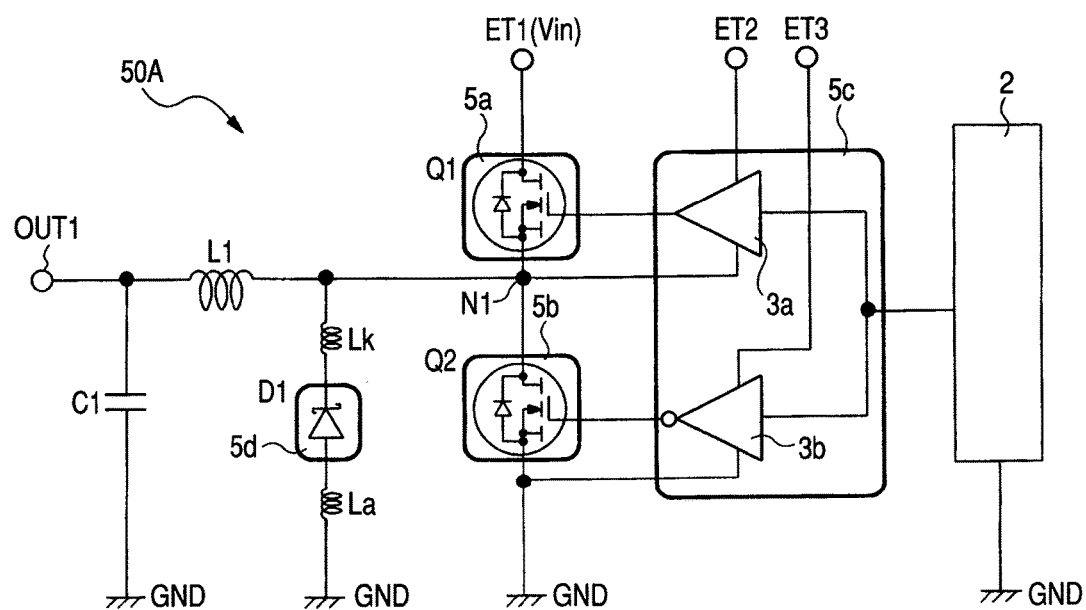
FIG. 4 is an explanatory view illustrating a constitution example of a semiconductor chip of a semiconductor device investigated by the present inventors.

FIG. 4 illustrates one example of the constitution of a non-insulated DC-DC converter 50A obtained by forming a low-side power MOS Q2 and SBD D1 on respective semiconductor chips. In this non-insulated DC-DC converter 50A, a power MOS Q1 for high-side switch, a power MOS Q2 for low-side switch, driver circuits 3a, 3b and Schottky barrier diode D1 are formed over respective semiconductor chips 5a to 5d. The present inventors have found, however, that such a constitution has the below-described three problems.

First problem is that since the SBD D1 is formed on another chip, appearance of the voltage conversion efficiency improving effects which will otherwise be brought by the SBD D1 is disturbed. Described specifically, this problem occurs, because an interconnect electrically connecting the cathode of the SBD D1 and the output interconnect of the non-insulated DC-DC converter 50A and an interconnect electrically connecting the anode of the SBD D1 and a grounding interconnect each inevitably has a long path, which increases parasitic inductances Lk, La parasitic to these interconnects; the transfer of the load current during the dead time (turn-off term of both power MOS Q1, Q2) of the non-insulated DC-DC converter 50A is inhibited by the parasitic inductance Lk, La and a current does not flow to the SBD D1 smoothly and instead, flows to the parasitic diode Dp of the power MOS Q2; and as a result, in spite of the connection of the SBD D1 which has a lower forward voltage than the that of the body diode Dp, sufficient effects for reducing a diode conduction loss and a diode recovery loss by the speed-up of the reverse recovery time (trr) cannot be obtained. In recent years, in the non-insulated DC-DC converter, a driving current necessary for a non-insulated DC-DC converter rises with an increase in the driving current of the load circuit 4 and in addition, the operating frequency of the non-insulated DC-DC converter is increasing from the viewpoints of stable supply of a constant voltage and downsizing of the coil L1 and condenser C1 (reduction in the whole size by decreasing the number of elements) so that the above-described problem due to the inductances Lk, La of the interconnect has become prominent more and more.

Figure 5:
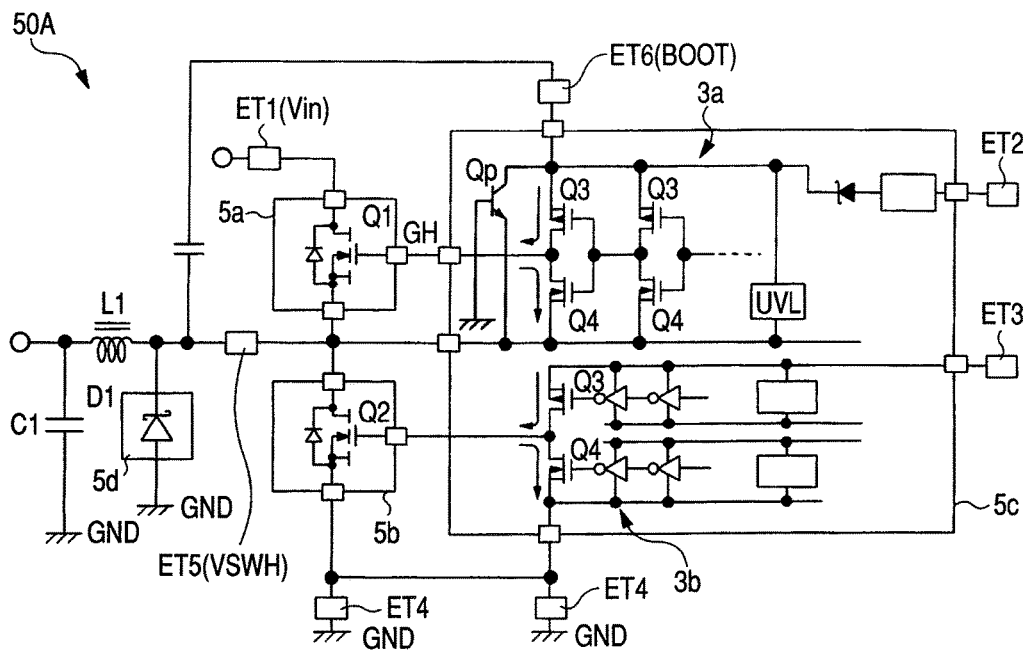
FIG. 5 is an explanatory view of a circuit of a semiconductor device.
Figure 6:
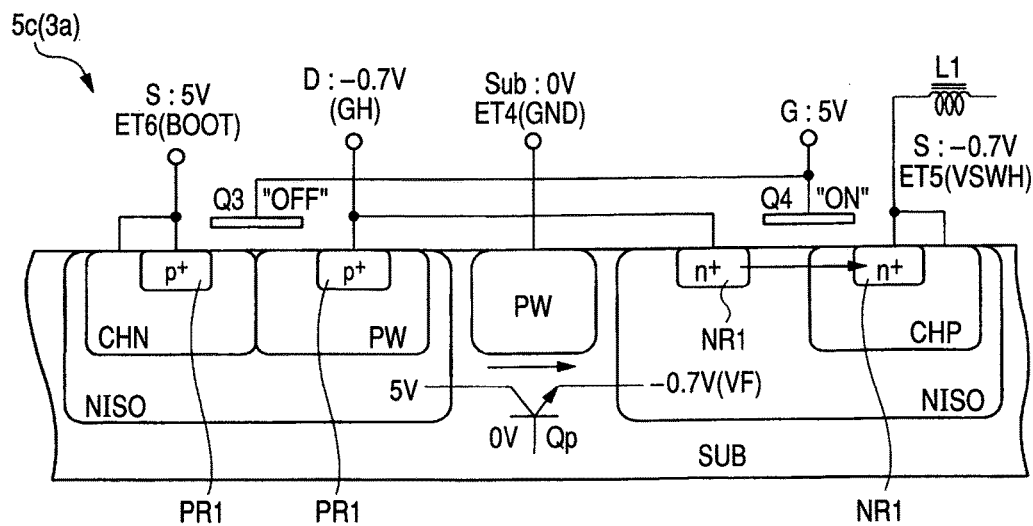
FIG. 6 is an explanatory of a parasitic operation of a semiconductor chip having a control circuit formed thereover.

The second problem is a problem which occurs in a driver chip (semiconductor chip 5c) having driver circuits 3a, 3b formed thereover owing to the disturbance of the transfer of a load current to the SBD D1 by the parasitic inductances Lk, La of the interconnects. Referring to FIGS. 5 and 6, this problem will next be explained. FIG. 5 is an explanatory view of the circuit of a non-insulated DC-DC converter including the driver circuits 3a, 3b and their output stages, while FIG. 6 is an explanatory view of the behavior of a parasitic element of the semiconductor chip 5c having the driver circuit 3a formed thereover. A terminal ET4 of FIG. 5 is the terminal for supplying a reference potential GND, while a terminal ET5 is an output terminal of the non-insulated DC-DC converter 1. A terminal ET6 (BOOT) is a terminal for a boot strap circuit for controlling the gate of the power MOS Q1 for high-side switch. Since the potential of the source of the power MOS Q1 is high (unreasonable) relative to the reference potential GND so that it supplies a voltage from the terminal ET6. What is represented by "UVL" is a protection circuit having a function of automatically terminating the generation of the output of the non-insulated DC-DC converter 1, judging that abnormal operation might happen when a voltage between the terminal ET5 and the terminal ET6 does not reach a certain reference voltage. "GH" represents a gate of the power MOS Q1 for high-side switch. A semiconductor substrate SUB of FIG. 6 is a substrate portion of the semiconductor chip 5c and it is made of, for example, a p type silicon (Si) single crystal. In this diagram, "NISO" means an n type semiconductor region, "PW" means a p type semiconductor region (p well), "CHN" means an n type semiconductor region in which the channel of a p channel power MOS Q3 is to be formed, "CHP" means a p type semiconductor region in which the channel of an n channel power MOS Q4 is to be formed, "PR1" is a p$^+$ type semiconductor region for the source•drain of the p channel power MOS Q3, and "NR1" is an n$^+$ type semiconductor region for the source•drain of the n channel power MOS Q4.

In such a constitution, a load current is fed through the SBD D1 when both power MOS Q1 and Q2 is in the dead time. When the load current flowing to the SBD D1 becomes small owing to the parasitic inductances Lk, La of the interconnects and the load current flows also to the parasitic diode (body diode) Dp of the power MOS Q2 for low-side switch upon application of a heavy load, the following problem occurs. The potential of the terminal ET5 (VSWH) on the output side of the non-insulated DC-DC converter 50A lowers to a negative potential by a forward voltage Vf of the parasitic diode Dp, which also reduces the output of the driver chip (controlling IC) electrically connected to the power MOS Q1 to a negative potential, whereby a parasitic npn type bipolar transistor Qp is turned ON in the semiconductor chip 5c, resulting in an increase in the consumption current of the driver chip. In addition, when an extraction amount of charges from the terminal ET6 (BOOT) becomes large and a potential between the terminals ET5 and ET6 becomes lower than a specified potential value, the malfunction of the protection circuit UVL, that is, its automatic operation to terminate the power MOS Q1 occurs.

The third problem is an inevitable grow in the size of the system, because a Schottky barrier diode D1 is formed in another package. Particularly when the whole system is constructed by electrically connecting a plurality of non-insulated DC-DC converters to one load circuit 4 and the Schottky barrier diode formed in the another package is connected to each non-insulated DC-DC converter, downsizing of the whole system is hindered.

In Embodiment 1, as described later, the power MOS Q2 and SBD D1 are formed in one semiconductor chip. This makes it possible to drastically reduce the parasitic inductance La, Lk which are parasitic to the interconnect connecting the power MOS Q2 and SBD D1, thereby causing an electric current to flow to the SBD D1 rather than to the body diode Dp during the dead time. In short, by such a constitution, the SBD D1 is able to exhibits its function sufficiently. A conduction loss and recovery loss of the diode can therefore be reduced, which leads to an improvement in the conversion efficiency of a power supply voltage of the non-insulated DC-DC converter 1. In addition, since the SBD D1 is able to exhibits its effect sufficiently, it is possible to suppress or prevent the parasitic npn type bipolar transistor Qp from being turned ON in the semiconductor chip 5c having the driver circuits 3a, 3b formed thereover and to suppress or prevent a rise in the consumption current of the circuit in the semiconductor chip 5c. Moreover, extraction of charges from the terminal ET6 as illustrated in FIG. 5 can be suppressed so that it is possible to suppress or prevent the potential between the terminals ET5 and ET6 from becoming lower than a specified potential value. This makes it possible to suppress or prevent the termination (malfunction) of the power MOS Q1 by the operation of the protection circuit UVL, thereby improving the operation reliability of the non-insulated DC-DC converter 1. In addition to these advantages, downsizing of the system can be achieved, because the SBD D1 is formed in the semiconductor chip 5b having the power MOS Q2 formed thereover.

Figure 7:
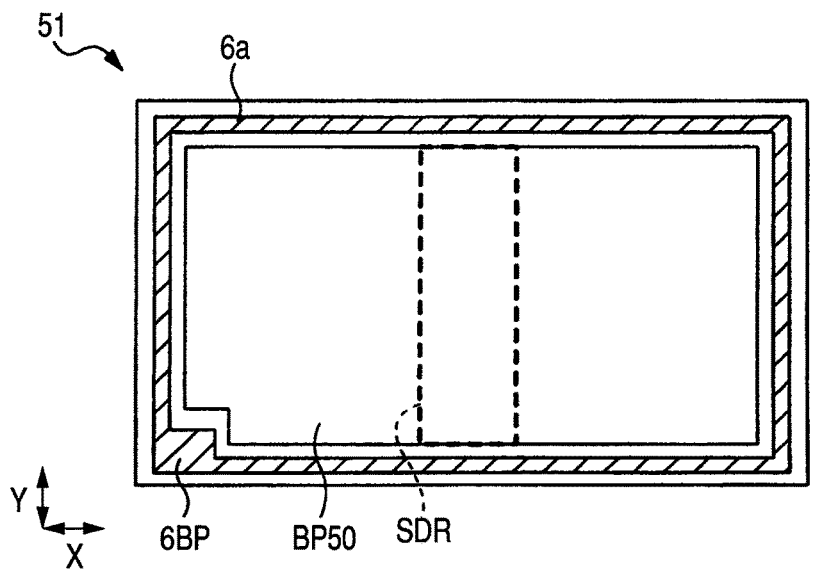
FIG. 7 is an overall plan view illustrating one example of the currently used semiconductor chip having a field effect transistor for low-side switch formed thereover, which chip has been investigated by the present inventors.

FIG. 7 is one example of an overall plan view of a currently used semiconductor chip 51 having a power MOS Q2 for low-side switch formed thereover, which chip has been investigated by the present inventors. In FIG. 7, "X" means a first direction, while "Y" means a second direction at right angles to the first direction.

Over the main surface of this semiconductor chip 51, a gate finger 6a is formed along the periphery of the semiconductor chip 51. In the vicinity of one corner of the semiconductor chip 51, a wide-width bonding pad (which will hereinafter be called "pad", simply) 6BP for gate electrode of the power MOS Q2 is formed integrally with the gate finger 6a. In the center on the main surface of the semiconductor chip 51, no gate finger is placed and a pad BP 50 for source electrode of the power MOS Q2 and anode electrode of the SBD D1 are placed. In the center in the longer direction (first direction X) of the semiconductor chip 51, the formation region SDR of the SBD D1 is disposed to extend from one end side to the other opposite end side of the semiconductor chip 51 in the shorter direction (second direction Y). On both the right and left sides of this formation region SDR of the SBD D1, a plurality of unit transistor cells of the power MOS Q2 are located.

Figure 8:
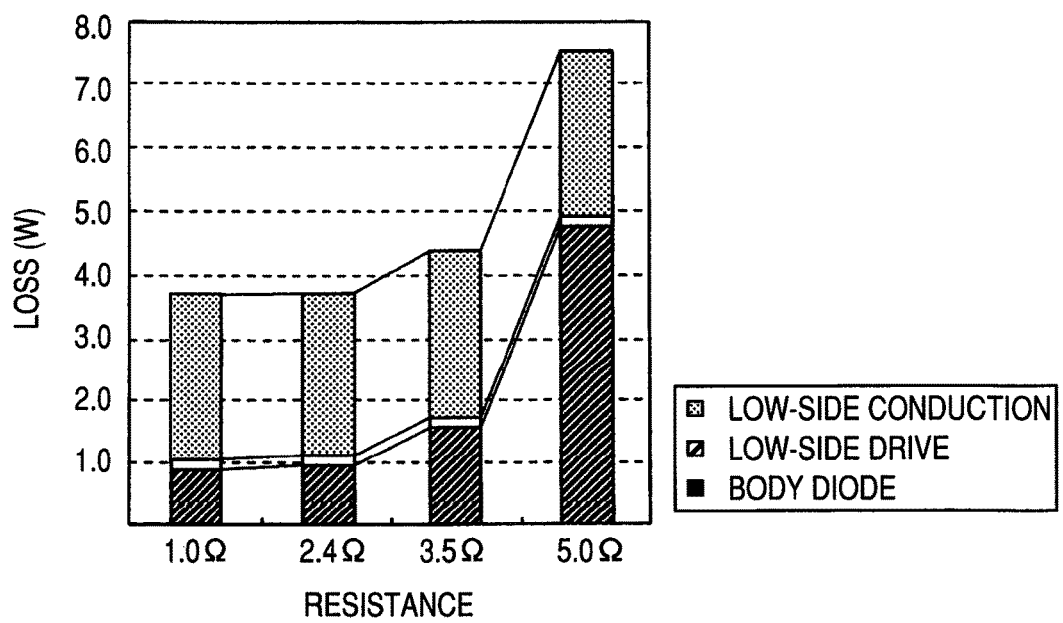
FIG. 8 is a graph schematically showing the calculation results of the dependence of a loss on the gate resistance of the field effect transistor for low-side switch of FIG. 7.

In such a structure having the gate finger 6a only at the periphery of the main surface of the semiconductor chip 51, however, a gate resistance of the power MOS Q2 cannot be reduced, which retards a switching speed. The present inventors have found for the first time that particularly when such a structure is applied to the power MOS Q2 of the non-insulated DC-DC converter 1, a self turn-on phenomenon becomes eminent rapidly and the loss of the converter shows a drastic increase after the gate resistance of the low-side power MOS Q2 exceeds a certain value. The term "self turn-on phenomenon" means a phenomenon that when the low-side power MOS Q2 is turned OFF and the high-side power MOS Q1 is turned ON, a potential of the interconnect connecting the low-side power MOS Q2 and the high-side power MOS Q1 increases and a gate voltage of the low-side power MOS Q2 increases, depending on a ratio of the drain-gate capacitance to the source-gate capacitance of the low-side power MOS Q2, whereby malfunction, that is, turning-on of the low side power MOS Q2 occurs. FIG. 8 illustrates the rough calculation results of the dependence of the loss on the gate resistance of the low-side power MOS Q2, for example, under the following conditions: power supply potential Vin for input of 12V, output voltage Vout of 1.3 V, output current Iout of 25 A and operating frequency f of 1 MHz. A self turn-on phenomenon starts to occur and loss increases when the resistance plotted on the axis of abscissas (gate resistance of the low-side power MOS Q2+ resistance of the output stage of the driver circuit 3b) exceeds 2.4Ω. Since the current of the non-insulated DC-DC converter 1 is not so large and the frequency is low in this non-insulated DC-DC converter 1, an increase in the loss due to the self turn-on phenomenon is small and less attention is paid to the gate resistance of the low-side power MOS Q2 compared with the gate resistance of the high-side power MOS Q1. With an increase in the current and frequency of the non-insulated DC-DC converter 1 as described above, however, an increase in the loss resulting from the self turn-on phenomenon has become a problem.

In this Embodiment 1, a plurality of gate fingers (metal gate interconnects) are placed also in an active cell region on the main surface of the semiconductor chip 5b in order to lower the gate resistance of the low-side power MOS Q2. The self turn-on phenomenon can be suppressed by this constitution, which also leads to a reduction in the loss of the non-insulated DC-DC converter 1. By the adoption of such a constitution, it is also possible to cope with a recent requirement for an increase in the current and frequency of the non-insulated DC-DC converter 1.

Specific examples of the semiconductor chip 5b according to Embodiment 1 having a low-side power MOS Q2 and SBD D1 formed thereover will be illustrated in FIGS. 9 to 17.

Figure 9:
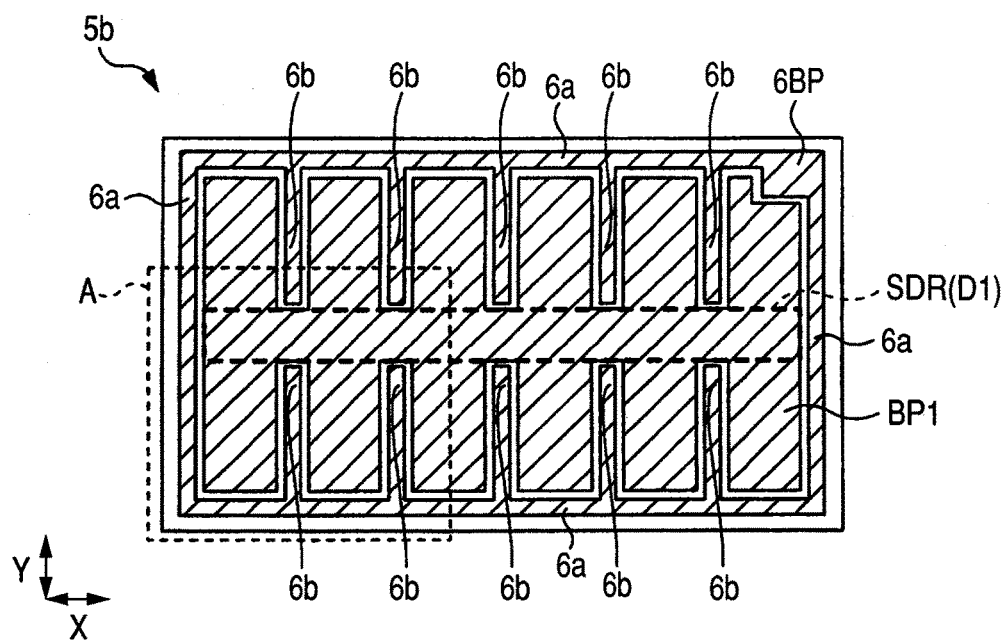
FIG. 9 is an overall plan view of a semiconductor chip having, formed thereover, a field effect transistor for low-side switch and Schottky barrier diode of the semiconductor device of FIG. 1.

FIG. 9 is an overall plan view of the semiconductor chip 5b. FIG. 9 is a plan view, but gate fingers 6a, 6b and pad BP1 are hatched to facilitate the understanding of the diagram.

The planar shape of the semiconductor chip 5a is, for example, a rectangle longer in the first direction X than the second direction Y. In the center of the main surface of this semiconductor chip 5b in the second direction Y, the formation region SDR of the SBD D1 is placed to extend from one end side to the opposite end side in the first direction X. Above and below the formation region SDR of the SBD D1 in the second direction Y, a plurality of unit transistor cell group formation regions constituting the power MOS Q2 are disposed to interpose the SBD D1 formation region therebetween. From another viewpoint, the plurality of unit transistor cell group formation regions of the power MOS Q2 on the main surface of the semiconductor chip 5b is vertically divided almost in two by the placement of the formation region SDR of the SBD D1.

In Embodiment 1, a plurality of unit transistor cells of the power MOS Q2 are arranged on both upper and lower sides of the SBD D1 (in particular, the plurality of unit transistor cell formation regions of the power MOS Q2 on the main surface of the semiconductor chip 5b is divided almost evenly into two by the formation region SDR of the SBD D1) so that the distance from the SBD D1 to the unit transistor cell of the power MOS Q2 which is the most distant therefrom can be shortened, compared with the distance when the formation region SDR of the SBD D1 is placed near one end. Upon division, the formation region is divided into two not in the longer direction (first direction X) but in the shorter direction (second direction Y). This makes it possible to shorten the distance from the SBD D1 to the unit transistor cell of the MOS Q2 which is the most distant therefrom compared with the distance in the case of FIG. 7. By extending the formation region SDR of the SBD D1 along the longer direction (first direction X) of the semiconductor chip 5b, the number of the unit transistors of the power MOS Q2 contiguous to the SBD D1 can be made greater than that in the case of FIG. 7. This enables the more effective exhibition of the function of the SBD D1 over the plurality of unit transistor cells of the power MOS Q2 in the semiconductor chip 5b, leading to a reduction in the loss of the non-insulated DC-DC converter 1.

On the main surface of this semiconductor chip 5b, gate finger (first metal gate interconnect) 6a and pad 6BP are disposed similar to FIG. 7 except that a plurality of gate fingers (second metal gate interconnects) 6b are formed over the plurality of unit transistor cell group formation region of the power MOS Q2. The gate fingers 6b are each integrally formed with the peripheral gate finger 6a. They extend from plural sites of the gate finger 6a on the long side of the semiconductor chip 5b toward a position contiguous to the formation region SDR of the SBD D1 in the center of the semiconductor chip 5b in the second direction Y so as to interpose the formation region SDR of the SBED D1 with the gate fingers 6a. By disposing the gate fingers 6b even on the plurality of unit transistor cell group formation regions of the power MOS Q2, the gate resistance of the power MOS Q2 can be reduced and self turn-on phenomenon can be suppressed. This leads to a reduction in the loss of the non-insulated DC-DC converter 1, making it possible to cope with a current increase and frequency heightening of the non-insulated DC-DC converter 1. Moreover in this Embodiment 1, since the formation region SDR of the SBD D1 is disposed in the center of the semiconductor chip 5b in the shorter direction (second direction Y), the gate finger 6b can be made shorter than that when the formation region SDR of the SBD D1 is disposed near one end. In other words, a gate resistance of the power MOS Q2 can be made lower than that when the formation region SDR of the SBD D1 is disposed near one end. Because of the above-described reasons, by disposing the formation region SDR of the SBD D1 at the above-described position, the SBD D1 can be formed on the semiconductor chip having the power MOS Q2 formed thereover without damaging the effect for reducing the gate resistance of the power MOS Q2.

On the main surface of the semiconductor chip 5b, a pad BP1 is formed with a planar comb-like pattern in a region surrounded by the gate fingers 6a and 6b. The pad BP1 illustrated here has a tooth both on the upper and lower portions (second direction). This pad BP1 serves as an electrode common to the source electrode of the power MOS Q2 and the anode electrode of SBD D1. The gate fingers 6a, 6b and pads 6BP and pad BP1 are formed by patterning one metal by etching, but they are isolated to each other.

Figure 10:
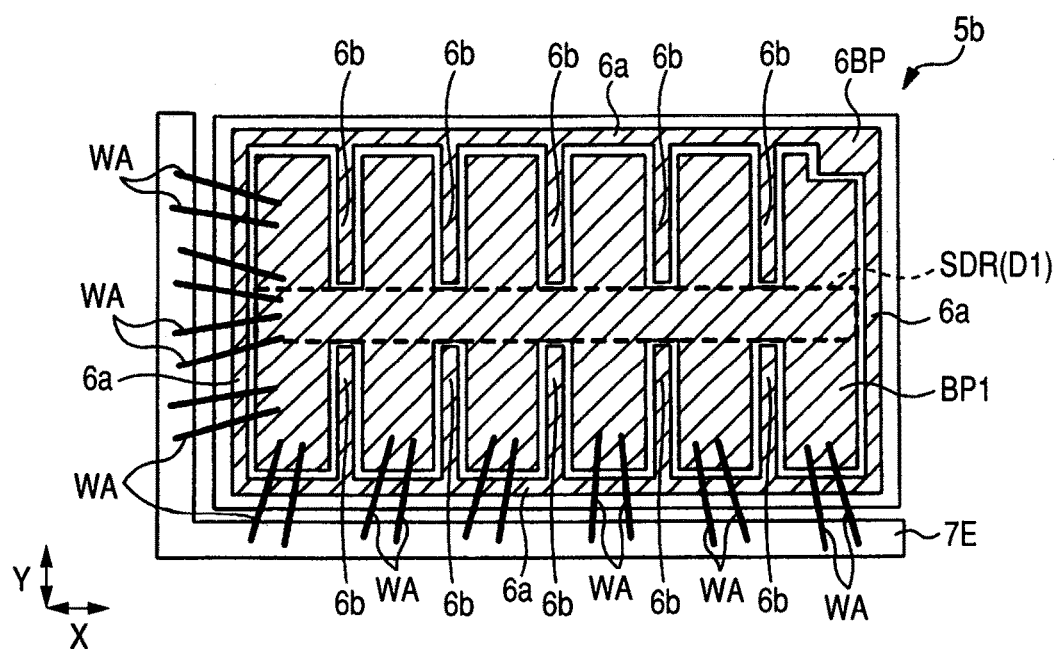
FIG. 10 is an overall plan view of the semiconductor chip of FIG. 9 after a bonding wire and external electrode are additionally disposed.

FIG. 10 is an overall plan view of the semiconductor chip 5b after a bonding wire (which will hereinafter be called "wire", simply) WA and an external electrode (terminal) 7E are added to the semiconductor chip 5b of FIG. 9. FIG. 10 is a plan view but gate fingers 6a, 6b and pad BP1 are hatched to facilitate the understanding of the diagram.

In this diagram, the planar L-shaped external electrode 7E is disposed along one short side and one long side of the semiconductor chip 5b. This external electrode 7E is electrically connected to the pads BP1 for source and anode via a plurality of wires WA. The wires WA are each made of a thin metal wire made of, for example, gold (Au). In this Embodiment 1, an increase in the distance between the SBD D1 and external electrode 7E can be suppressed by placing the SBD D1 in the center of the shorter direction (second direction Y) of the semiconductor chip 5b. This prevents an increase in the parasitic inductance La on the anode side of the SBD D1. In addition, an increase in the distance between the power MOS Q2 and the external electrode 7E can also be suppressed by placing the SBD D1 in the center in the shorter direction (second direction Y) of the semiconductor chip 5b. This prevents an increase in the parasitic inductance and impedance on the source side of the power MOS Q2, leading to suppression of an increase in the loss in the power MOS Q2. By extending the SBD D1 along the longer direction (first direction X) of the semiconductor chip 5b, the wires WA for the SBD D1 and power MOS Q2 as many as possible can be disposed, whereby the parasitic inductance and impedance on the anode side of the SBD D1 and source side of the power MOS Q2 can be reduced. In this manner, the loss of the non-insulated DC-DC converter 1 can be reduced.

Figure 11:
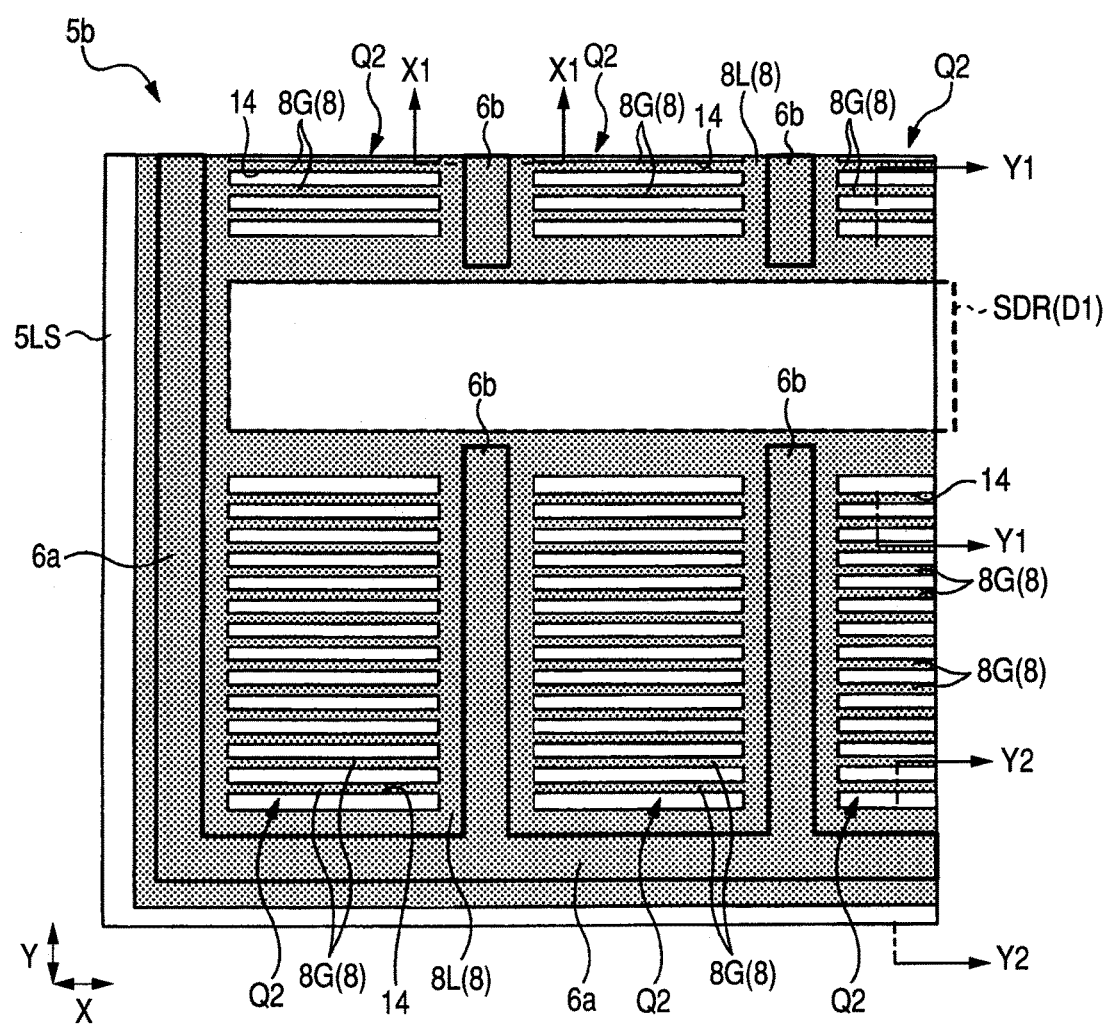
FIG. 11 is an enlarged plan view of the region A of FIG. 9.
Figure 12:
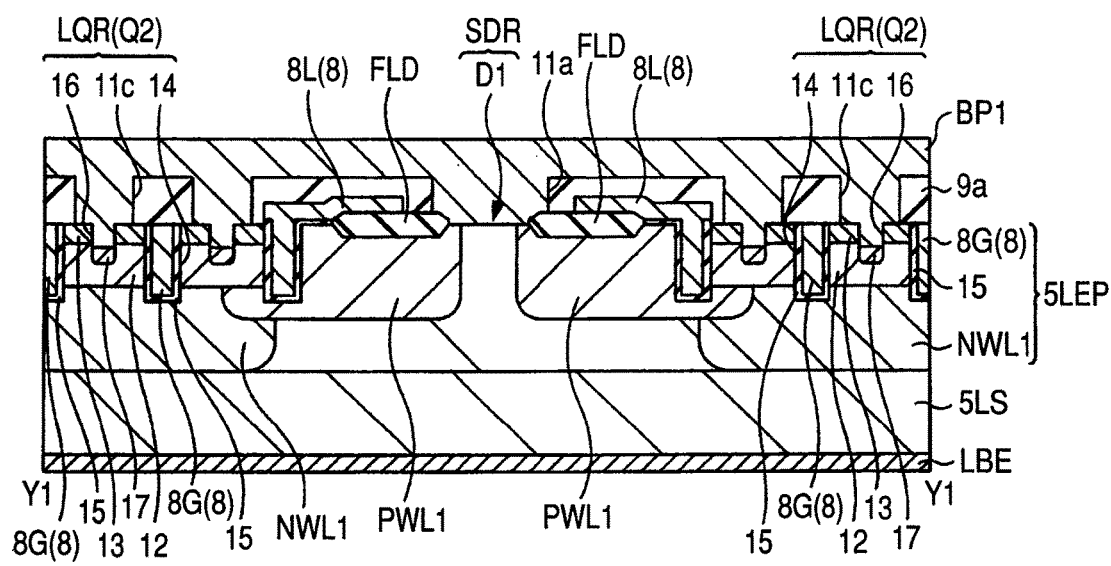
FIG. 12 is a cross-sectional view taken along a line Y1-Y1 of FIG. 11.
Figure 13:
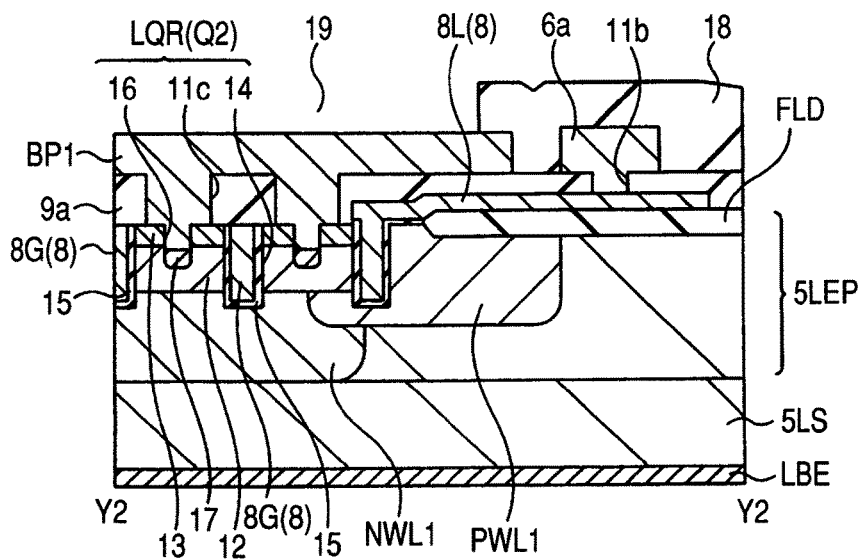
FIG. 13 is a cross-sectional view taken along a line Y2-Y2 of FIG. 11.
Figure 14:
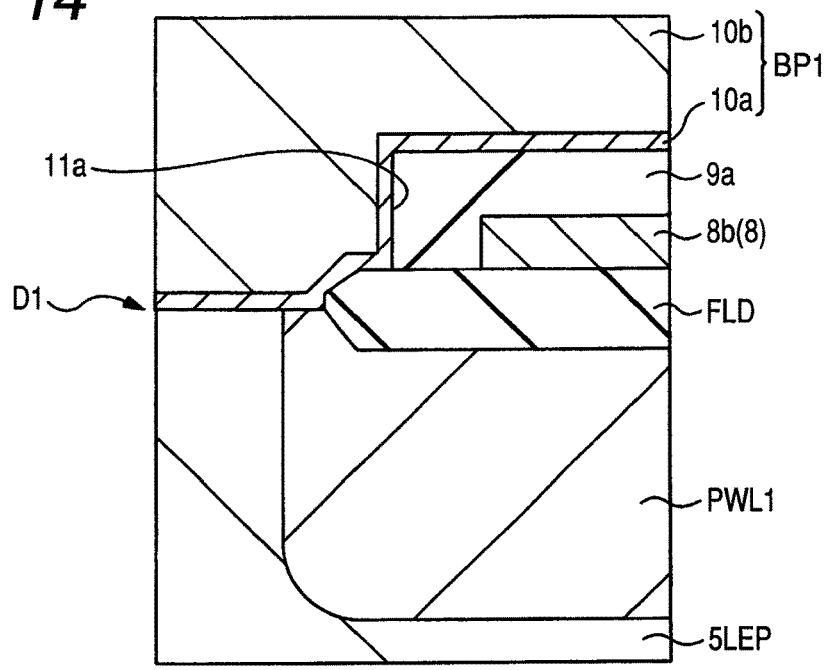
FIG. 14 is a fragmentary enlarged cross-sectional view of the Schottky barrier diode of FIG. 9.
Figure 15:
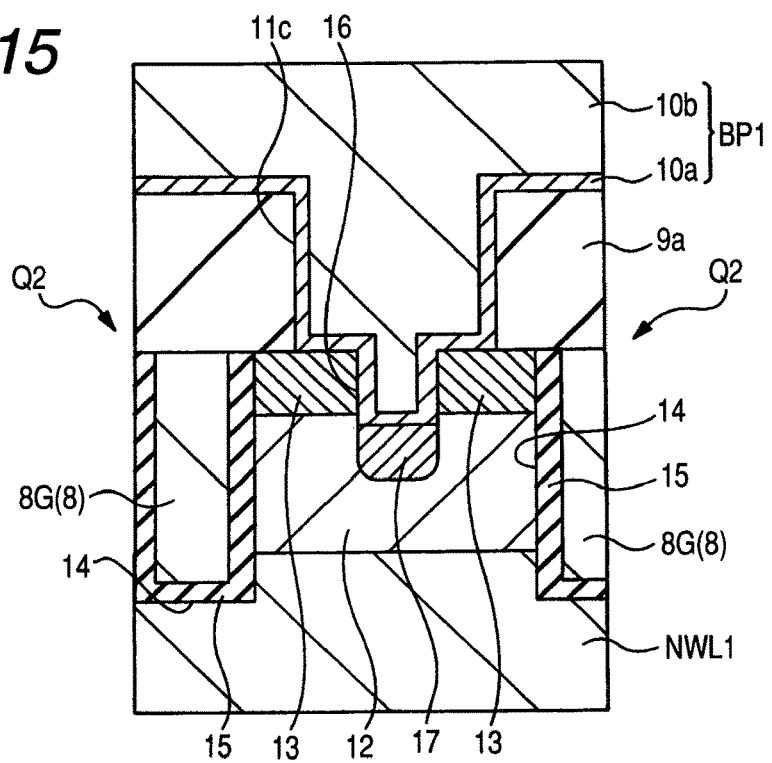
FIG. 15 is an enlarged cross-sectional view of a unit transistor cell of the field effect transistor for low-side switch of FIG. 9.
Figure 16:
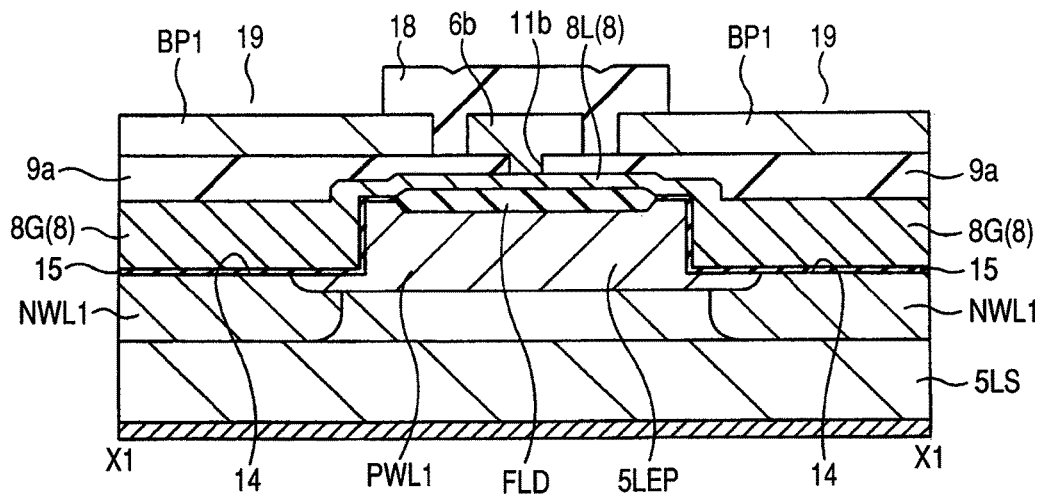
FIG. 16 is a cross-sectional view taken along a line X1-X1 of FIG. 11.
Figure 17:
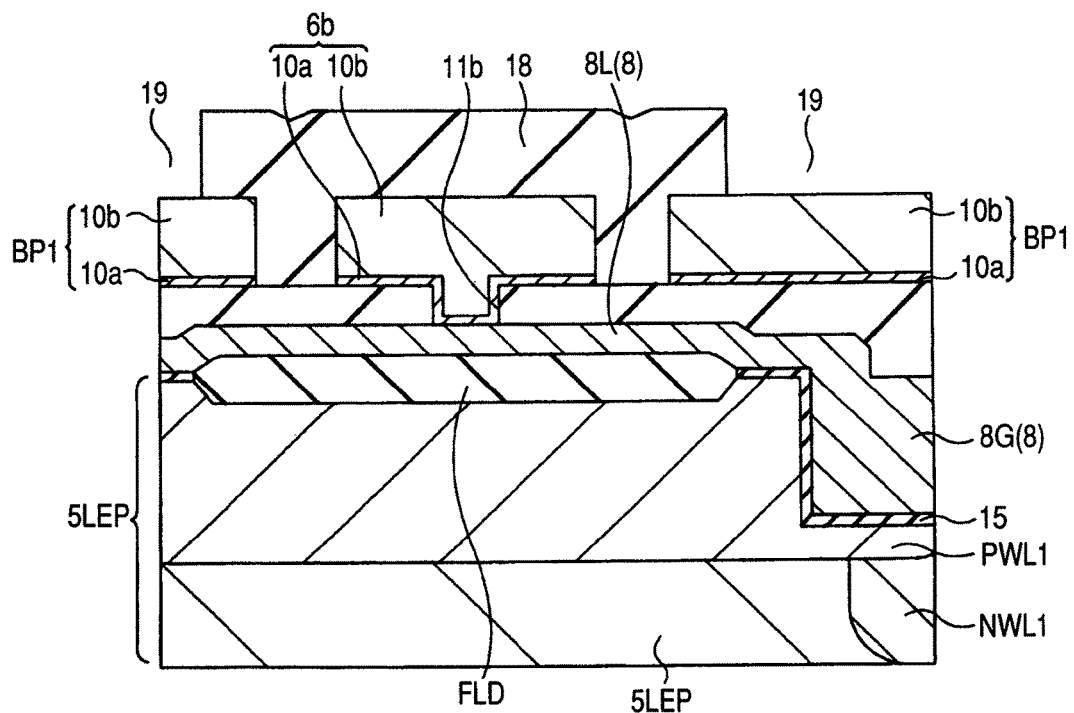
FIG. 17 is a fragmentary enlarged cross-sectional view of FIG. 16.

FIG. 11 is an enlarged plan view of the region A of FIG. 9, FIG. 12 is a cross-sectional view taken along a line Y1-Y1 of FIG. 11, FIG. 13 is a cross-sectional view taken along a line Y2-Y2 of FIG. 11, FIG. 14 is a fragmentary enlarged cross-sectional view of the SBD D1, FIG. 15 is an enlarged cross-sectional view of a unit transistor cell of the power MOS Q2, FIG. 16 is a cross-sectional view taken along a line X1-X1 of FIG. 11; and FIG. 17 is a fragmentary enlarged cross-sectional view of FIG. 16. In order to facilitate the understanding of the diagram, in FIG. 11, the pad BP1 is omitted, the gate fingers 6a, 6b are viewed through, while in order to facilitate the understanding of the gate patterns 8 (gate electrode 8G and gate interconnect 8L) lying below the pad BP1 and gate fingers 6a, 6b, the gate patterns 8 are illustrated with pearskin finish.

The semiconductor chip 5b has a main surface (device formation surface: first surface) on which an element is to be formed and a backside surface (backside electrode formation surface: second surface) which is opposite to the main surface and on which a backside electrode LBE is to be formed. A semiconductor substrate (first semiconductor layer) 5LS constituting the semiconductor chip 5b is made of, for example, an $n^+$ type silicon single crystal and an epitaxial layer (second semiconductor layer) 5LEP made of an $n^-$ type silicon single crystal is laid over the substrate. Over the main surface of this epitaxial layer 5LEP, a field insulating film FLD made of, for example, silicon oxide ($SiO_2$ or the like) is formed. In an active region surrounded by this field insulating film FLD and a p well PWL1 lying therebelow, a plurality of unit transistor cells and SBD D1 of a power MOS Q2 are formed. Over the main surface of the epitaxial layer 5LEP, the above-described pad BP1 is formed via an insulating layer 9a such as PSG (Phospho Silicate Glass). The pad BP1 has a structure obtained, for example, by successively stacking a barrier metal layer 10a such as titanium tungsten (TiW) and a metal layer 10b such as aluminum (Al) in the order of mention, as illustrated in FIG. 14. In the formation region SDR of the SBD D1, the barrier metal layer 10a of the pad BP1 is in contact with the main surface of the epitaxial layer 5LEP via a contact hole 11a formed in the insulating layer 9a and the SBD D1 is formed at a contact site of the barrier metal layer 10a and the epitaxial layer 5LEP. In order to reduce the leak current of the SBD D1, the impurity concentration of the epitaxial layer 5LEP is adjusted to a little lower level, for example, about $5 \times 10^{15}/cm^3$.

In the active region surrounded by the gate fingers 6a, 6b and the formation region SDR of the SBD D1, a plurality of unit transistor cell formation regions LQR of the power MOS Q2 are placed. In this formation region LQR, an n channel type vertical power MOS Q2 having, for example, a trench structure is formed. Adoption of the trench gate structure enables miniaturization and high integration of unit transistor cells of the power MOS Q2. This unit transistor cell has a semiconductor substrate 5LS and n well NWL1 having a function as a drain region, a p type semiconductor region (third semiconductor layer) 12 having a function as a channel formation region, the above-described $n^+$ type semiconductor region (fourth semiconductor layer) 13 having a function as a source region, a trench (first trench) 14 made in the thickness direction of the epitaxial layer 5LEP, a gate insulating film 15 formed on the bottom and side surface of the trench 14, and a gate electrode 8G filled in the trench 14 via the gate insulating film 15. Since the impurity concentration of the epitaxial layer 5LEP is adjusted to a little lower level as described above, the resistance component of the epitaxial layer 5LEP in the unit transistor formation region LQR inevitably becomes large and the on-resistance of the power MOS Q2 increases when the unit transistor cell of the power MOS Q2 is formed in the epitaxial layer 5LEP as is. A deep n well NWL1 is therefore formed in the plurality of unit transistor formation regions LQR of the power MOS Q2 to increase the impurity concentration of the epitaxial layer 5LEP to, for example, about $2 \times 10^{16}/cm^3$. This makes it possible to actualize both a reduction in the leak current of the SBD D1 and a reduction in the on-resistance of the power MOS Q2 in the semiconductor chip 5b having both the SBD D1 and power MOS Q2.

In this Embodiment, the trenches 14 and gate electrodes 8G arranged in the stripe form are employed as an example. Described specifically, in each unit transistor group formation region of the power MOS Q2, a plurality of gate electrodes 8G in the planar strip form extending in the first direction X are arranged along the second direction Y. The planar arrangement form of the trench 14 and gate electrode 8G are not limited to this stripe form, but various forms can be adopted. For example, they can be arranged in the planar lattice form. The trench 14 is made as deep as to reach the n well NWL1. The gate electrode 8G is made of, for example, low-resistance polycrystalline silicon and via a gate interconnect 8L formed integrally therewith and made of polycrystalline silicon, it is pulled over the field insulating film FLD. The surface of the gate electrode 8G and gate interconnect 8L are covered with the insulating layer 9a to effect insulation with the pad BP1. The gate interconnect 8L is electrically connected to the gate fingers 6a, 6b via the contact hole 11b formed in the insulating layer 9a. The gate fingers 6a, 6b each has a similar constitution to that of the pad BP 1. In the plurality of unit transistor cell formation region LQR of the power MOS Q2, the pad BP1 is electrically connected to the $n^+$ type semiconductor region 13 for source via a contact hole 11c formed in the insulating layer 9a and in addition, is electrically connected to a $p^+$ type semiconductor region 17 via a trench 16 made in the epitaxial layer 5LEP, through which it is also electrically connected to the p type semiconductor region 12 for the channel formation. In each unit transistor cell, the operation current of the power MOS Q2 is caused to flow in the thickness direction of the semiconductor substrate 5LS along the side surface (that is, the side surface of the trench 14) of the gate electrode 8G between the n well NWL1 and n+ type semiconductor region 13. In such a vertical power MOS Q2, a gate area per unit transistor cell area and a junction area of the gate electrode 8G with the drift layer of the drain are greater than those in a horizontal field effect transistor (its channel is formed in a horizontal direction relative to the main surface of a semiconductor substrate) so that in spite of an increase in a gate-drain parasitic capacitance, a channel width per unit transistor cell area can be increased and the on-resistance can be reduced.

On the uppermost layer on the main surface of the semiconductor chip 5b, a surface protection film 18 is deposited. The surface protection film 18 is a film stack of a silicon oxide film and a silicon nitride ($Si_3N_4$) film or a film obtained by stacking thereover an organic film such as polyimide film (PiQ). The gate fingers 6a, 6b have a surface covered with the surface protection film 18, but the pads BP1, 6BP are partially exposed via an opening portion 19 formed in one portion of the surface protection film 18. This exposed region serves as a bonding region in which a wire is connected. On the backside surface of the semiconductor substrate 5LS, the backside electrode LBE made of, for example, gold (Au) is formed. This backside electrode LBE is an electrode common to the drain electrode of the power MOS Q2 and the cathode electrode of the SBD D1.

Figure 18:
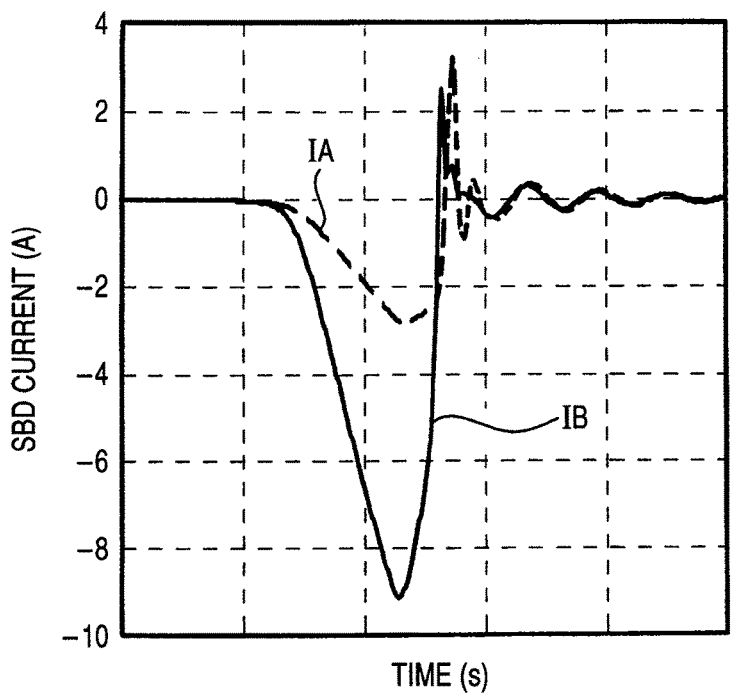
FIG. 18 is a graph showing the calculation results of a current transferring to a Schottky barrier diode during a dead time.

FIG. 18 shows the comparison of the calculation results of a current transferred to SBD during the dead time between IA (broken line) when SBD and MOS are formed on respective semiconductor chips and IB (solid line) when SBD and MOS are formed in one semiconductor chip as in Embodiment 1.

Calculation was carried out by setting the area of the SBD to, for example, 2 mm², while setting the parasitic inductance between MOS and SBD to 1 nH when the SBD was formed on a different semiconductor chip and 0.1 nH when the SBD was formed on the same semiconductor chip. The calculation conditions are as follows: power supply potential Vin for input=12V, output voltage Vout=1.3V, output current Iout=25 A and operating frequency f=1 MHz. As is apparent from FIG. 18, a more current transfers to the SBD during the dead time when the SBD and MOS are formed in one semiconductor chip as in Embodiment 1 than when the SBD is formed on another semiconductor chip. The SBD is quick in operation with a smaller loss, because the forward voltage of the SBD is lower than that of a parasitic diode (body diode Dp) and electrons contribute to the operation. It is therefore possible to reduce a conduction loss and recovery loss during the dead time by the flow of a large current to the SBD.

Figure 19:
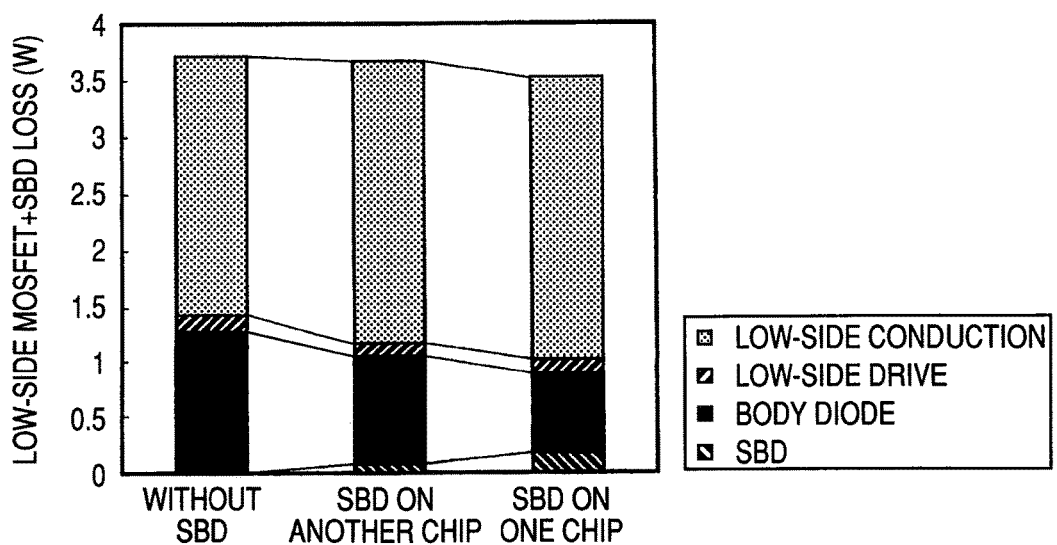
FIG. 19 is a graph showing the calculation results of a loss when the Schottky barrier diode and field effect transistor are formed in respective semiconductor chips and when they are formed on one semiconductor chip.

FIG. 19 shows the calculation results of a loss when the SBD and MOS are formed on respective semiconductor chips and when the SBD and MOS are formed on one semiconductor chip. The loss is smaller when the SBD is formed on a different chip compared with the semiconductor chip without an SBD. By forming the SBD and MOS on one semiconductor chip, transfer of a larger current to the SBD occurs, which can reduce the conduction loss and recovery loss of the parasitic diode (body diode) of MOS. As a result, the loss can be reduced most effectively when the SBD and MOS are formed on one chip.

Figure 20:
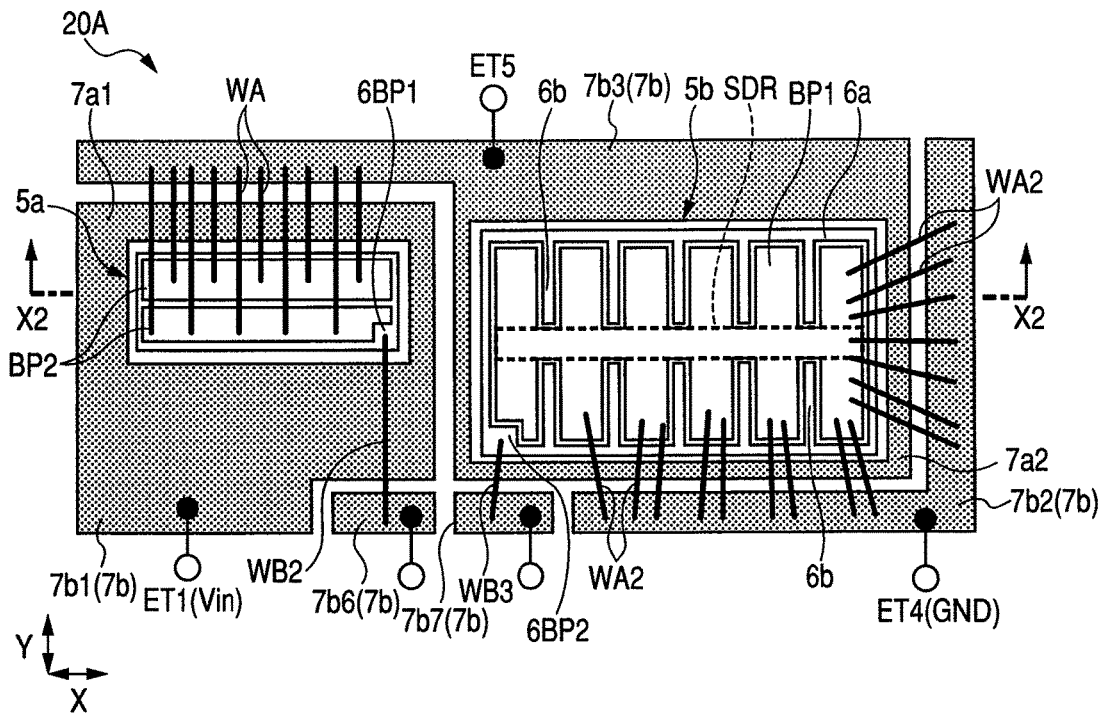
FIG. 20 is an overall plan view, when the inside of the package of the semiconductor device according to the one embodiment of the present invention is viewed through, of the main surface side of the package.
Figure 21:
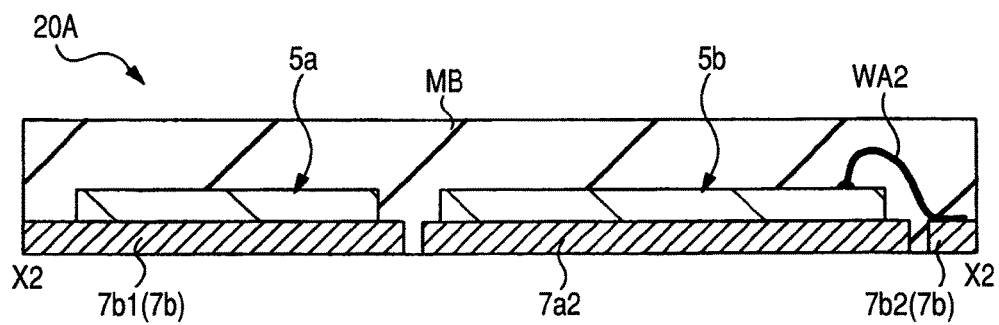
FIG. 21 is a cross-sectional view taken along a line X2-X2 of FIG. 20.

FIG. 20 is a plan view illustrating an example of the constitution within a package 20A having the above-described semiconductor chips 5a, 5b housed therein. FIG. 21 is a cross-sectional view taken along a line X2-X2 of FIG. 20. To facilitate the understanding of the diagram, a resin sealant MB is omitted therefrom.

In the package 20A, two die pads 7a1 and 7a2 are arranged contiguous to leads 7b (7b1, 7b2, 73b, 7b6 and 7b7) which are disposed around these two die pads. Over the die pad 7a1, the semiconductor chip 5a having the power MOS Q1 for high-side switch formed thereover is placed with its main surface up. Over the main surface of this semiconductor chip 5a, the pad BP2 for source electrode and pad 6BP1 for gate electrode, each of the power MOS Q1, are arranged. This pad BP2 for source electrode is electrically connected, via a plurality of wires WA1, to the lead 7b3 integrally formed with the die pad 7a2. The pad 6BP1 for gate electrode is electrically connected to the lead 7b6 via the wire WB3. An output signal is input from the driver circuit 3a to this lead 7b6. The backside of the semiconductor chip 5a serves as a drain electrode to be connected to the drain of the power MOS Q1 and is electrically connected to a plurality of leads 7b1 formed integrally with the periphery of the die pad 7a1 via the die pad 71a. This lead 7b1 is electrically connected to the terminal ET1. The wires WA1 are arranged in the zigzag form so that any two wires WA1 adjacent to each other in the first direction X are connected to the upper and lower pads BP2 alternately.

Over a relatively large die pad 7a2, the semiconductor chip 5b having the power MOS Q2 for low-side switch formed thereover is placed with its main surface up. The pad BP 1 of the semiconductor chip 5b is electrically connected to the lead 7b2 (7b) via a plurality of wires WA2, and the pad 6BP2 is electrically connected to the lead 7b7 via the wire WB3. An output signal is input from the driver circuit 3b to this lead 7b7. The backside electrode LBE of the semiconductor chip 5b is electrically connected to a plurality of leads 7b3 (7b) formed integrally with the periphery of the die pad 7a2 via the die pad 7a2. These leads 7b3 are electrically connected to the terminal ET5 for output.

These two semiconductor chips 5a and 5b, and the wires WA1, WA2, WB2 and WB3 are sealed with the resin sealant MB. By housing these two semiconductor chips 5a and 5b in one package 20A, a parasitic inductance between the semiconductor chips 5a and 5b can be reduced, which leads to a reduction in the loss. The constitution of the semiconductor chip 5a and arrangement of the semiconductor chips 5a and 5b will be described later in further detail in another embodiment.

Figure 22:
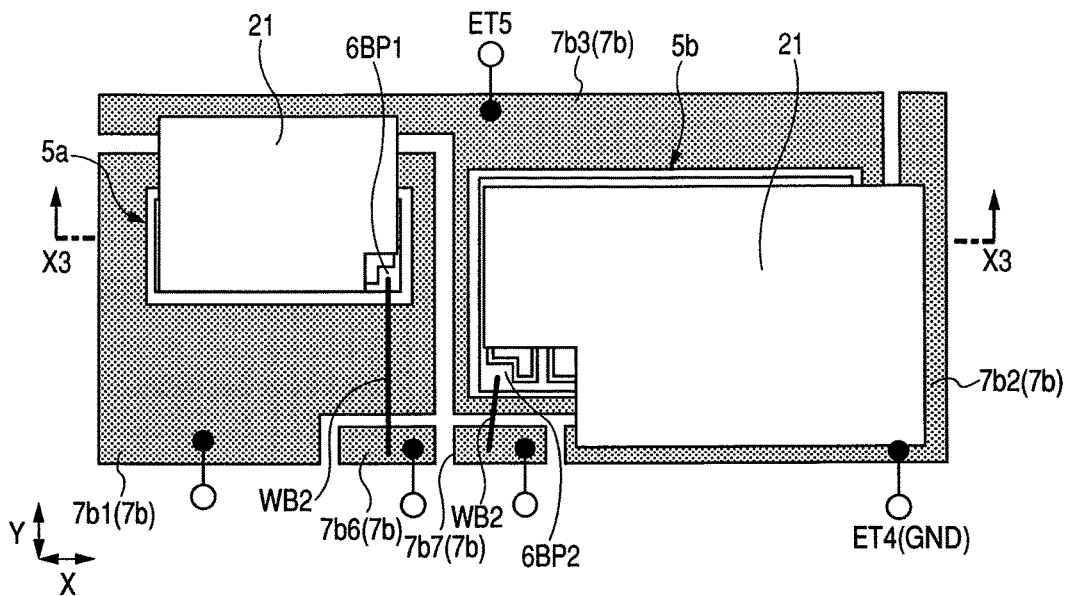
FIG. 22 is an overall plan view, when the inside of the package of the semiconductor device according to another embodiment of the present invention is viewed through, of the main surface side of the package.
Figure 23:
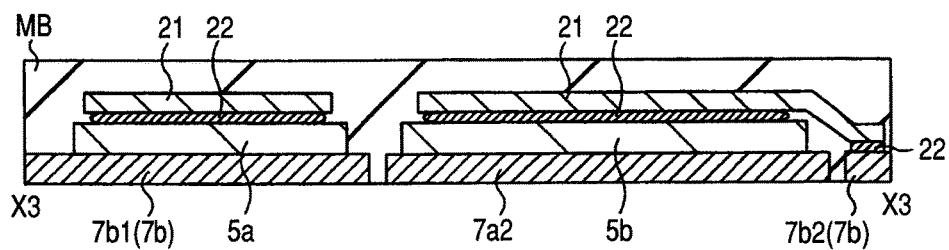
FIG. 23 is a cross-sectional view taken along a line X3-X3 of FIG. 22.

FIG. 22 is a plan view of the modification example of FIG. 20, while FIG. 23 is a cross-sectional view taken along a line X3-X3 of FIG. 22. In order to facilitate the understanding of the diagram, the resin sealant MB is omitted therefrom.

In this modification example, the pad BP2 and the lead 7b3, and the pad BP1 and the lead 7b2 are connected by a metal sheet interconnect 21 instead of a wire. This metal sheet interconnect 21 is made of a metal such as copper (Cu) or aluminum (Al) and is electrically connected to the pads BP1, BP2, and leads 7b2, 7b3 via a bump electrode 22. The bump electrode 22 is made of, for example, a metal such as lead (Pb)/tin (Sn) or gold (Au). The bump electrode 22 may be replaced with a conductive resin. The metal sheet interconnect 22 is also covered entirely with the resin sealant MB.

By using the metal sheet interconnect 21 instead of a wire, inductance and impedance parasitic to the interconnect path can be reduced further and therefore a switching loss and conduction loss can be reduced further. As a result, the voltage conversion efficiency of the non-insulated DC-DC converter 1 can be improved further.

In addition, the anode electrode of the SBD D1 is electrically connected to a reference potential GNC via the large-area metal sheet interconnect 21 so that an interconnect resistance on the anode side and an inductance La which is parasitic to the anode electrode side can be drastically reduced. This makes it possible to heighten the effect of the SBD D1, thereby reducing a diode conduction loss and a diode recovery loss and improving a voltage conversion efficiency of the non-insulated DC-DC converter 1 further. Since the inductances Lk, La can be reduced, a further reduction in noise can be achieved.

Figure 24:
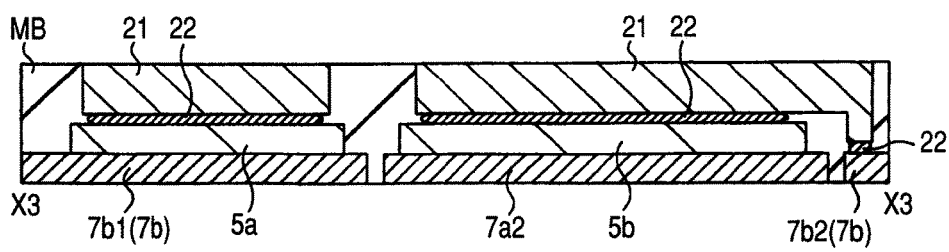
FIG. 24 is a cross-sectional view of a portion of the semiconductor device according to a further embodiment of the present invention corresponding to the portion taken along a line X3-X3 of FIG. 22.

FIG. 24 is a modification example of FIG. 22 and is a cross-sectional view of a portion taken along a line X3-X3 of FIG. 22.

In this modification example, the pad BP2 and the lead 7b3, and the pad BP1 and the lead 7b2 are connected by a metal sheet interconnect 21. The metal sheet interconnect 21 is partially exposed from the resin sealant MB. The metal sheet interconnect 21 is disposed so as to cover particularly the formation regions of the power MOS Q1 and Q2 which are heat generation sources of the semiconductor chips 5a and 5b. In this modification example, two metal sheet interconnects 21 covering therewith the semiconductor chips 5a and 5b are exposed from the upper surface of the resin sealant MB. Instead, only the metal sheet interconnect 21 on the semiconductor chip 5b side having, formed thereover, the power MOS Q2 for low-side switch, which has a relatively higher heat generation amount, may be exposed. Heat radiation property can be improved further by placing a heat radiating fin on the upper surface of the resin sealant MB and bonding it to the exposed surface of the metal sheet interconnect 21. According to the constitution of FIG. 24, since the metal sheet interconnect 21 itself is equipped with a heat radiating function and another part for heat radiation is not necessary, a fabrication process of a semiconductor device can be simplified and a fabrication time of a semiconductor device can be reduced compared with a process including the adding step of a heat radiation part. In addition, owing to a decrease in the number of parts, a cost reduction of the semiconductor device can be accomplished.

(Embodiment 2)

Figure 25:
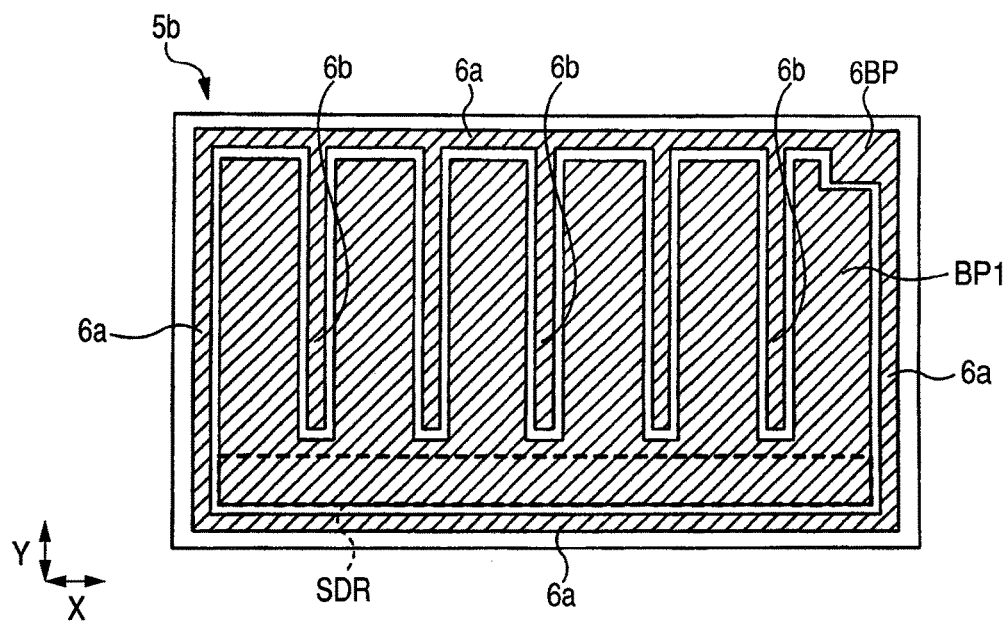
FIG. 25 is an overall plan view of a semiconductor chip of a semiconductor device according to a still further embodiment of the present invention.
Figure 26:
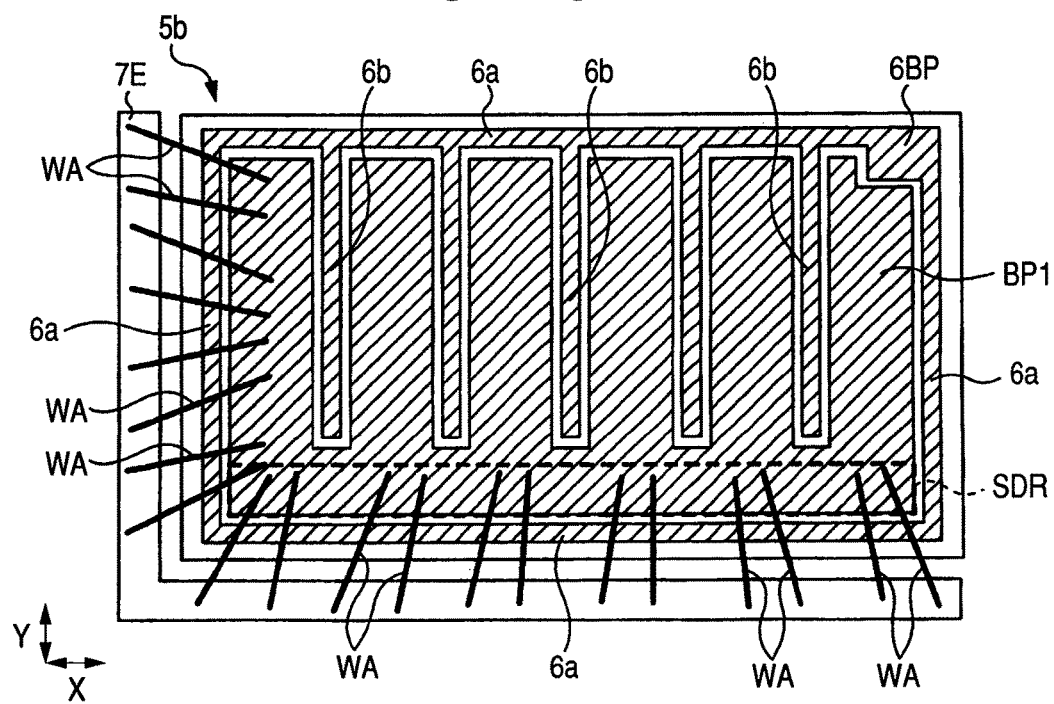
FIG. 26 is an overall plan view of the semiconductor chip of FIG. 25 after a bonding wire and external electrode are additionally disposed.

A modification example of the disposing position of the SBD in a semiconductor chip will be described in Embodiment 2. FIG. 25 is an overall plan view of a semiconductor chip 5b, while FIG. 26 is an overall plan view of the semiconductor chip 5b after addition of the wire WA and external electrode 7E to the semiconductor chip 5b of FIG. 25. Although FIGS. 25 and 26 are plan views, gate fingers 6a and 6b and pad BP1 are hatched to facilitate the understanding of the diagrams.

In this Embodiment 2, the formation region SDR of the SBD D1 is disposed near the long side on one side of the semiconductor chip 5b. In particular, the formation region SDR of the SBD D1 is disposed on a long side near the external electrode 7E as illustrated in FIG. 26. By such an arrangement, a parasitic inductance on the anode side of the SBD D1 can be reduced, whereby a larger current can be transferred to the SBD D1. This enables a more reduction in the conduction loss and recovery loss of the diode compared with Embodiment 1. Which is more effective the constitution of Embodiment 1 as described based on FIGS. 9 and 10 or the constitution of Embodiment 2 differs depending on the actual using conditions. Under the using conditions where a conduction loss or recovery loss of the diode during a dead time is dominant, use of the constitution as in Embodiment 2 is recommended. Under the using conditions where a conduction loss of MOS is dominant, use of the constitution as described in Embodiment 1 referring to FIGS. 9 and 10 are recommended. These constitutions are used properly according to the using conditions of the non-insulated DC-DC converter 1.

The gate finger 6b extends to the vicinity of the formation region SDR of the SBD D1 from the gate finger 6a on one longer side of the semiconductor chip 5b. The formation region SDR of the SBD D1 is therefore interposed between the gate finger 6a and gate finger 6b. The pad BP 1 is in the comb-like form with tooth on one side.

(Embodiment 3)

Figure 27:
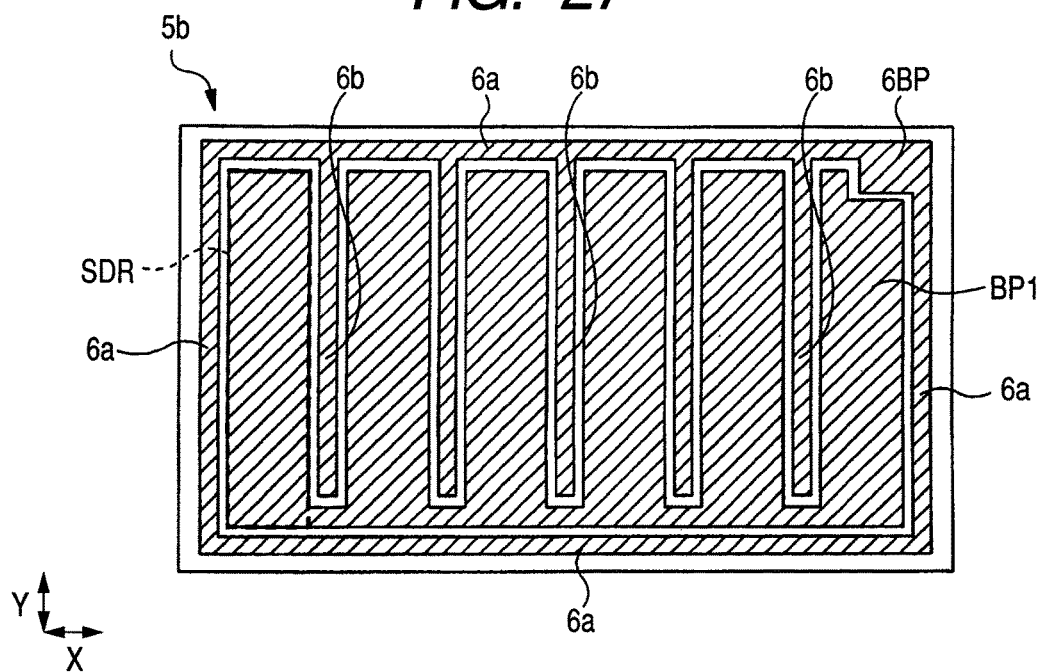
FIG. 27 is an overall plan view of a semiconductor chip of a semiconductor device according to a still further embodiment of the present invention.
Figure 28:
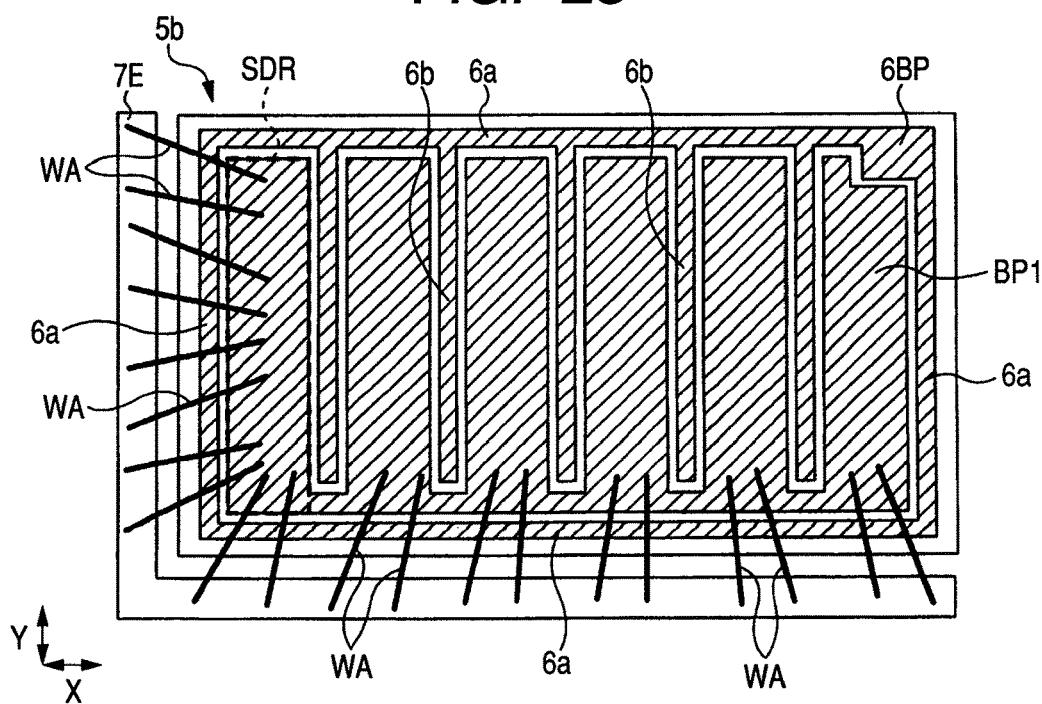
FIG. 28 is an overall plan view of the semiconductor chip of FIG. 27 after a bonding wire and an external electrode are additionally disposed.

In Embodiment 3, another modification example of the arrangement position of the SBD in a semiconductor chip will be described. FIG. 27 is an overall plan view of a semiconductor chip 5b, while FIG. 28 is an overall plan view of the semiconductor chip 5b after addition of a wire WA and an external electrode 7E to FIG. 27. FIGS. 27 and 28 are each a plan view, but gate fingers 6a, 6b and pad BP1 are hatched to facilitate the understanding of these diagrams.

In Embodiment 3, the formation region SDR of the SBD D1 is disposed near one short side of the semiconductor chip 5b. The formation region SDR of the SBD D1 extends along the short side (second direction Y) of the semiconductor chip 5b. In particular, as illustrated in FIG. 28, the formation region SDR of the SBD D1 is disposed on a short side near the external electrode 7E. By such an arrangement, a parasitic inductance on the anode side of the SBD D1 can be reduced and therefore, a larger current can be transferred to the SBD D1. This enables a further reduction in the conduction loss and recovery loss of the diode compared with Embodiment 1.

In this Embodiment 3, the formation region SDR of the SBD D1 is disposed at a position opposite to the arranging position of the pad 6BP for gate, whereby a wire WA connected to the pad BP1 and a wire connected to the pad 6BP for gate can be arranged without disturbing them each other.

The gate finger 6b extends from a gate finger 6a on one long side of the semiconductor chip 5b to the vicinity of a gate finger 6a on another long side of the chip, whereby the formation region SDR of the SBD D1 is surrounded at four sides thereof by the gate fingers 6a and 6b. Alternatively, individual pads BP1 and unit transistor cell group may be isolated by extending the gate finger 6b further to connect the gate finger 6a on one long side to the gate finger 6a on another long side. In this case, however, upon inspection of the plurality of unit transistor cells of the power MOS Q2, the inspection of the unit transistor group must be performed per pads BP1 separated by the gate fingers 6b. In this Embodiment 3, the pads BP1 are formed as one body without being separated completely by the gate finger 6a, whereby the inspection of the plurality of unit transistors of the power MOS Q2 can be finished by single inspection.

(Embodiment 4)

In Embodiment 1, the constitution having the low-side power MOS and SBD formed on one semiconductor chip was described. When in the non-insulated DC-DC converter 50A of FIG. 4, semiconductor chips 5a to 6d are housed in respective packages, problems as described below occur and effects of forming the low-side power MOS and SBD on one chip are reduced. In this Embodiment 4, a constitution example capable of overcoming these problems will be described.

Figure 29:
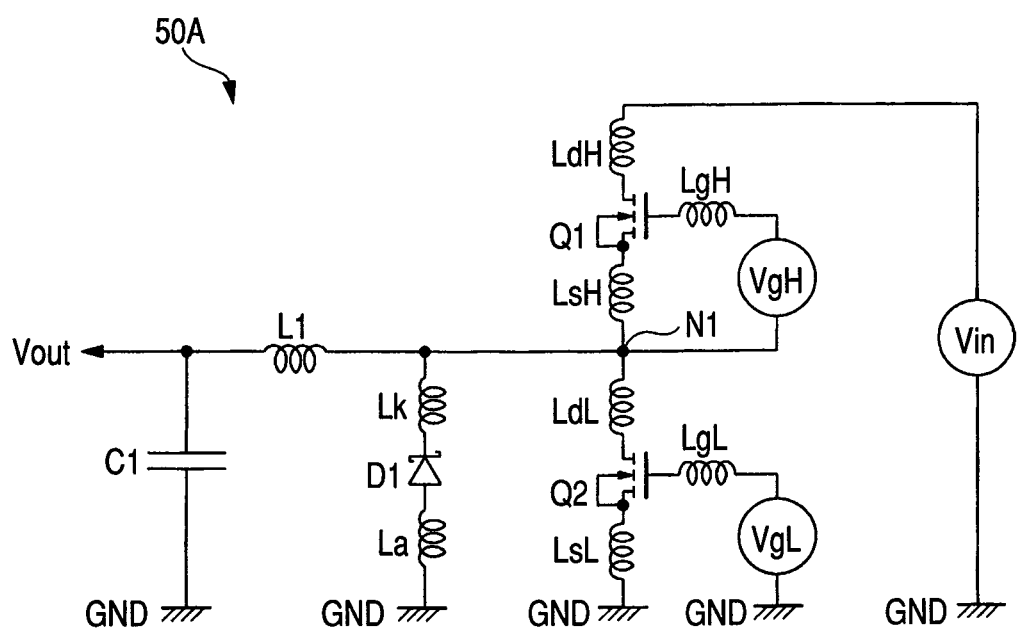
FIG. 29 is an equivalent circuit diagram showing an inductance component parasitic to the semiconductor device investigated by the present inventors.

First, the problems will be described. By housing the power MOS Q1 for high-side switch, power MOS Q2 for low-side switch, driver circuits 3a and 3b, and Schottky barrier diode D1 are housed in respective packages as illustrated in FIG. 4, the interconnect paths among the semiconductor chips 5a to 5d (packages) become long and inductances parasitic to these interconnect portions increase. As a result, a reduction in the voltage conversion efficiency of the non-insulated DC-DC converter 50A occurs as a problem. FIG. 29 is an equivalent circuit illustrating the inductance components parasitic to the non-insulated DC-DC converter 50A. Symbols LdH, LgH, LsH, LdL, LgL, and LsL represent inductances parasitic to the packages of the power MOS Q1 and Q2 and interconnects of a print circuit board. "VgH" represents a gate voltage for turning the power MOS Q1 ON, while "VgL" represents a gate voltage for turning the power MOS Q2 ON. Influenced by the inductance LsH parasitic to the source side of the power MOS Q1 for high-side switch and LgH parasitic to its gate side and the inductance LsL parasitic to the source side of the power MOS Q2 for the low-side switch, a voltage conversion efficiency of the non-insulated DC-DC converter 50A lowers. Particularly an increase in the parasitic inductance LsH causes a marked increase in the turn-on loss and turn-off loss (especially, turn-on loss) of the power MOS Q1 for high-side switch, resulting in a drastic reduction in the voltage conversion efficiency of the non-insulated DC-DC converter 50A. The turn-on loss and turn-off loss are in proportion to the frequency and output current so that loss components become large with the progress of a current increase and frequency heightening of the non-insulated DC-DC converter 50A.

Figure 30:
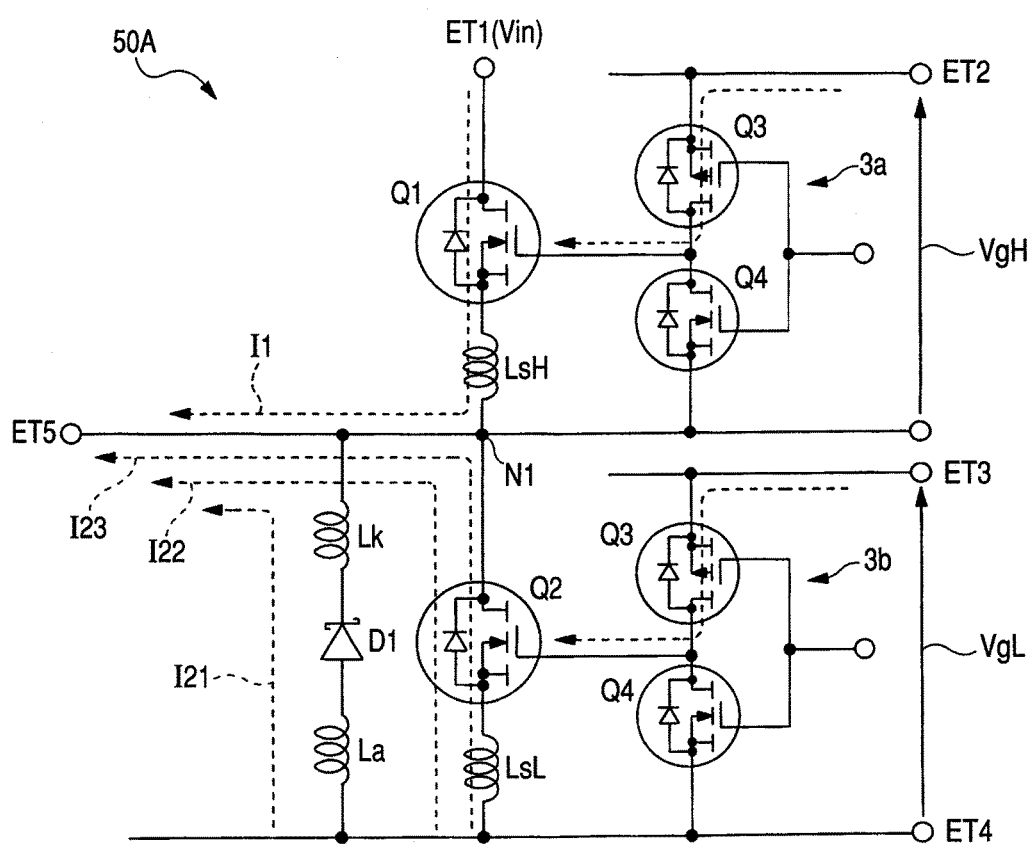
FIG. 30 is an explanatory diagram of a circuit operation of the semiconductor device.
Figure 31:
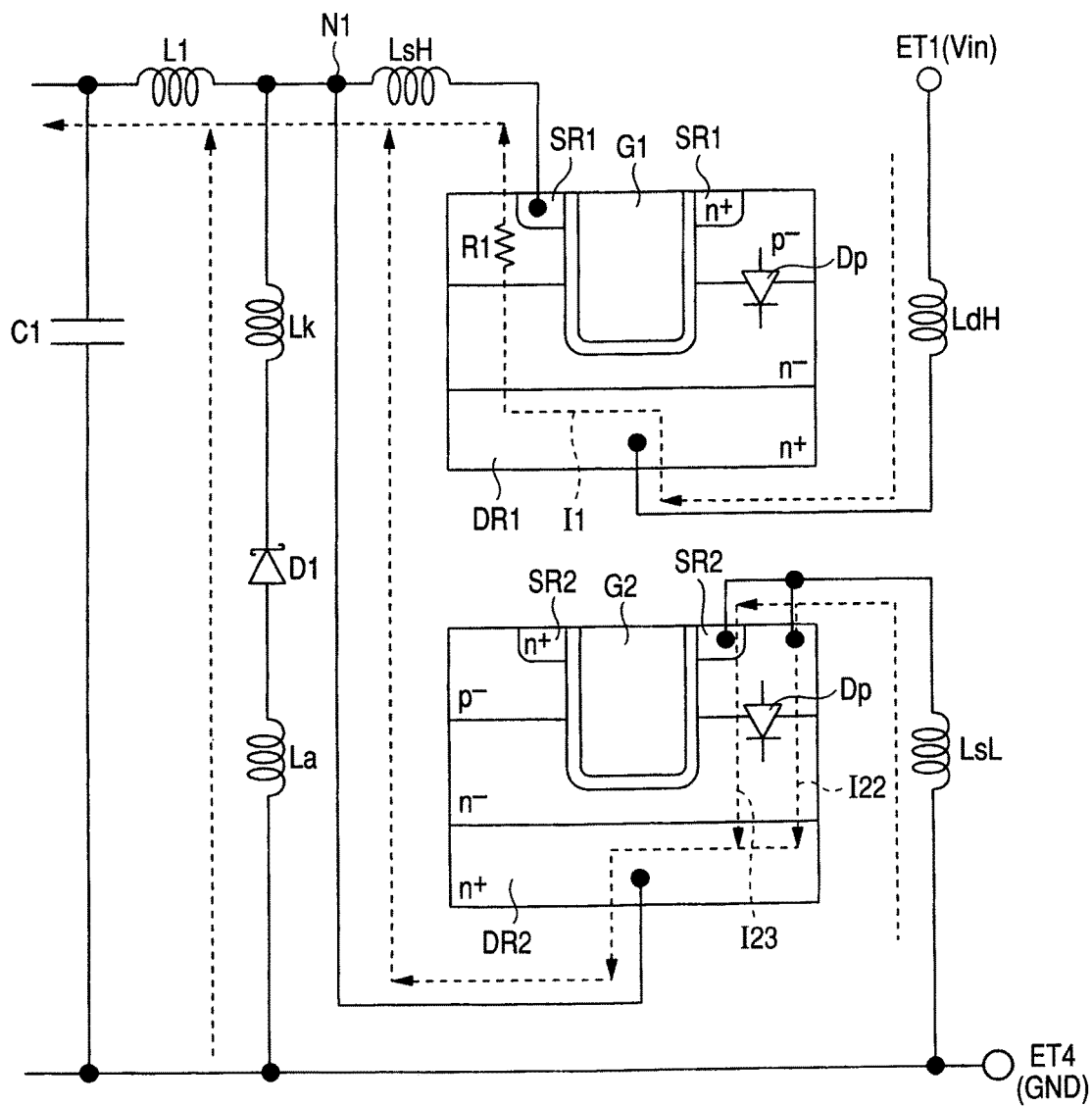
FIG. 31 is an explanatory view of the device cross-section upon circuit operation of FIG. 30.

In the next place, the reason why an increase in a parasitic inductance LsH is accompanied by the retardation of turn-on and turn-off and increase in the turn-on loss and turn-off loss will be described. FIG. 30 is an explanatory view of a circuit operation of the non-insulated DC-DC converter 50A, while FIG. 31 is an explanatory view of the device cross-section upon circuit operation of FIG. 30.

When the gate voltage of the power MOS Q1 for high-side switch exceeds a threshold voltage and current (first current) I1 starts its flow from the drain region DR1 of the power MOS Q1 to its source region SR1, back electromotive force (LsH×di/dt) occurs by the parasitic inductance LsH, whereby the source potential of the power MOS Q1 for high-side switch becomes higher than that of the output node N1. The gate voltage of the power MOS Q1 is fed by the driver circuit 3a with the output node N1 as a reference so that a voltage applied between the gate electrode G1 to be connected to the gate of the power MOS Q1 for high-side switch and source region SR1 becomes lower than the gate voltage VgH. Since the channel resistance R1 of the power MOS Q1 for high-side switch does not reduce sufficiently, a loss of the current I1 occurs, in other words, turn-off time increases. The reason why the turn-on loss and turn-off loss increase by the current and frequency increase is because the back electromotive force (LsH×di/dt) increases by the current and frequency increase.

The power MOS Q1 for high-side switch has a switching function for storing energy in the coil L1 for supplying electricity to the output (input of the load circuit 4) of the non-insulated DC-DC converter 50A so that speed-up of switching operation is requested to meet the frequency increase. The parasitic inductance LgH generated between the driver circuit 3a and power MOS Q1 however retards the switching operation. In other words, it generates a switching loss, which leads to a reduction in the voltage conversion efficiency.

The power MOS Q2 for low-side switch, on the other hand, has a constitution not causing such a switching loss easily compared with the power MOS Q1. Described specifically, when the power MOS Q1 for high-side switch is turned OFF, a current (second current) I2 flows to the output side via the Schottky barrier diode D1 connected in parallel with the power MOS Q2 for low-side switch and at the same time, a current (second current) I22 flows toward the drain region DR2 of the power MOS Q2 from the reference potential GND via the parasitic diode Dp. When under such a state, the power MOS Q2 for low-side switch is turned ON by applying a gate voltage VgL to the gate electrode G2 to be connected to the gate of the power MOS Q2 for low-side switch, a current (third current) I23 flows from the source region SR2 of the power MOS Q2 toward the drain region DR2 via the channel region of the power MOS Q2. Prior to the flow of the current I23, the above-described current I21 and I22 have already flown. A current change amount per unit hour when the current I23 flows is small so that the counterelectromotive force by the parasitic inductance LsL is negligibly small and it does not cause a substantial loss. When the inductances La, Lk parasitic on the anode and cathode sides of the Schottky barrier diode D1 are large as described above, on the other hand, the current I21 flowing on the side of the Schottky barrier diode D1 becomes small and sufficient effects are not brought by the connection of the Schottky barrier diode D1 having a forward voltage smaller than that of the parasitic diode Dp. A parasitic diode Dp also exists in the power MOS Q1 for high-side switch, but since the parasitic diode Dp on the side of the power MOS Q1 for high-side switch has an anode formed on the side of the source region SR1 of the power MOS Q1 and a cathode formed on the side of the drain region DR1 of the power MOS Q1, it is not connected in the forward direction relative to the same direction to that of a current (first current) I1 flowing from the drain region DR1 of the power MOS Q1 to its source region SR1. The power MOS Q1 is not live with electricity before it is turned ON by the application of a gate voltage VgH and a decrease in the current change amount per unit hour does not occur so that a switching loss occurs.

The power MOS Q2 is a transistor for rectifying the non-insulated DC-DC converter 50A and has a function of carrying out rectification while decreasing the resistance of the transistor synchronously with the frequency from the control circuit 2. Since the on-time of the power MOS Q2 is longer than that of the power MOS Q1 as described above, a loss due to on-resistance becomes more eminent than a switching loss. Lowering in the on-resistance is therefore required. Owing to an interconnect resistance (interconnect impedance) generated by the parasitic inductance LsL between the power MOS Q2 and the terminal (second power supply terminal) ET4 to be fed with a reference potential GND, the on-resistance increases and a current conversion efficiency lowers.

In this Embodiment 4, a semiconductor chip 5a having a power MOS Q1 for high-side switch formed thereover, a semiconductor 5b having a power MOS Q2 for low-side switch and SBD D1 formed thereover, and a semiconductor chip 5c having driver circuits 3a and 3b formed thereover, each constituting the non-insulated DC-DC converter 1 as illustrated in FIG. 1 are housed in one package. By housing the semiconductor chips 5a to 5c in one package, the interconnect path of each of the semiconductor chips 5a to 5c can be shortened compared with the constitution having these chips housed in respective packages. This enables a reduction in the inductances LdH, LgH, LsH, LdL, LgL and LsL parasitic to these interconnects, leading to an improvement in the voltage conversion efficiency of the non-insulated DC-DC converter 1 and also down-sizing of the non-insulated DC-DC converter 1.

Although it is preferred to form the power MOS Q1 for high-side switch and power MOS Q2 for low-side switch on one semiconductor chip in consideration of only downsizing and reduction of inductance, their element characteristics cannot be exhibited fully when these transistors are formed on one semiconductor chip. In addition, it complicates the manufacturing process and increases time and cost required for the manufacture of the semiconductor chip. The power MOS Q2 for low-side switch is apt to generate heat, because the on-time is longer than that of the power MOS Q1 for high-side switch as described above. When both power MOS Q1 and Q2 are formed on one semiconductor chip, there is a fear of heat generated upon operation of the power MOS Q2 for low-side switch having an adverse effect on the power MOS Q1 for high-side switch through the semiconductor substrate. From such viewpoints, the power MOS Q1 for high-side switch, power MOS Q2 for low-side switch, and driver circuits 3a and 3b are formed on the semiconductor chips 5a to 5c, respectively. Compared with the formation of the power MOS Q1 for high-side switch, power MOS Q2 for low-side switch, and driver circuits 3a and 3b on one semiconductor chip, each element can exhibit its characteristics fully. In addition, it facilitates the manufacture of the non-insulated DC-DC converter 1, whereby the manufacturing time of the non-insulated DC-DC converter 1 can be shortened and at the same time, a production cost can be reduced. Moreover, the power MOS Q1 for high-side switch and the driver circuits 3a and 3b are not adversely affected by the heat generated upon operation of the power MOS Q2 for low-side switch so that the non-insulated DC-DC converter 1 is able to have stable operation stability. The driver circuits 3a and 3b are synchronized and operated alternately so that they are formed over one semiconductor chip 5c to ensure the stability of the whole circuit operation.

It is important to house the semiconductor chips 5a to 5c in one package in order to improve the voltage conversion efficiency of the non-insulated DC-DC converter 1 as described above, but simple housing in one package is not sufficient for the improvement of the voltage conversion efficiency. A specific constitution example in the package which is important for improving the voltage conversion efficiency of the non-insulated DC-DC converter 1 will next be described.

Figure 32:
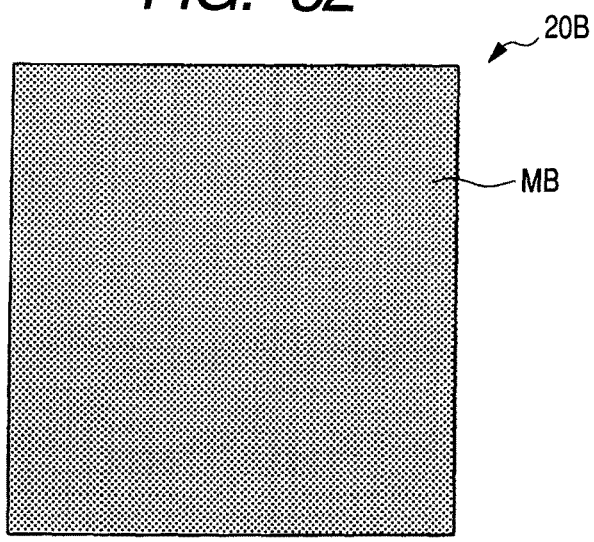
FIG. 32 is an overall plan view of a semiconductor device according to a still further embodiment of the present invention on the main surface side of the package.
Figure 33:
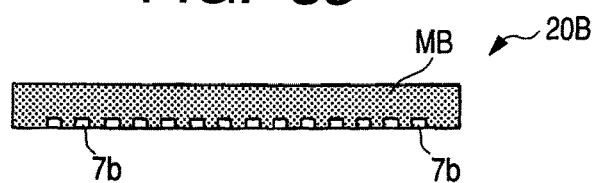
FIG. 33 is a side view of the package of the semiconductor device of FIG. 32.
Figure 34:
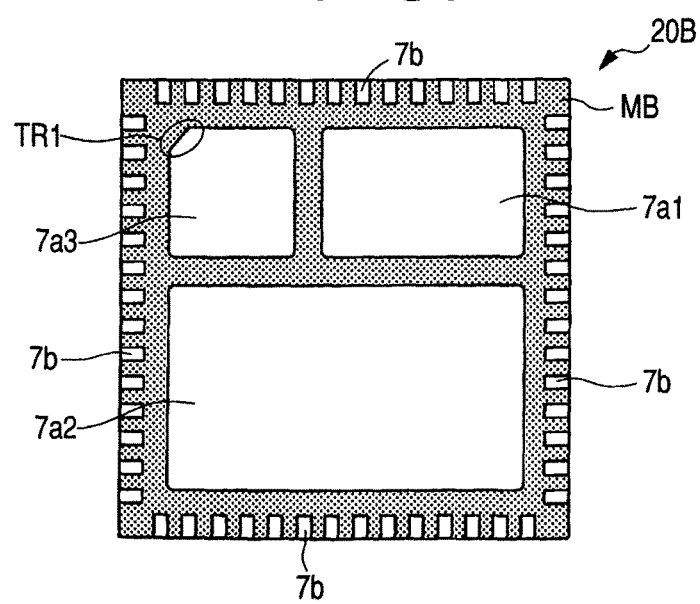
FIG. 34 is an overall plan view on the backside of the package of the semiconductor device of FIG. 32.
Figure 35:
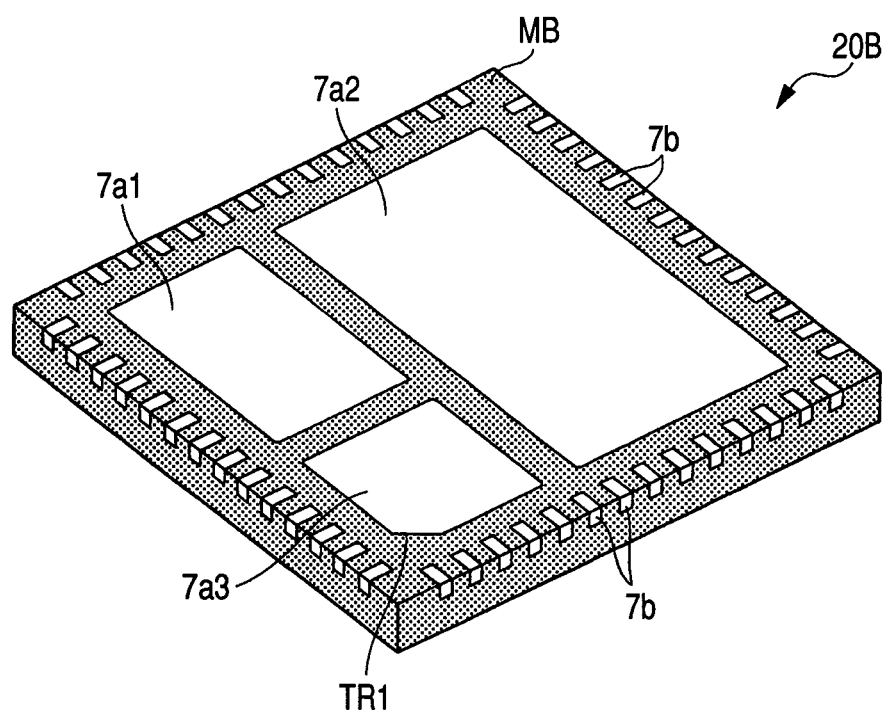
FIG. 35 is a perspective view of the appearance of the package of the semiconductor device of FIG. 32.

FIG. 32 is an overall plan view on the main surface side of the package 20B, FIG. 33 is a side view of the package 20B of FIG. 32, FIG. 34 is an overall plan view on the back side of the package 20B of FIG. 32, and FIG. 35 is a perspective view of the appearance of the package 20B of FIG. 32.

The package 20B of Embodiment 4 has, for example, a QFN (Quad Flat Non-leaded package) structure. It is not limited to QFN and various structures can be adopted. For example, flat package structures such as QFP (Quad Flat Package) and SOP (Small Out-line Package) can also be employed.

A resin sealant MB constituting the package 20B has an appearance made of a thin sheet. The resin sealant MB is made of, for example, an epoxy resin. In order to reduce the stress, a biphenyl thermosetting resin added with a phenol curing agent, silicone rubber and filler may be used as a material of the resin sealant MB. The resin sealant MB is formed by a transfer molding process suited for mass production. From the backside of the resin sealant MB, the backsides of three die pads (on which first to third chips are to be mounted) 7a1, 7a2 and 7a3 in the planar substantially-rectangular form are exposed. From the four side surfaces and periphery of the backside of the resin sealant MB, a plurality of leads (external terminals) 7b are partially exposed along the periphery of the resin sealant MB. The die pads 7a1, 7a2 and 7a3 and lead 7b are composed mainly of a metal material such as 42 alloy and their thickness is, for example, about 200 μm. As another material for the die pads 7a1, 7a2 and 7a3, and lead 7b, copper (Cu) or copper having a surface plated successively with nickel (Ni), palladium (Pd) and gold (Au) may be used. As described later, the semiconductor chips 5a and 5b are mounted on the main surface of the die pads 7a1 and 7a2, respectively, while the semiconductor chip 5c is mounted on the main surface of the die pad 7a3. On one corner of the die pad 7a3, an alignment taper TR1 (index mark) is formed. This taper TR1 is used for discriminating the main surface and backside surface of the package 20B when facing the packages 20B upon shipment or applying a trade mark to the package 20B. It is formed, for example, by etching. The die pads 7a1 and 7a2 on which the semiconductor chips 5a and 5b having, formed thereover, the power MOS Q1 and Q2 are to be mounted are portions to be fed with currents I1 and I2 from the first and second power supply terminals so that the outside dimension decreases by the formation of the taper TR1 and it may have an influence on the current characteristic. Since a dynamic current does not pass through the die pad 7a3 and a potential is fixed, it is not necessary to think of the influence on the current characteristic. Formation of the alignment taper TR1 on a portion of the die pad 7a3 is therefore preferred.

In this structure, both the backsides of the die pads 7a1 to 7a3 (surfaces opposite to the surfaces on which the semiconductor chips 5a, 5b and 5c are mounted) and the backside of the lead 7b (a surface to be bound with the terminal of the wiring substrate) exist on the mounting surface of the package 20B (a surface facing with the wiring substrate when the package 20B is mounted on the wiring substrate).

Figure 36:
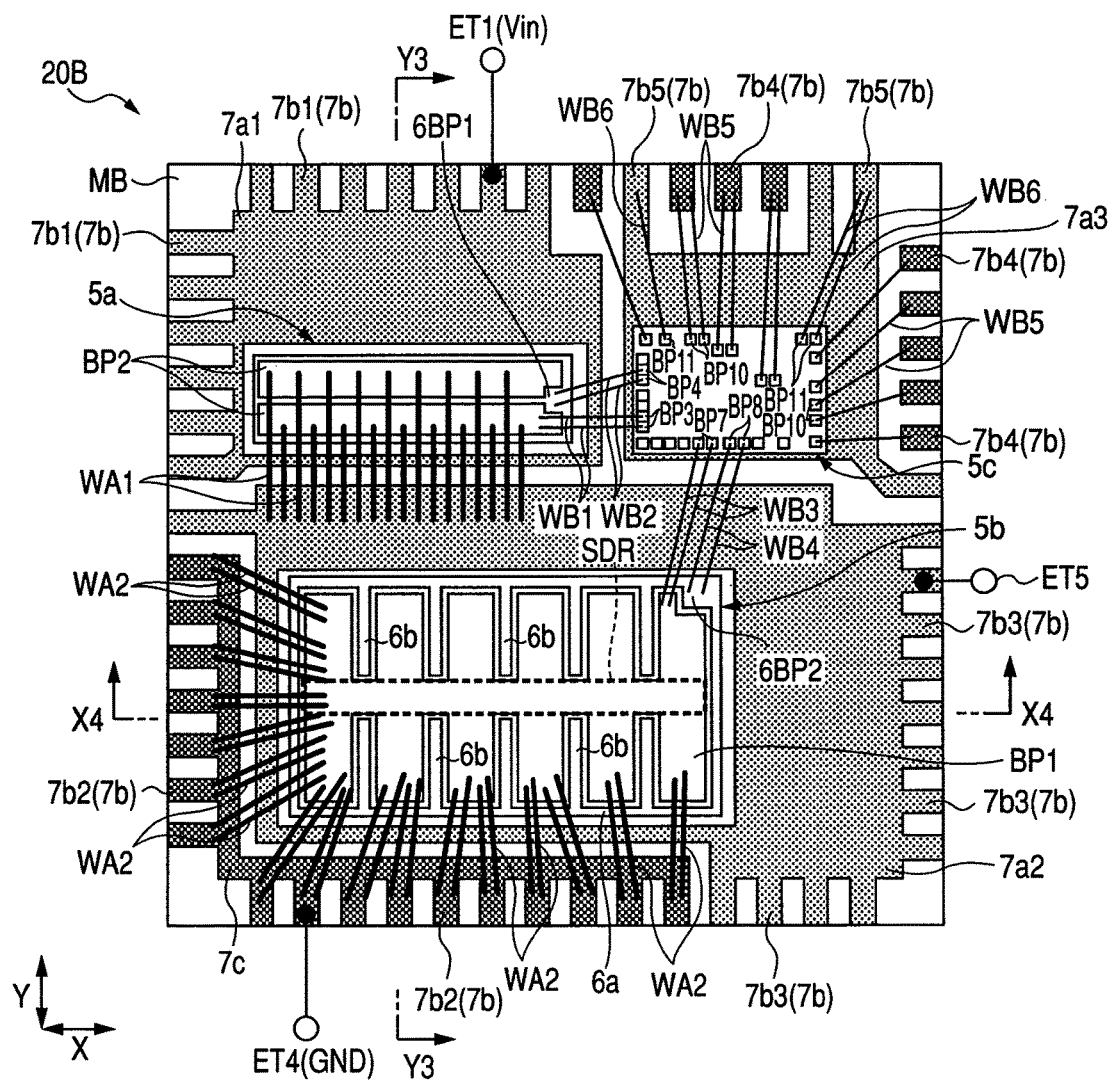
FIG. 36 is an overall plan view, when the inside of the package of the semiconductor device of FIG. 32 is viewed through, of the main surface side of the package.
Figure 37:
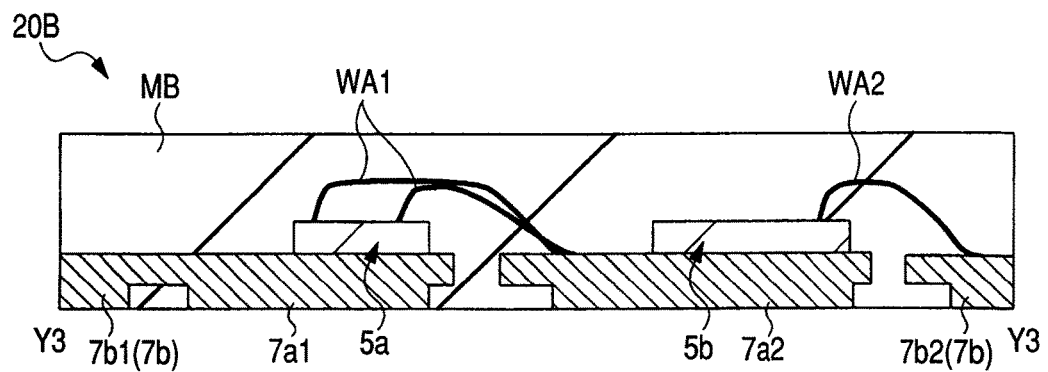
FIG. 37 is a cross-sectional view taken along a line Y3-Y3 of FIG. 36.
Figure 38:
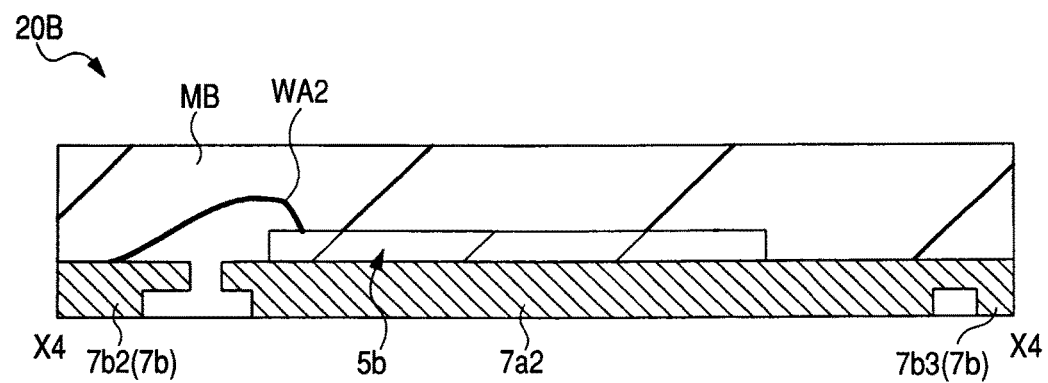
FIG. 38 is a cross-sectional view taken along a line X4-X4 of FIG. 36.

FIG. 36 is an overall plan view of the package 20B on the main surface side when the inside of the package 20B is viewed through, FIG. 37 is a cross-sectional view taken along a line Y3-Y3 of FIG. 36, and FIG. 38 is a cross-sectional view taken along a line X4-X4 of FIG. 36. Although FIG. 36 is a plan view, die pads 7a1 to 7a3, lead 7b and interconnect portion 7c are hatched to facilitate the understanding of these diagrams.

In the package 20B, the above-described three die pads 7a1 to 7a3 (first to second chip mounting portions), a plurality of semiconductor chips 5a to 5c mounted over the die pads 7a1 to 7a3 as described later, and wires WA1, WA2, WB1 to WB6 for electrically connecting the pads BP1 to BP 11 of the semiconductor chips 5a to 5c to each portion are sealed.

The die pads 7a1 to 7a3 are disposed adjacent to each other while being separated with a predetermined distance. Heat generated upon operation of the semiconductor chips 5a to 5c is released outside mainly from the backside of the semiconductor chips 5a to 5c via the die pads 7a1 to 7a3. The die pads 7a1 to 7a3 are therefore formed with an area greater than that of the semiconductor chips 5a to 5c, respectively. This enables improvement of the heat radiation property of the non-insulated DC-DC converter 1 and also improvement of the operation stability. A portion of the periphery, on the backside, of the die pads 71a to 7a3 and lead 7b is thinned by forming a half etched region. This half etched region is formed to reduce or prevent peeling or deformation failure of the die pads 7a1 to 7a3 and lead 7b by improving the adhesion between the die pads 7a1 to 7a3 and lead 7b and the resin sealant MB.

Over the die pad 7a1 on the upper left hand of FIG. 36, the semiconductor chip 5a having the power MOS Q1 for high-side switch formed thereover is disposed with its main surface up. Over the main surface of the semiconductor chip 5a, a pad BP2 for source electrode and a pad 6BP1 for gate electrode, each of the power MOS Q1, are disposed. This pad BP2 for source electrode is electrically connected to the die pad 7a2 via a plurality of wires WA1 and at the same time, is electrically connected to the pad BP3 for the source electrode of the driver circuit 3a of the semiconductor chip 5c via a plurality of wires WB1. The pad 6BP1 for gate electrode is electrically connected to the pad BP4 for output (drain) electrode of the driver circuit 3a of the semiconductor chip 5c via a plurality of wires WB2. The backside of the semiconductor chip 5a serves as a drain electrode to be connected to the drain of the power MOS Q1 and is electrically connected via the die pad 7a1 to a plurality of leads 7b1 (7b) formed integrally with the periphery of the die pad 7a1. These leads 7b1 are electrically connected to the terminal ET1. The wires WA1 are disposed in a zigzag form so that any two wires WA1 adjacent to each other in the first direction X are connected to the upper and lower pads BP2 alternately.

The semiconductor chip 5a having the power MOS Q1 for high-side switch formed thereover is rectangular as illustrated in FIG. 36. Its side in the first direction X is longer than another side in the second direction Y which is perpendicular thereto. The semiconductor chip 5a is disposed so that it comes near the die pad 7a2 relative to the center of the die pad 7a1. In other words, the semiconductor chip 5a is disposed near one side of the die pad 7a1 adjacent to one side of the die pad 7a2. By disposing the semiconductor chip 5a near the die pad 7a2, the length of the wires WA1 for electrically connecting the pads BP2 for the source electrode of the power MOS Q1 and the die pad 7a2 can be shortened, thereby reducing the parasitic inductance LsH generated between the source of the power MOS Q1 and the drain of the power MOS Q2. The semiconductor chip 5a is disposed in such a manner that its long side runs along the adjacent long side of the die pad 7a2. This makes it possible to secure a facing length of the pad BP2 for source electrode of the semiconductor chip 5a and the die pad 7a2, thereby enabling the arrangement of a plurality of the wires WA1. An inductance LsH between the source of the power MOS Q1 and drain of the power MOS Q2 can therefore be reduced. In addition, the gate interconnect made of polysilicon and extending in the second direction Y as illustrated in FIG. 36 can be shortened and the gate resistance of the power MOS Q1 can therefore be reduced, because the semiconductor chip 5a has a rectangular form. Moreover, the semiconductor chip 5a is disposed so as to make the distance between the semiconductor chips 5a and 5c shorter than that between the semiconductor chips 5a and 5b, particularly to decrease the distance between the pad 6BP1 for gate electrode of the semiconductor chip 5a and the pad BP4 for the output electrode of the semiconductor chip 5c. Such a structure is adopted in consideration of a great influence of an increase in the inductance of the gate of the power MOS Q1 for high-side switch on an increase in the switching loss. By disposing the semiconductor chip 5a near the semiconductor chip 5c, the length of the wire WB2 for electrically connecting the pad 6BP1 for the gate electrode of the power MOS Q1 and the pad BP4 for the output electrode of the driver circuit 3a can be decreased, the inductance LgH parasitic to the gate of the power MOS Q1 can be reduced and therefore, a switching loss of the power MOS Q1 can be reduced. Such arrangement of the semiconductor chip 5a makes it possible to reduce the switching loss of the power MOS Q1 and therefore improve the voltage conversion efficiency of the non-insulated DC-DC converter 1.

To the pad BP2 for the source electrode of the semiconductor chip 5a, two wires WA1 and WB1 are electrically connected. In other words, the wire WA1 to be connected to the die pad 7a2 and the wire WB1 to be connected to the source of the driver circuit 3a are used properly as wires electrically connected to the pad BP2 for the source electrode of the semiconductor chip 5a. This makes it possible to disperse the current flow into two paths, one for the current I1 flowing from the source of the power MOS Q1 toward the output terminal via the die pad 7a2 and the other for a current flowing toward the driver circuit 3a, thereby reducing a current load generated in the respective wires WA1 and WB1. As a result, a parasitic inductance between the power MOS Q1 and driver circuit 3a can be reduced, leading to a further improvement in the switching loss.

The above-described wires WA1, WB1 and WB2 are made of, for example, gold (Au) and the wire WA1 is thicker than the wires WB1 and WB2. This makes it possible to reduce an interconnect inductance on the source side of the power MOS Q1, reduce a switching loss of the non-insulated DC-DC converter 1, and therefore improve its voltage conversion efficiency.

Over the die pad 7a2 which lies on the bottom of FIG. 36 and having the widest area, the semiconductor chip 5b having the power MOS Q2 for low-side switch and SBD D1 formed thereover is disposed with its main surface up. Over the main surface of the semiconductor chip 5b, a pad BP1 for the source electrode of the power MOS Q2 and anode electrode of the SBD D1 and a pad 6BP2 for gate electrode are disposed. The pad BP1 is electrically connected to the leads 7b2 via a plurality of wires WA2 and electrically connected to a pad BP7 for source electrode of the driver circuit 3b of the semiconductor chip 5c via a plurality of wires WB3. The pad 6BP2 for gate electrode is electrically connected to a pad BP8 for output (drain) electrode of the driver circuit 3b of the semiconductor chip 5c via a plurality of wires WB4. The backside of the semiconductor chip 5b serves as a drain electrode of the power MOS Q2 and a cathode electrode of the SBD D1 and is electrically connected via the die pad 7a2 to a plurality of leads 7b3 (7b) formed integrally with the periphery of the die pad 7a2. These leads 7b3 are electrically connected to the output terminal ET5.

The semiconductor chip 5b having the power MOS Q2 for low-side switch formed thereover has a rectangular form as illustrated in FIG. 36. Its side in the first direction X is longer than another side in the second direction Y. Although the semiconductor chip 5b is disposed along the semiconductor chip 5a, it is separated from the semiconductor chip 5a and disposed not in the center of the die pad 7a2 but near the lead 7b2. Described specifically, the semiconductor chip 5b is disposed not near the lead 7b3 to which the output terminal ET5 is connected but near the corner (left corner of FIG. 36) of the die pad 7a2 in the vicinity of the lead 7b2 to which the terminal ET4 fed with a reference potential GND is connected. The length of the semiconductor chip 5b in the second direction Y is adjusted to almost equal to the length, in the second direction, of the interconnect portion 7c to which a plurality of leads 7b2 have been connected, while the length of the semiconductor chip 5b in the first direction X is adjusted to almost equal to the length, in the first direction X, of the interconnect portion 7c to which a plurality of leads 7b2 have been connected. By such a constitution, the wire WA2 for electrically connecting the pad BP1 for source electrode of the power MOS Q2 and anode electrode of the SBD D1 to the leads 7b2 can be shortened. Two sides, that is, long side and short side, of the semiconductor chip 5b crossing each other are disposed along the arranged form (planar L-shaped form) of the plurality of leads 7b2. In particular, the pad BP1 for source electrode of the power MOS Q2 and anode electrode of the SBD D1 have a form extending along the arranged form of the plurality of leads 7b2. This makes it possible to face the pad BP1 and a group of the plurality of leads 7b2 each other for a long distance, thereby disposing a plurality of the wires WA2. The plurality of leads 7b2 are arranged along two sides of the die pad 7a2 crossing at right angles each other and are connected to the interconnect portion 7c which is in the planar L shaped form and extends along these two sides. By connecting all the plurality of leads 7b2 to the interconnect portion 7c, a volume increase occurs compared with the separated arrangement of the plurality of leads 7b2, which contributes to a decrease in an interconnect resistance and reinforcement of the reference potential GND. In consideration of a great influence of an increase in the on-resistance on the source side of the power MOS Q2 for low-side switch on an increase in a switching loss, such a constitution is adopted. By adopting such a constitution, the on-resistance on the source side of the power MOS Q2 can be reduced, and a conduction loss of the power MOS Q2 can therefore be reduced. In addition, parasitic impedances of the wire WA2 can be made uniform, whereby the current flowing to the wire WA2 can be made uniform. This makes it possible to improve the voltage conversion efficiency of the non-insulated DC-DC converter 1. Moreover, the reference potential GND can be reinforced so that the operation stability of the non-insulated DC-DC converter 1 can be improved.

With regards to the SBD D1, the cathode electrode of the SBD D1 can be electrically connected to the output interconnect or drain electrode of the power MOS Q1 via the die pad 7a2 having a large area so that the inductance Lk parasitic to the cathode can be reduced drastically. In addition, by forming the power MOS Q2 and SBD D1 on one semiconductor chip 5b, an interconnect length between the anode of the SBD D1 and the source of the power MOS Q2 can be reduced so that the inductance La parasitic to the interconnect can be reduced greatly. In other words, since the inductances La, Lk parasitic to the anode and cathode of the SBD D1 can be reduced, the SBD D1 is able to exhibit its effect fully, a diode conduction loss and diode recovery loss can be reduced, and therefore a voltage conversion efficiency of the non-insulated DC-DC converter 1 can be improved. In addition, a reduction in the inductances La, Lk results in a reduction in the noise.

The power MOS Q2 for low-side switch is mounted on the die pad 7a2 having the largest area because its heat generation amount upon operation is the greatest. This makes it possible to improve the radiation of the heat generated by the power MOS Q2, thereby improving the operation stability of the non-insulated DC-DC converter 1.

The above-described wires WA2, WB3 and WB4 are made of, for example, gold (Au) and the wire WA2 is thicker than the wire WB3 and WB4. By using the thick wire WA2 as a wire electrically connected to the source of the power MOS Q2 and anode of the SBD D1, an interconnect resistance on the source side of the power MOS Q2 and anode side of the SBD D1 can be reduced. This leads to a reduction in the on-resistance of the power MOS Q2 and a reduction in the loss of the diode so that a voltage conversion efficiency of the non-insulated DC-DC converter 1 can be improved.

Over the die pad 7a3 which lies on the upper right of FIG. 36 and having the smallest area, the semiconductor chip 5c having the driver circuits 3a and 3b formed thereover is disposed with its main surface up. Over the main surface of the semiconductor chip 5c, pads BP10 for signal input (gate) electrode of the driver circuits 3a and 3b and pads BP11 for source electrode are disposed as well as the above-described pads BP3, BP4, BP7 and BP8. The pads BP10 for gate electrode are electrically connected to the leads 7b4 (7b) via a plurality of wires WB5. The pads BP11 for source electrode are electrically connected via a plurality of wires WB6 to leads 7b5 (7b) formed integrally with the die pad 7a3.

The semiconductor chip 7c having the driver circuits 3a and 3b formed thereover are also in the planar rectangular form and the pads BP3, BP4, BP7 and BP8 to be connected with the power MOS Q1 and Q2 are disposed along two sides to which the semiconductor chips 5a and 5b are contiguous, respectively. This makes it possible to decrease the length of each of the wires WB1, WB2, WB3 and WB4 further, thereby causing a further reduction in the parasitic inductances LgH, LsH, LgL and LsL which occur in the interconnect paths. As described above, in order to reduce the switching resistance rather than the on-resistance in the semiconductor chip 5a, the distance between the semiconductor chip 5c and the semiconductor chip 5a is adjusted shorter than that between the semiconductor chip 5c and the semiconductor chip 5b; and in addition, the wires WB1 and WB2 electrically connected to the source and gate of the power MOS Q1 respectively are made shorter than the wires WB3 and WB4 electrically connected to the source and gate of the power MOS Q2, respectively.

The semiconductor chips 5a to 5c are different in outside dimension (area) because of a difference in characteristic. The semiconductor chip 5a has an outside dimension greater than that of the semiconductor chip 5c, while the semiconductor chip 5b has an outside dimension greater than that of the semiconductor chip 5a. The semiconductor chip 5c having the driver circuits 3a and 3b formed thereover is a control circuit for controlling the gates of the power MOS Q1 and Q2 so that the outside dimension of the element as small as possible is preferred in consideration of the whole package size. On the other hand, the on-resistance occurring in the transistor is preferably as small as possible, because currents I1 and I2 pass through the power MOS Q1 and Q2. A reduction in the on-resistance can be achieved by widening the channel width per unit transistor cell area. The semiconductor chips 5a and 5b therefore have an outside dimension greater than that of the semiconductor chip 5c. As illustrated in FIG. 3, the on-time of the power MOS Q2 for low-side switch is longer than the on-time of the power MOS Q1 for high-side switch so that the on-resistance of the power MOS Q2 must be made smaller than the on-resistance of the power MOS Q1. The semiconductor chip 5b therefore has an outside dimension greater than that of the semiconductor chip 5a.

The wires WA1, WA2 and WB1 to WB6 are connected, for example, by ultrasonic thermocompression bonding. When an ultrasonic energy is not transferred smoothly to the wire bonding portions of the die pads 7a1 to 7a3 and lead 7b, there is a danger of bonding failure. The wire bonding is therefore performed while avoiding the half etched region. This makes it possible to reduce or prevent the bonding failure.

A thin wire is used as the wires WB1 to WB6 to be connected to the semiconductor chip 5c, because an increase in the area of each the pads BP3, BP4, BP7, BP8, BP10 and BP11 is inevitable when a thick wire is used. This increases a chip size and also a production cost.

Figure 39:
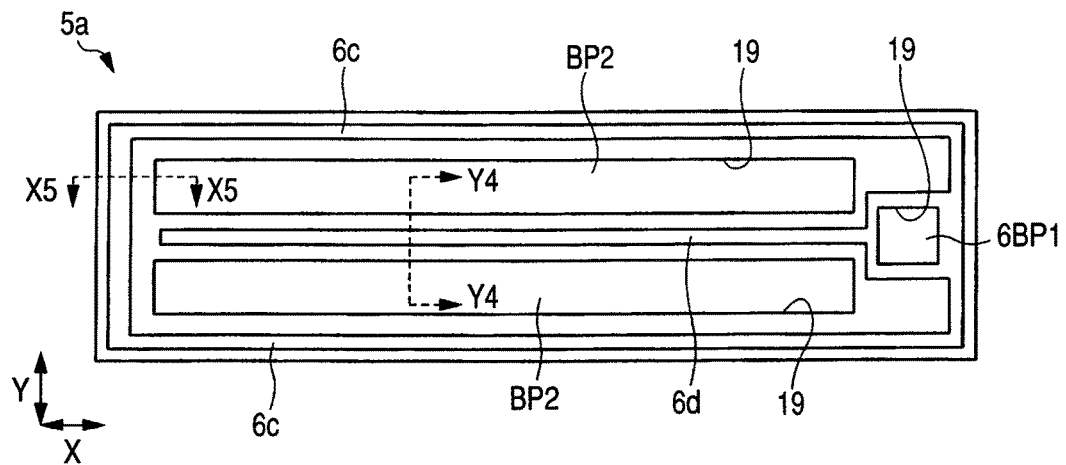
FIG. 39 is an overall plan view of the main surface side of a first semiconductor chip constituting the semiconductor device of FIG. 36.
Figure 40:
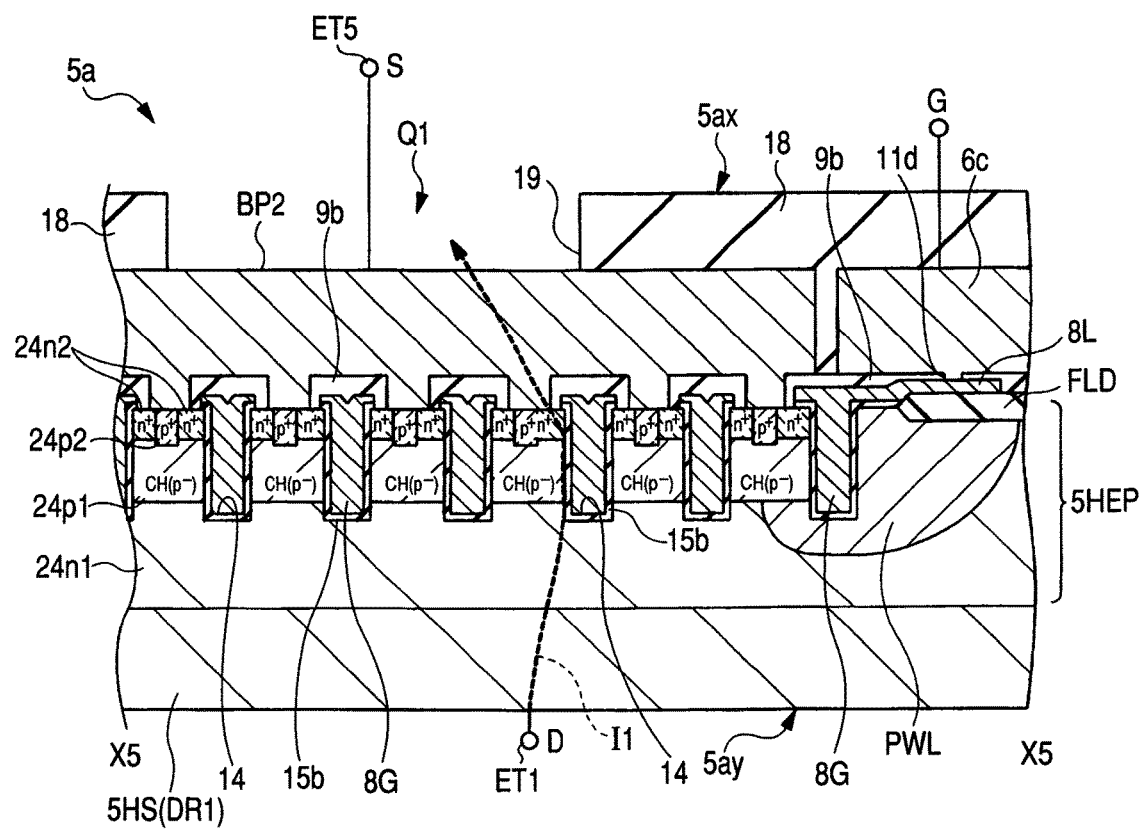
FIG. 40 is a cross-sectional view taken along a line X5-X5 of FIG. 39.
Figure 41:
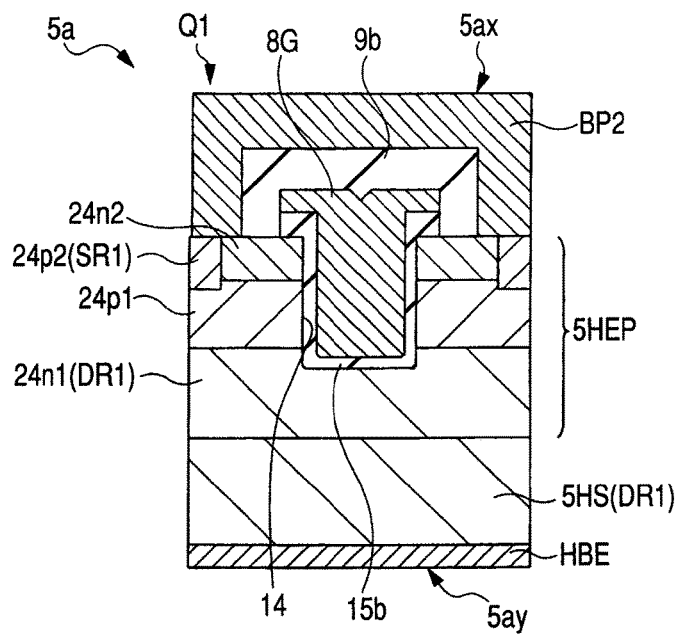
FIG. 41 is a fragmentary cross-sectional view of the first semiconductor chip of FIG. 39.
Figure 42:
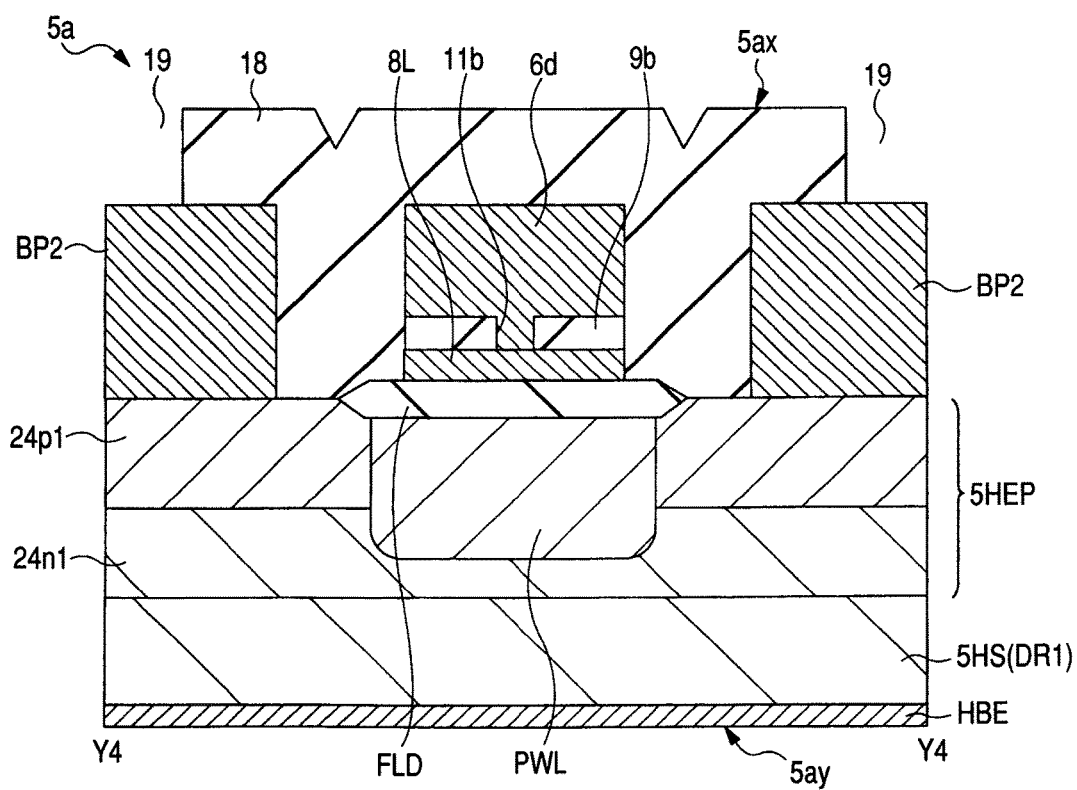
FIG. 42 is a cross-sectional view taken along a line Y4-Y4 of FIG. 39.

FIG. 39 is an enlarged plan view of the semiconductor chip 5a, FIG. 40 is a cross-sectional view taken along a line X5-X5 of FIG. 39, FIG. 41 is a fragmentary cross-sectional view of the semiconductor chip 5a, and FIG. 42 is a cross-sectional view taken along a line Y4-Y4 of FIG. 39.

The semiconductor chip 5a has a semiconductor substrate 5HS, a plurality of unit transistor elements formed over the main surface (surface side on which the pad BP2 and 6BP1 are formed) of this semiconductor substrate 5HS, a multi-layer interconnect layer obtained by stacking the insulating layer 9b and gate fingers 6c and 6d one after another over the main surface of the semiconductor substrate 5HS, and a surface protection film (final protection film) 18 formed to cover these gate fingers 6c and 6d. The semiconductor substrate 5HS is made of, for example, n$^+$ type silicon (Si) single crystal. The insulating layer 9b is made of, for example, a silicon oxide film. The pads BP2 and 6BP1 and gate fingers 6c and 6d are made of a metal material such as aluminum (Al) and they constitute the uppermost interconnect layer here. The surface protection film 18 is, for example, a silicon oxide film, a silicon nitride ($Si_3N_4$) film or a film stack obtained by stacking an organic film such as polyimide film (PiQ) over the film stack of them.

The semiconductor chip 5a has a main surface (circuit formation surface) 5ax and a backside (backside electrode formation surface) 5ay which are opposite to each other. An integrated circuit and pads BP2 and 6BP1 are formed on the main surface 5ax side of the semiconductor chip 5a, while a backside electrode HBE electrically connected to the drain region DR is formed on the backside 5ay. The integrated circuit is composed mainly of a transistor element, pad BP2 and gate fingers 6ac and 6d formed over the main surface 5ax of the semiconductor substrate 5HS. The backside electrode HBE is formed by deposition of a metal such as gold (Au) and is connected to the die pad 7a2 as described above. The surface protection film 18 has an opening portion 19 from which a portion of the pad BP2 and gate finger 6c are exposed.

In the width direction (second direction Y) of the semiconductor chip 5a, two pads BP2 are formed for source electrode. These pads BP2 are formed so that they extend along the longer direction (first direction X) of the semiconductor chip 5a and face each other. The pad 6BP1 for gate electrode is disposed in the vicinity of one short side of the semiconductor chip 5. The pad 6BP for gate electrode has a planar square shape and its planar size is, for example 280 μm×280 μm. The pad 6BP1 for gate electrode is formed integrally with the gate fingers 6c and 6d. The gate finger 6d is a pattern extending along the longer direction of the semiconductor chip 5a from the pad 6BP1 and is disposed between the above-described two pads BP2. The gate finger 6c, on the other hand, is a pattern extending along the periphery of the semiconductor chip 5a and is disposed to surround the two pads BP2 therewith. The gate fingers 6c and 6d each has a width of about 25 μm. By such a constitution, the pad BP2 for source electrode can be disposed near the die pad 7a2 and along a pair of long sides. This makes it possible to shorten the wire WA1 for electrically connecting the pad BP2 for source electrode and the die pad 7a2 and moreover, arrange as many wires WA1 as possible, thereby reducing the parasitic inductance LsH. By forming the gate finger 6d while separating, at one end portion of the semiconductor chip 5a (an end portion opposite to a side connected to the pad 6BP1), from a portion of the gate finger 6c, the separation of the source region SR1 of the power MOS Q1 can be avoided. In other words, the on-resistance can be reduced by forming the source region SR1 without separation.

Over the main surface of the semiconductor substrate 5HS, an epitaxial layer 5HEP made of, for example, n type silicon single crystal is formed. This epitaxial layer 5HEP has an n$^-$ type semiconductor region 24n1, a p type semiconductor region 24p1 thereover, an n$^+$ type semiconductor region 24n2 thereover, and a p$^+$ type semiconductor region 24p2 extending from the main surface of the semiconductor substrate 5HS to be connected to the p type semiconductor region 24p1. An n channel type vertical power MOS Q1 having a trench gate structure is formed over such a semiconductor substrate 5HS and in the epitaxial layer 5HEP.

The power MOS Q1 has the n$^+$ type semiconductor region 24n2 having a function as the source region SR1, the n$^-$ type semiconductor region 24n1 having a function as the drain region DR1, the p type semiconductor region 24p1 having a function as the channel formation region CH1, a gate insulating film 15b formed over the inner wall surface of the trench 14 made in the thickness direction of the epitaxial layer 5HEP, and a gate electrode 8G embedded in the trench 14 via the gate insulating film 15b. The gate electrode 8G is made of, for example, low-resistance polycrystalline silicon. Miniaturization and higher integration of the unit area of the power MOS Q1 can be achieved by adopting such a trench gate structure.

The gate electrode 8G of each cell is pulled over a field insulating film FLD via a gate interconnect 8L which is formed integrally with the gate electrode and is made of polycrystalline silicon, and is electrically connected to the gate finger 6d via a contact hole 11d. The surfaces of the gate electrode 8G and gate interconnect 8L are covered with the surface protection film 18, and they are insulated from the pad BP2. The pad BP2 is electrically connected to, in addition to the n$^+$ type semiconductor region 24n2 for source, the p type semiconductor region 24p1 for channel formation via the p$^+$ type semiconductor region 24p2. The current I1 upon operation of the power MOS Q1 flows between the source region SR1 and drain region DR1 along the depth direction of the trench 14 (flows in the thickness direction of a drift layer) and at the same time, flows along the side surface of the gate insulating film 15. Since such a vertical power MOS Q1 has a larger gate area per unit cell area and has a greater junction area between the gate electrode 8G and drift layer of the drain compared with a horizontal type field effect transistor having a channel formed in a horizontal direction relative to the main surface of the semiconductor substrate, its channel width per unit cell area can be increased and on-resistance can be reduced in spite of an increase in the gate-drain parasitic capacitance. The PWL2 is a p$^-$ type p well.

Since the element constitution of the semiconductor chip 5b having the power MOS Q2 for low-side switch formed thereover was already described in Embodiment 1, is description is omitted here. It is however to be noted that the threshold voltage of the power MOS Q2 for low-side switch is controlled to be higher than the threshold voltage of the power MOS Q1 for high-side switch, in order to prevent an inevitable current (through current) flow from the terminal ET1 to the terminal ET4 upon switching from the power MOS Q1 for high-side switch to the power MOS Q2 for low-side switch, which phenomenon is called "self turn-on". By the above-described control, the path of a through current can be suppressed or blocked so that the self turn-on can be suppressed or prevented.

Figure 43:
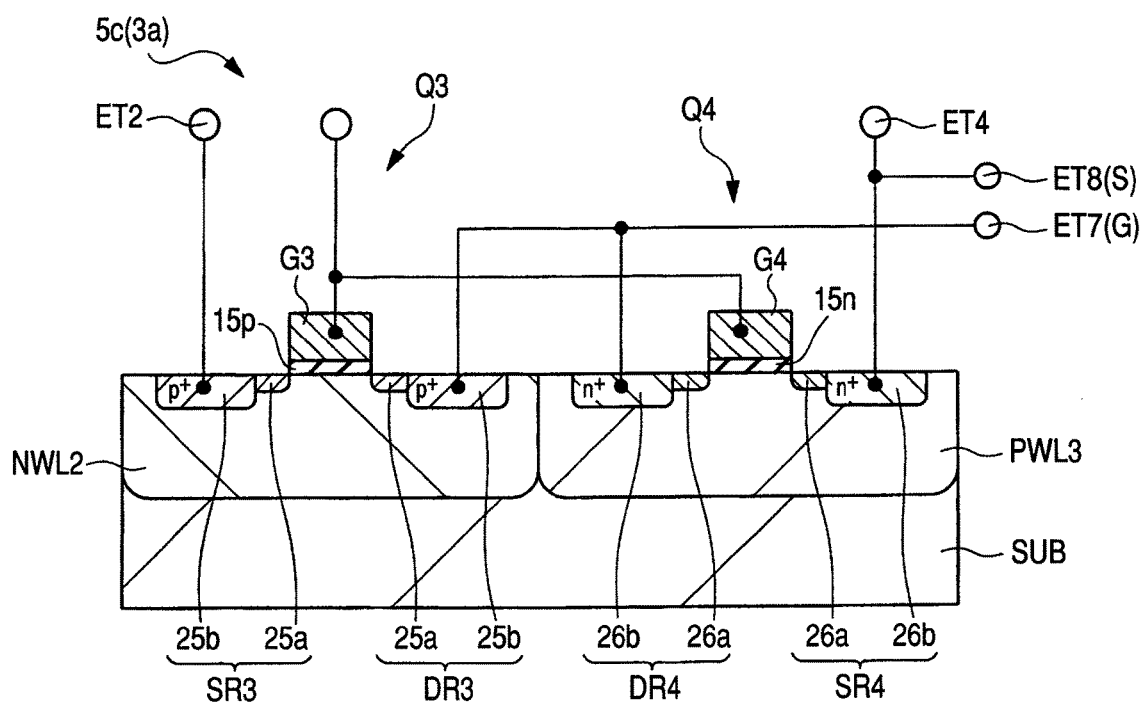
FIG. 43 is a fragmentary cross-sectional view of a third semiconductor chip constituting the semiconductor device of FIG. 36.

The semiconductor chip 5c having the driver circuits 3a and 3b for control will next be described. The circuit constitution and constitution of the device cross-section of the semiconductor chip 5c are similar to those as described referring to FIGS. 5 and 6. The fundamental constitution example of the driver circuit 3a is illustrated in FIG. 43. The device constitution of the driver circuit 3b is substantially similar to that of the driver circuit 3a so that description of the driver circuit 3b is omitted.

The driver circuit 3a has a p-channel horizontal type (having a channel formed in a horizontal direction relative to the main surface of a semiconductor substrate SUB) power MOS Q3 formed in an n type well NWL2 and an n-channel horizontal type power MOS Q4 formed in the p type well PWL3. The power MOS Q3 has a source region SR3, a drain region DR3, a gate insulating film 15p and a gate electrode G3. The source region SR3 and the drain region DR3 each has a p$^-$ type semiconductor region 25a and a p$^+$ type semiconductor region 25b. The power MOS Q4 has a source region SR4, a drain region DR4, a gate insulating film 15n and a gate electrode G4. The source region SR4 and the drain region DR4 each has an n$^-$ type semiconductor region 26a and an n$^+$ type semiconductor region 26b. The drain regions DR3 and DR4 are connected to an outputting terminal ET7 and electrically connected to the gate of the power MOS Q1 for high-side switch via the outputting terminal ET7. The source region SR4 is connected to a terminal ET8 and is electrically connected to the source of the power MOS Q1 for high-side switch via this terminal ET8.

Figure 44:
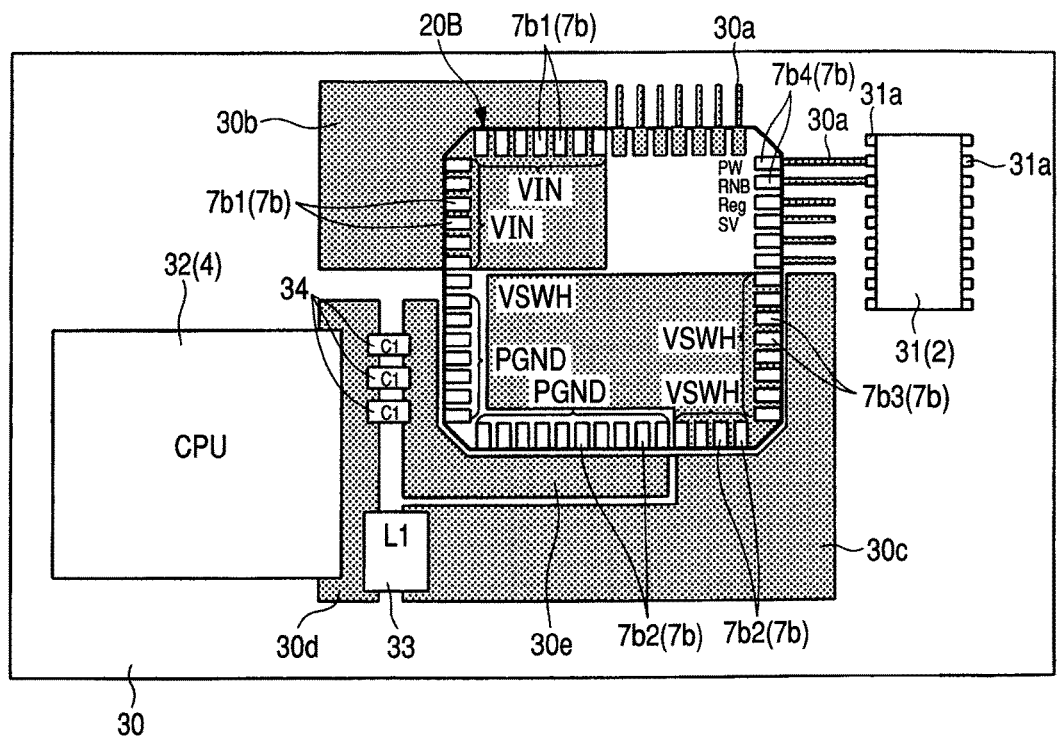
FIG. 44 is a plan view illustrating one example of the packaged semiconductor device of FIG. 32.
Figure 45:
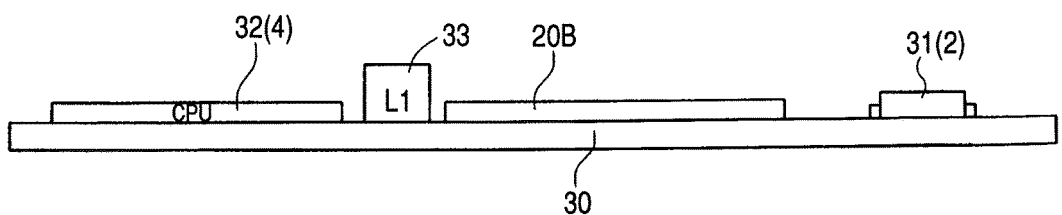
FIG. 45 is a side view illustrating the packaged semiconductor device of FIG. 44.

FIG. 44 is a plan view of one mounting example of the package 20B, while FIG. 45 is a side view of the package 20B of FIG. 44. In FIG. 44, the package 20B is viewed through in order to facilitate the understanding of the interconnection of the wiring substrate 30.

The wiring substrate 30 is made of, for example, a printed circuit board and packages 20B, 31 and 32 and chip parts 33 and 34 are mounted on the main surface thereof. The package 31 has the control circuit 2 formed therein, while the package 32 has the load circuit 4 formed therein. The chip part 33 has the coil L1 formed therein, while the chip part 34 has the condenser C1 formed therein. The lead 31a of the package 31 is electrically connected to the lead 7b (7b4) of the package 20B via an interconnect 30a of the wiring substrate 30. The lead 7b1 of the package 20B is electrically connected to the interconnect 30b of the wiring substrate 30. The output lead (output terminal) 7b3 of the package 20B is electrically connected to one end of the coil L1 of the chip part 33 via the interconnect (output interconnect) 30c of the wiring substrate 30. The coil L1 of the chip part 33 is electrically connected, at the other end thereof, to the load circuit 4 via the interconnect (output interconnect) 30d of the wiring substrate 30. The lead 7b2 for reference potential GND of the package 20B is electrically connected to one end of the condenser C1 of a plurality of chip parts 34 via the interconnect 30e of the wiring substrate 30. The condenser C1 of the chip parts 34 is electrically connected, at the other end thereof, to the load circuit 4 via the interconnect 30d of the wiring substrate 30.

Figure 46:
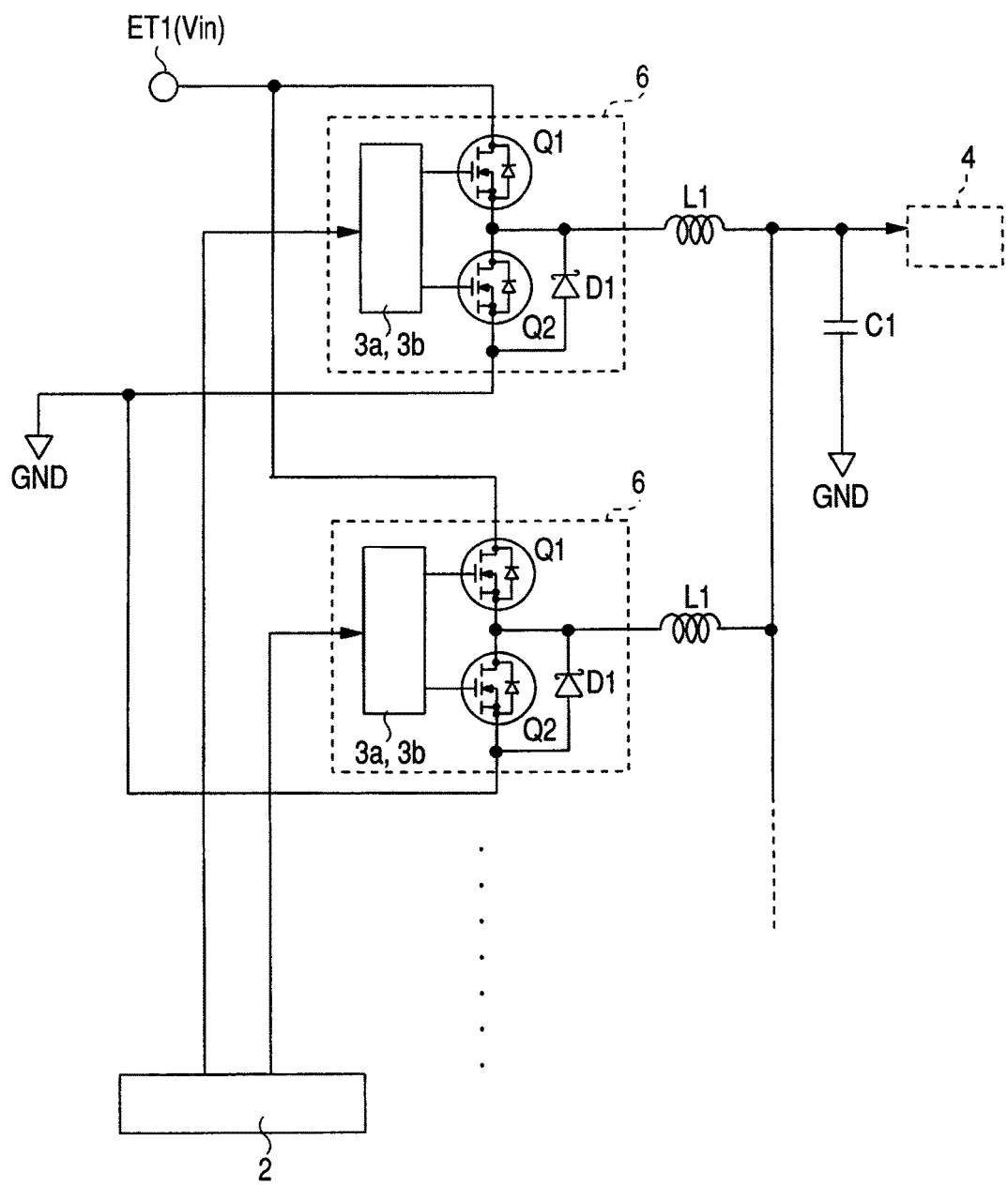
FIG. 46 is a circuit diagram illustrating one example of the circuit system constitution including the semiconductor device of FIG. 32.

FIG. 46 illustrates one example of the circuit system structure of the non-insulated DC-DC converter 1 including the package 20B according to Embodiment 1. In this circuit system, a plurality of packages 20B are connected in parallel with one load circuit 4. The input power supply potential Vin, reference potential GND and control circuit 2 are each common to a plurality of the packages 20B. When in such a circuit system, the power MOS Q1 and Q2, driver circuits 3a and 3b and SBD D1 are housed in respective packages, down sizing of the whole system can be disturbed. In Embodiment 1, on the other hand, the power MOS Q1 and Q2, driver circuits 3a and 3b and the SBD D1 (the SBD D1 and power MOS Q2 are formed on one semiconductor chip 5b) are housed in the same package 20B, which enables down sizing of the whole system.

Figure 47:
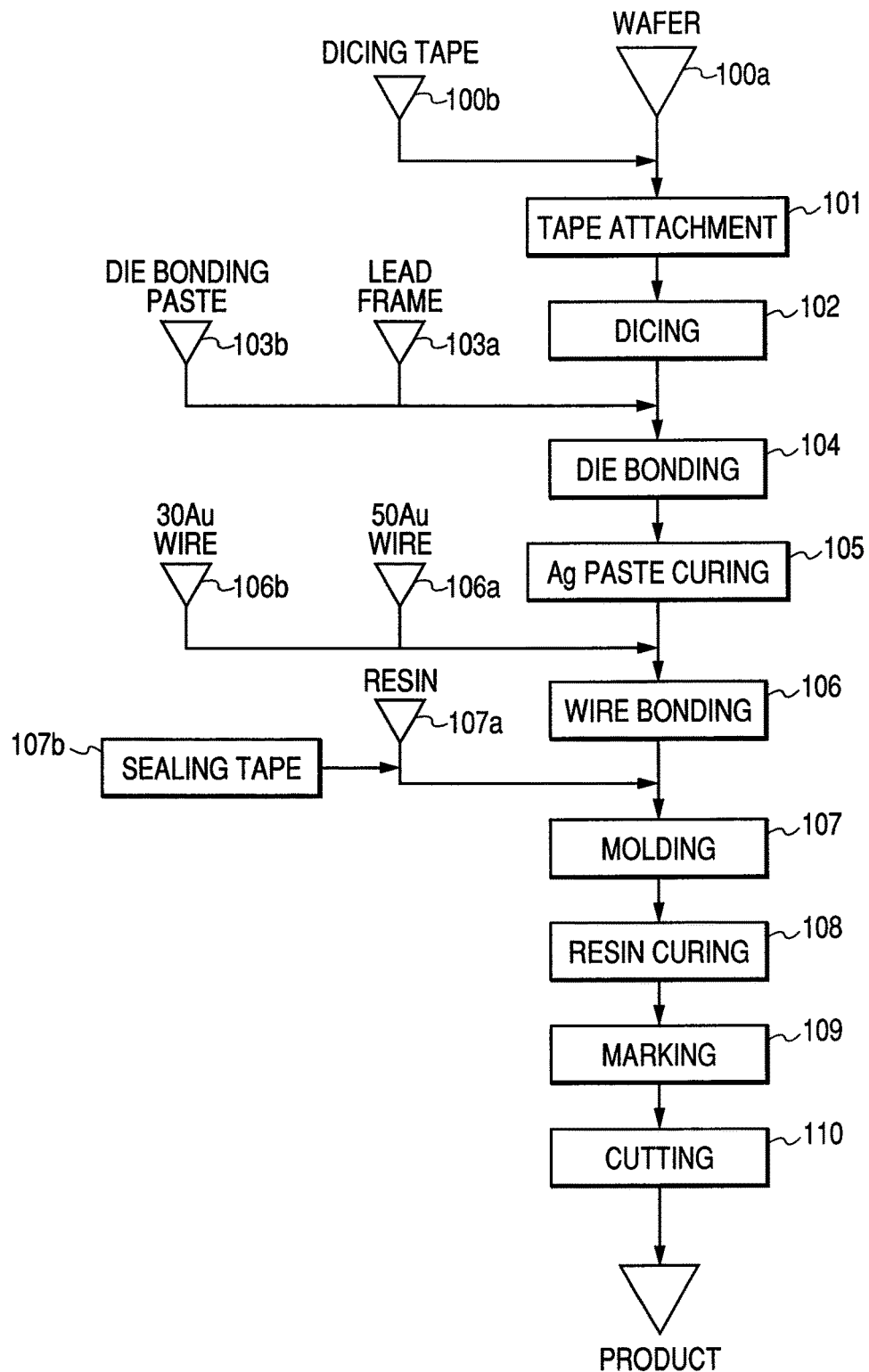
FIG. 47 is a flow chart showing the fabrication steps of the semiconductor device of FIG. 32.

A fabrication process of the package 20B according to Embodiment 1 will next be described based on the fabrication flow chart of FIG. 47.

First, three semiconductor wafers and dicing tapes are prepared (Steps 100a and 100b). These three semiconductor wafers each has a plurality of semiconductor chips 5a to 5c formed on the main surface thereof. A dicing tape is bonded to the backside of each semiconductor wafer, followed by cutting semiconductor chips 5a to 5d from each semiconductor wafer by a dicing blade (Steps 101 and 102).

Figure 48:
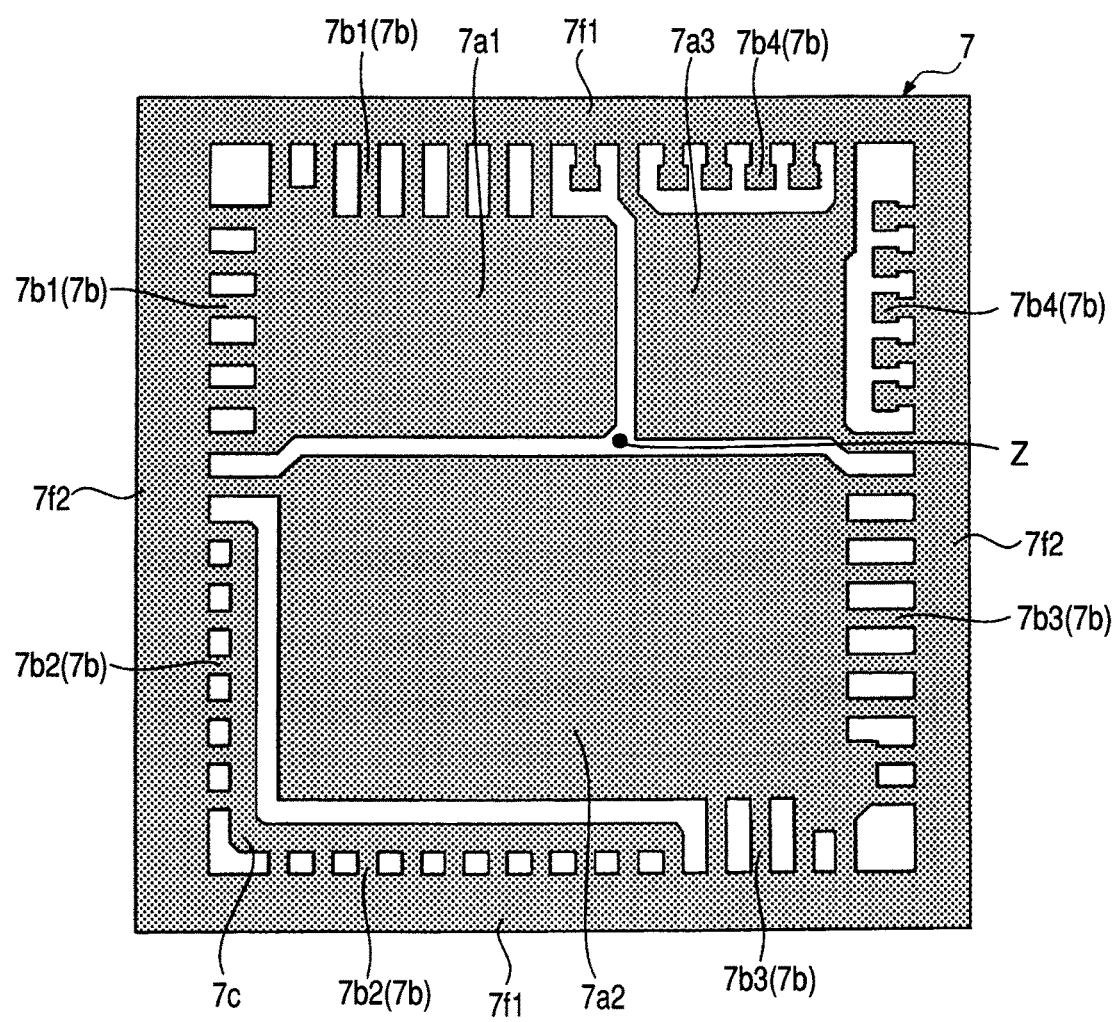
FIG. 48 is a plan view illustrating one example of the main surface side of a unit region of a lead frame to be used in the fabrication step of the semiconductor device of FIG. 32.
Figure 49:
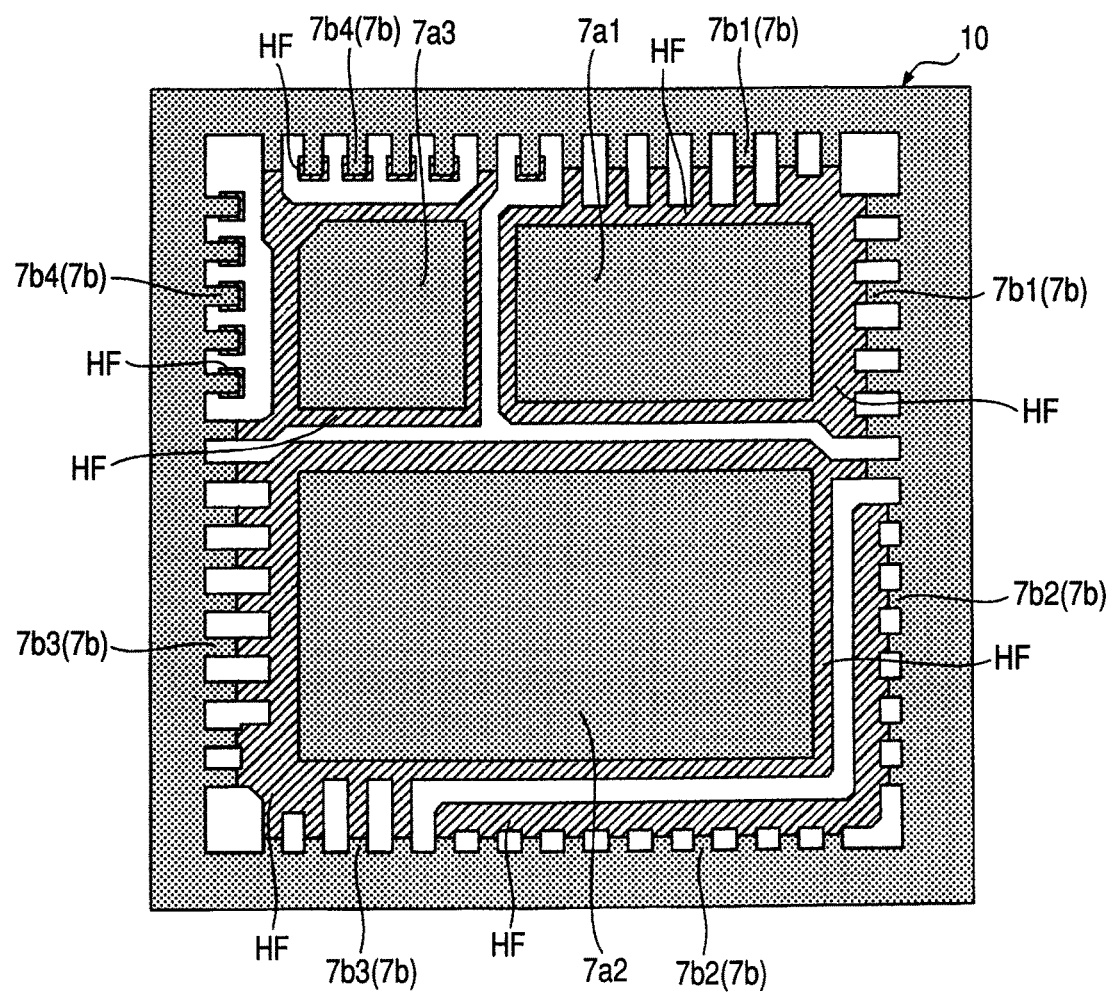
FIG. 49 is a plan view on the backside of the unit region of the lead frame of FIG. 48.

Then, a lead frame and a die bond paste are prepared (Steps 103a and 103b). FIGS. 48 and 49 each illustrates one example of the fragmentary plan view of the unit area of the lead frame 7. FIG. 48 illustrates the main surface of the lead frame 7, while FIG. 49 illustrates the backside of the lead frame 7. The lead frame 7 has two framework portions 5f1 extending along the horizontal direction of FIG. 48, framework portions 7f2 extending in a direction at right angles to the framework portions 7f1 so as to become bridges between the two framework portions 7f1, a plurality of leads 7b extending toward the center of a unit area from the inner periphery of the framework portions 7f1 and 7f2, three die pads 7a1 to 7a3 formed integrally with the plurality of leads 7b and supported by the framework portions 7f1 and 7f2 via these leads 7b, and an L-shaped interconnect portion 7c. At the periphery on the backside of the lead 7b and die pads 7a1 to 7a3, a half etched region HF which is thinner than the other region is formed. In FIG. 49, the half etched region HF is hatched to facilitate the understanding of this diagram. As the die bond paste, silver (Ag) paste was employed.

Figure 50:
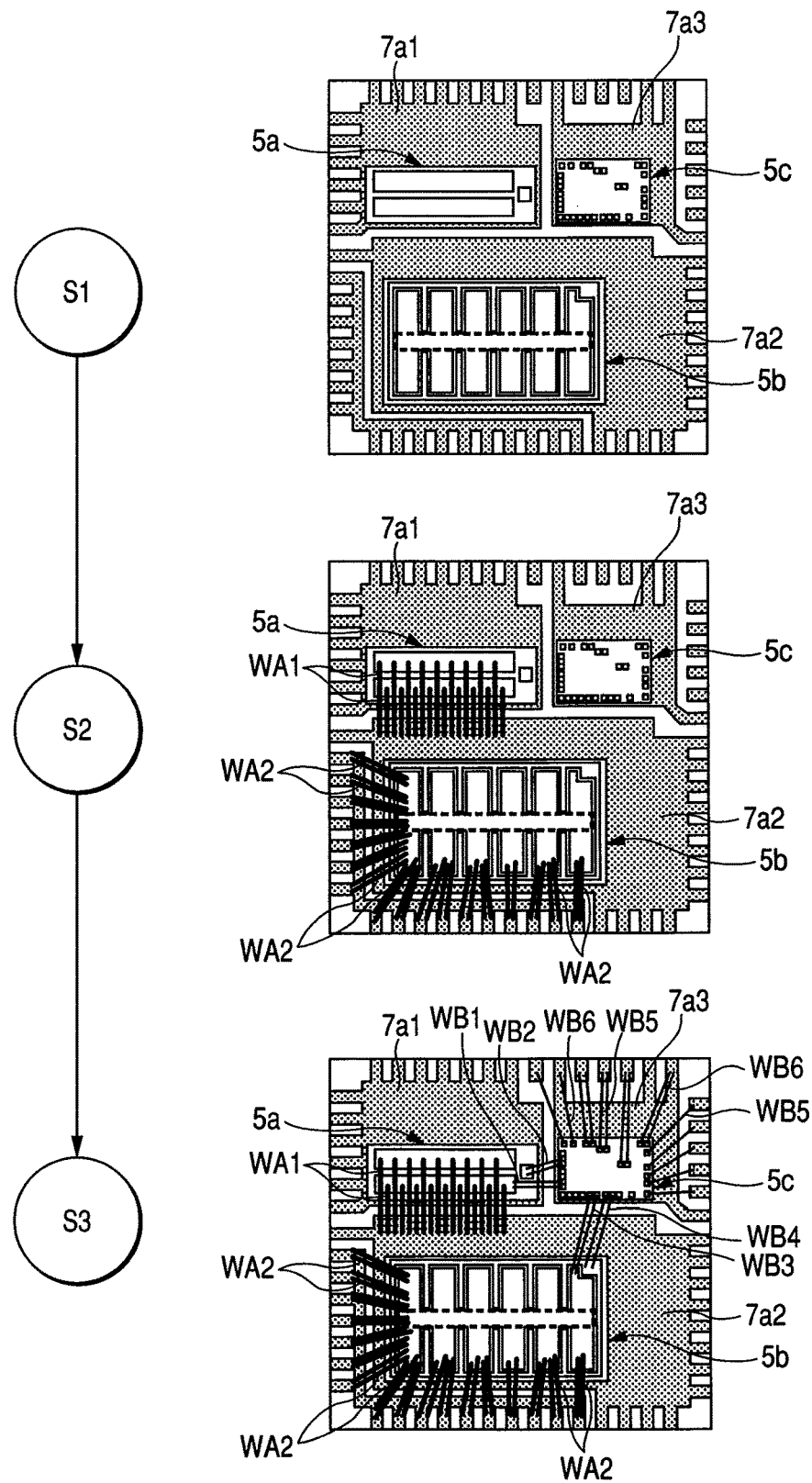
FIG. 50 is a plan view illustrating the unit region of the lead frame in the fabrication step of the semiconductor device of FIG. 32.

After the semiconductor chips 5a to 5c are mounted over the main surface of the die pads 7a1 to 7a3 in each unit region of the lead frame 7 via the die bond paste, the die bond paste is cured by heat treatment, whereby the semiconductor chips 5a to 5c are firmly adhered onto the die pads 7a1 to 7a3 as illustrated in Step S1 of FIG. 50 (Steps 104 and 105). It is also possible to improve the productivity by mounting the semiconductor chips in ascending order, that is, 5c, 5a and 5b.

Then, two kinds of wires WA1, WA2 and WB1 to WB6 are prepared (Steps 106a and 106b). The wires WA1, WA2 and WB1 to WB6 are each made of, for example, gold (Au). The wires WA1 and WA2 have a diameter as wide as about 50 μm, while the wires WB1 to WB6 have a diameter as narrow as about 30 μm. These two kinds of wires WA1, WA2 and WB1 to WB6 are bonded by the ultrasonic thermocompression method (Step 106). A load necessary for bonding treatment of the thick wires WA1 and WA2 is greater than that necessary for the bonding treatment of the thin wires WB1 to WB6. When the thick wires WA1 and WA2 are bonded after the bonding of the thin wires WB1 to WB6, the thin wires WB1 to WB6 may be disconnected by a great load applied upon bonding of the thick wires. According to the investigation by the present inventors, such a disconnection failure tends to occur particularly when the die pads 7a1 to 7a3 are separated from each other. In the wire bonding step of Embodiment 4, bonding of the thin wires WB1 to WB6 is performed after bonding of the thick wires WA1 and WA2, as illustrated in the steps S2 and S3 of FIG. 50. This makes it possible to suppress or prevent the disconnection failure of the thin wires WB1 to WB6.

A sealing resin and a sealing tape are then prepared (Steps 107a and 107b). A resin sealing (molding) step is then performed by the transfer molding process (Step 108). The transfer molding process is a process of forming a resin sealant MB by using a mold equipped with a pot, runner, resin pouring gate and cavity and pouring a thermosetting resin into the cavity from the pot through the runner and resin pouring gate. Adopted for the manufacture of a QFN type package 20B is a one-on-one system transfer molding process for sealing a semiconductor chip mounted on each product formation region with a resin per each product formation region or a batch system transfer molding process for sealing, at once, a plurality of semiconductor chips mounted on each product formation region, while using a multi-piece forming lead frame having a plurality of product formation regions (device formation regions, product acquiring regions). In this Embodiment 4, the one-on-one system transfer molding process is employed.

The resin sealing step is performed, for example, in the following manner. First, after a sealing tape is placed over the surface of a bottom force for resin molding, a lead frame 7 is laid over the sealing tape and the resin mold is clamped so that the backsides of a portion of the plurality of leads 7b and die pads 7a1 to 7a3 adhere to the sealing tape. The sealing tape is adhered to the backside of the lead frame 7 prior to the resin sealing step, because of the following reason. In the resin sealing step of such a constitution as having a plurality of die pads 7a1 to 7a3 in one package 6 as in Embodiment 4, a resin tends to leak from the intersection Z of the slits forming the boundaries of the three die pads 7a1 to 7a3 as illustrated in FIG. 48. The leaked resin (resin burr) penetrates into the backside (a mounting surface when the package 20B is mounted on a wiring substrate) of the die pads 7a1 to 7a3 via this intersection Z and may cause a packaging failure by disturbing the mounting of the package 20B. In order to prevent such a failure, the sealing tape is adhered in advance. In this Embodiment 4, the sealing tape is adhered firmly to the backsides of the tree die pads (including the slits forming the boundaries of three die pads) prior to the sealing step to prevent a resin leakage as described above and leakage of the sealing resin from the intersection Z to the backsides of the die pads 7a1 to 7a3 is prevented. This makes it possible to prevent a packaging failure of the package 20B which will otherwise occur by a resin burr. The sealing tape preferably has an adhesion strength providing a viscosity strength as high as 0.5N or greater, because firm adhesion of the sealing tape to the die pads 7a1 to 7a3 is desired upon sealing step. In recent years, a lead frame 7 subjected to flash plating with nickel (Ni)/palladium (Pd)/gold (Au) has been used. In the case of the lead frame 7 plated with Pd (palladium), a lead-free solder can be used upon mounting the package 20B on the wiring substrate and therefore it is friendly to the environment. In addition to such an effect, although ordinarily employed lead frames need application of a silver (Ag) paste in advance to the wire bonding portion of the lead frame, but a wire can be connected to the above-described lead frame to which no Ag paste material has been applied. Even the Pd-plated lead frame 7 is not free from the packaging failure problem owing to a resin burr as described above. If a resin burr is formed, it is removed by washing. Since the Pd-plated lead frame 7 is prepared by subjecting the lead frame 7 to plating prior to the resin sealing step in order to reduce the number of manufacturing steps, the Pd-plated film is inevitably peeled together with the resin burr when this resin burr is peeled by washing. In short, there is a possibility of the Pd-plated lead frame 7 becoming unusable. In Embodiment 4, on the other hand, the Pd-plated lead frame 7 having advantages as described above can be used, because the resin burr formation is prevented and therefore, strong washing treatment is not necessary after the sealing step.

A sealing resin is poured into the top force (cavity) and the semiconductor chips 5a to 5c and a plurality of wires WA1, WA2, and WB1 to WB6 are sealed with a resin to expose a portion of the die pads 7a1 to 7a3 and a portion of the plurality of leads 7b from the resin sealant MB (sealing member), whereby a resin sealant MB is formed. In this Embodiment 4, a half etched region is formed at the periphery on the backside of the die pads 7a1 to 7a3 and lead 7b. By forming such a half etched region (a hatched region), the adhesion force of the die pads 7a1 to 7a3 and leads 7b with the resin sealant MB can be heightened. In short, escape of the lead from the sealant can be suppressed or prevented. In particular, with an increasing demand for thinner and lighter semiconductor devices, the lead frame becomes thinner. In addition, since the lead 7b is thinner than another portion and its end is free without being connected, resin sealing as is may cause deformation or peeling of the lead portion. Therefore, the backside peripheral portion on the end side of the lead 7b is also half etched to form a step difference at the backside periphery on the end side of the lead 7b. By the sealing step after half etching, the sealing resin penetrates into and covers the half-etched portion and holds the peripheral portion on the end side of the lead 7b, whereby the deformation or peeling of the lead 7b can be suppressed or prevented.

After such a resin sealing step, the sealing resin thus poured is cured (resin curing step 108). A marking step 109 is then performed, followed by separating individual product portions from the lead frame 7 (Step 110).

(Embodiment 5)

Figure 51:
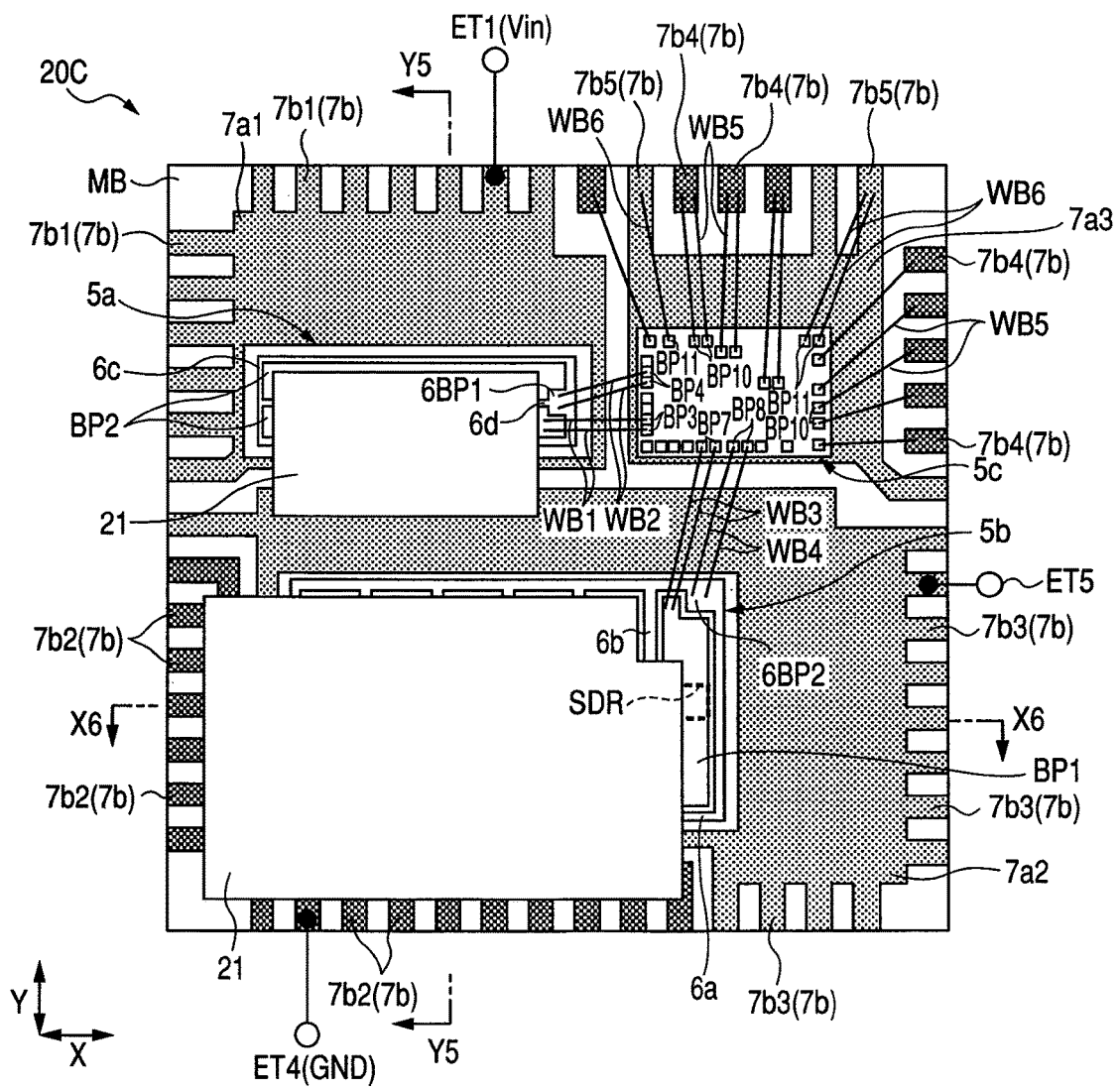
FIG. 51 is a plan view illustrating the constitution example of a semiconductor device according to a still further embodiment of the present invention.
Figure 52:
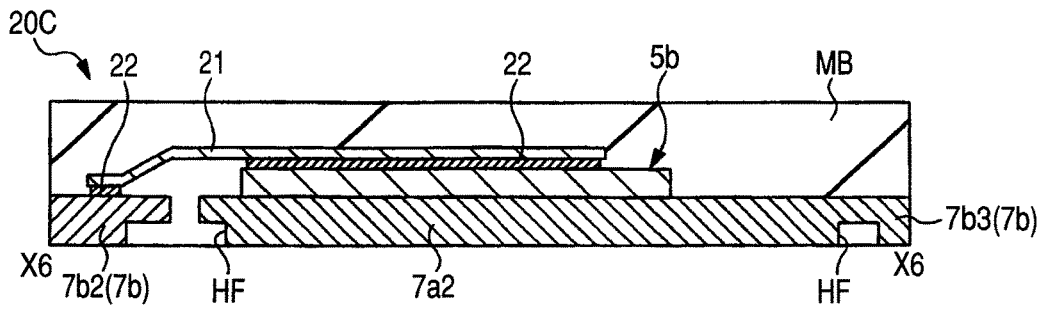
FIG. 52 is a cross-sectional view taken along a line X6-X6 of FIG. 51.
Figure 53:
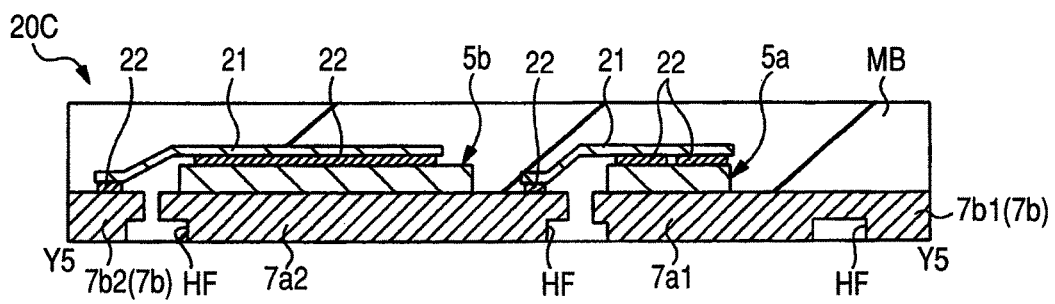
FIG. 53 is a cross-sectional view taken along a line Y5-Y5 of FIG. 51.

FIG. 51 is a plan view of the constitution example of a package 20C of Embodiment 5, FIG. 52 is a cross-sectional view taken along a line X6-X6 of FIG. 51, and FIG. 53 is a cross-sectional view taken along a line Y5-Y5 of FIG. 51. In FIG. 51, the resin sealant MB is viewed through and the die pads 7a1 and 7a2, lead 7b and interconnect portion 7c are hatched to facilitate the understanding of this diagram.

In Embodiment 5, some interconnects for electrically connecting the pad and each part are replaced by metal sheet interconnects 21. Described specifically, the pad BP2 for source electrode of the power MOS Q1 of the semiconductor chip 5a is electrically connected to the die pad 7a2 via one metal sheet interconnect 21. The pad BP1 of the power MOS Q2 of the semiconductor chip 5b is electrically connected to the lead 7b2 via one metal sheet interconnect 21. The constitution and connection method, to another part, of this metal sheet interconnect 21 are similar to those as described in Embodiment 1 so that description is omitted here. The metal sheet interconnect 21 is also covered, in its entirety, with the resin sealant MB.

According to Embodiment 5, an inductance and impedance parasitic to the interconnect path can be reduced further by using the metal sheet interconnect 21 instead of a wire, which leads to a further reduction in the switching loss and diode conduction loss. As a result, the voltage conversion efficiency of the non-insulated DC-DC converter 1 can be improved further compared with that of Embodiment 4.

In addition, the anode electrode of SBD D1 is electrically connected to a reference potential GND via the metal sheet interconnect 21 having a large area so that an interconnect resistance on the anode side and an inductance La parasitic to the anode electrode side can be reduced drastically. Accordingly, compared with Embodiment 4, the SBD D1 is able to exhibit its effect fully and diode conduction loss and diode recovery loss can be reduced, whereby the voltage conversion efficiency of the non-insulated DC-DC converter 1 can be improved further. In addition, a reduction in the inductances Lk and La lead to a further reduction in the noise.

When attention is paid only to an inductance parasitic to an interconnect path, the metal sheet interconnect 21 is preferably employed for the formation of the wires WB1 to WB6 for electrically connecting a plurality of pads BP3, BP4, BP7, BP8, BP10 and BP11 of the driver circuits 3a and 3b to each part. The opening portion of each of the plurality of the pads BP3, BP4, BP7, BP8, BP10 and BP11 of the driver circuits 3a and 3b is as narrow as 90 µm so that a metal sheet wire 21 having a narrow width must be used when the metal sheet interconnect 21 is substituted for the wires WB1 to WB6. Effects for reducing a parasitic inductance in this case are presumed to be not sufficient even if they are compared with those brought by the use of a wire. In addition, a metal sheet interconnect 21 as narrow as 100 µm or less cannot be manufactured easily and it cannot be connected so easily as a wire. There is therefore a fear of an increase in the production cost and lowering in the production yield. The semiconductor chip 5c for the driver circuits 3a and 3b are housed in the same package 20C so that a parasitic inductance can be decreased sufficiently even by the use of a wire. In this Embodiment 5, therefore, the plurality of the pads BP3, BP4, BP7, BP8, BP10 and BP11 of the driver circuits 3a and 3b and each part are connected via wires WB1 to Wb6.

In an interconnect path for connecting the power MOS Q1 and Q2 and the driver circuits 3a and 3b, however, a plurality of wires WB1 and WB2 are connected in parallel in order to reduce the inductance parasitic to this interconnect path. At this portion, a metal sheet interconnect 21 having as wide as 200 µm can be used so that this metal sheet interconnect 21 can be substituted for the wires WB1 and WB2. By electrically connecting the power MOS Q1 and Q2 and the driver circuits 3a and 3b via the metal sheet interconnect 21, a parasitic inductance can be reduced and therefore, a switching loss can be reduced.

(Embodiment 6)

Figure 54:
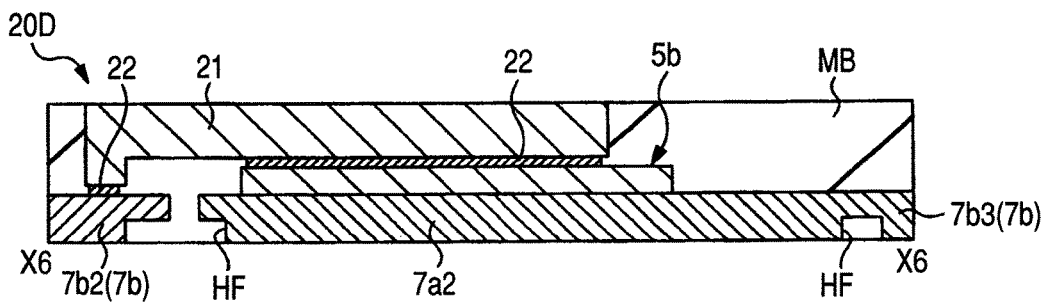
FIG. 54 is a cross-sectional view of a portion of a semiconductor device according to a still further embodiment of the present invention corresponding to a portion taken along a line X6-X6 of FIG. 51.
Figure 55:
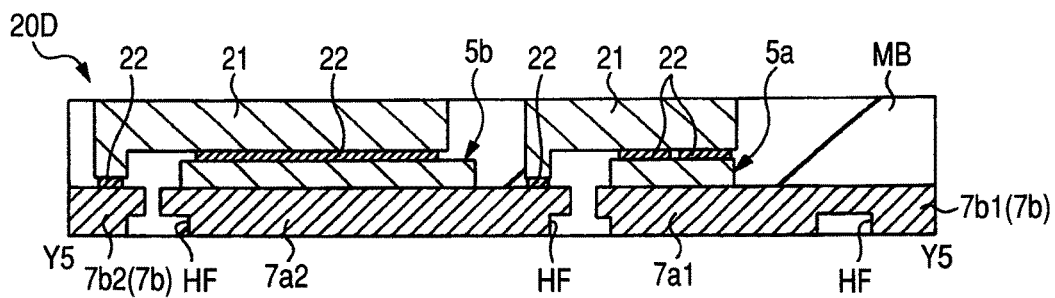
FIG. 55 is a cross-sectional view of a portion of the semiconductor device of FIG. 54 corresponding to a portion taken along a line Y5-Y5 of FIG. 51.

FIGS. 54 and 55 are cross-sectional views of portions of a package 20D of Embodiment 6 corresponding to those taken along a line X6-X6 and Y5-Y5 of FIG. 51. The package 20D has an inside similar to that illustrated in FIG. 51. The upper surface of the package 20D is a surface opposite to the mounting surface (a surface opposite to the wiring substrate) of the package 20D.

In Embodiment 6, as in Embodiment 5, pads and parts are connected via a metal sheet interconnect 21. A portion of the metal plate interconnect 21 is however exposed from the resin sealant MB. The metal sheet interconnect 21 is disposed so as to cover the formation regions of the power MOS Q1 and Q2 which are heat generation sources of the semiconductor chips 5a and 5b. Here, both two metal sheet interconnects 21 covering the semiconductor chips 5a and 5b are exposed from the upper surface of the package 20D. Alternatively, only the metal sheet interconnect 21 on the side of the semiconductor chip 5b on which the power MOS Q2 for low-side switch having a relatively large heat generation amount has been formed may be exposed. Heat radiation property can be improved further by placing a heat radiating fin over the package 20D and joining it to the exposed surface of the metal sheet interconnect 21.

The metal sheet interconnect 21 is imparted with a heat radiation function and no other part for heat radiation is necessary in Embodiment 6. According to Embodiment 6, therefore, in addition to the effects obtained by Embodiments 4 and 5, the number of fabrication steps of the package 20D can be decreased compared with the case where a heat radiation part must be added, and therefore the fabrication time of the package 20D can be shortened. Owing to a decrease in the number of the parts, a cost reduction of the semiconductor device can also be accomplished.

(Embodiment 7)

Another problem which owes to a current and frequency increasing tendency of a DC-DC converter is heat upon operation. In particular, in the description of Embodiments 1 and 4 to 6, the semiconductor chips 5a and 5b are housed in one package so that high heat radiation property becomes necessary. In Embodiment 7, a constitution in consideration of its heat radiation property will next be described.

Figure 56:
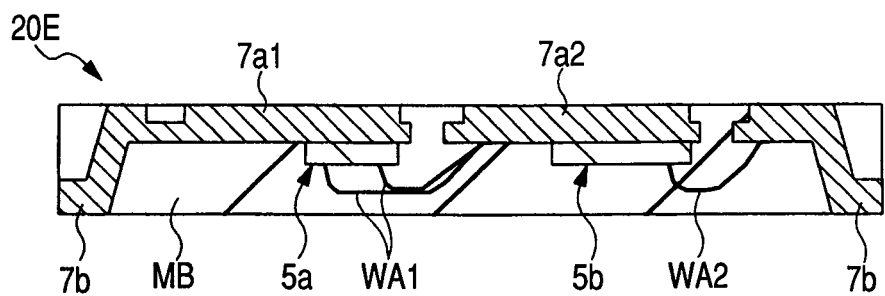
FIG. 56 is a cross-sectional view of a semiconductor device according to a still further embodiment of the present invention.

FIG. 56 is a cross-sectional view of a package 20 according to Embodiment 7, in which a lead 7b is inverted compared with the lead 7b of Embodiments 4 to 6. In this structure, the backside surfaces (surfaces opposite to surfaces on which the semiconductor chips 5a and 5b are mounted) of the die pads 7a1 and 7a2 are exposed from the upper surface of the package 6 and the backside (a surface to be joined with the terminal of the wiring substrate) of the lead 7b is exposed from the mounting surface of the package 20E.

Figure 57:
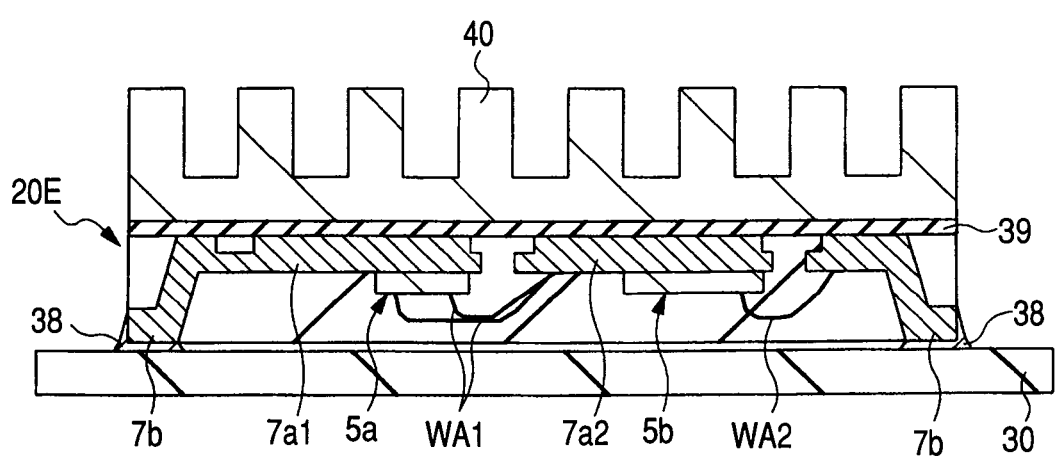
FIG. 57 is a cross-sectional view of the semiconductor device of FIG. 56 equipped with a heat radiation fin.

FIG. 57 is a cross-sectional view illustrating one example of the package 20E of FIG. 56 mounted on the wiring substrate 30. The lead 7b on the backside (mounting surface) of the package 20E is bonded to the terminal of the wiring substrate 30 via an adhesive 38 such as lead/tin solder. To the upper surface of the package 20E, that is, the backsides of the die pads 7a1 and 7a2, a radiating fin (heat sink) 40 is bonded via an insulating sheet 39 having a high thermal conductivity such as silicone rubber. In such a constitution, the heat generated by the semiconductor chips 5a and 5b are transferred from the backsides of the semiconductor chips 5a and 5b to the radiating fin 40 via the die pads 7a1 and 7a2 and then released. Even by a current increase and frequency heightening of the non-insulated DC-DC converter 1, high heat radiation property is available in such a constitution as having two semiconductor chips 5a and 5b in one package 20E. An air-cooled heat sink is given here as an example, but a liquid cooled heat sink having a flow channel capable of pouring cool running water to a radiator can be used instead.

(Embodiment 8)

In Embodiments 1 to 7, SBD and MOS are formed in respective regions of one semiconductor chip. In this structure, however, the formation region of MOS is not disposed in the formation region of SBD and in a semiconductor chip having a predetermined size, the area of MOS becomes small in inverse proportion to that of SBO, which increases a conduction loss of the MOS.

Figure 58:
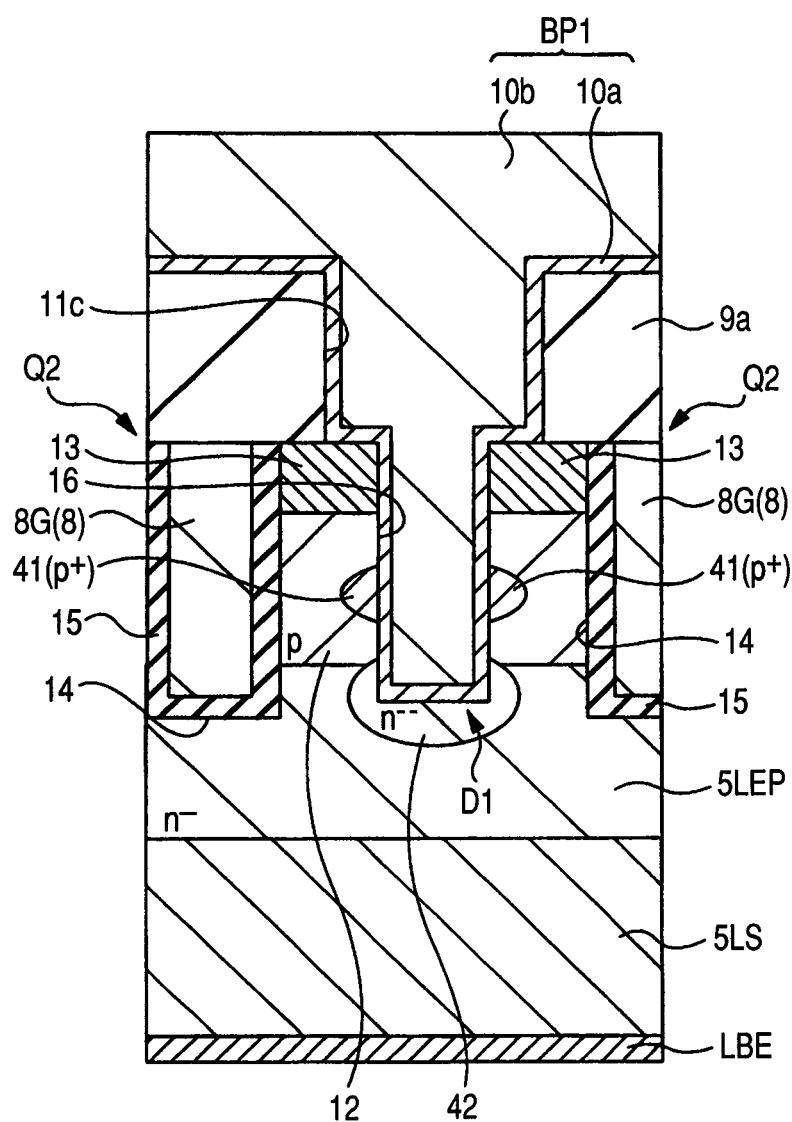
FIG. 58 is a fragmentary cross-sectional view of a second semiconductor chip of a semiconductor device according to a still further embodiment of the present invention.

In Embodiment 8, as illustrated in FIG. 58, the SBD D1 is formed in the formation region LQR (active region) of the unit transistor of the power MOS Q2. In the unit transistor of the power MOS Q2, the trench 16 originally formed to connect the pad BP1 and the p type semiconductor region 12 is deepened to go through the channel layer (p type semiconductor region 12) from the main surface and bring the barrier metal layer 10a in the trench 16 into contact with the n⁻ type epitaxial layer 5LEP on the bottom of the trench 16, whereby a Schottky connection is formed. Between the pad BP1 and the p type semiconductor region 12, an ohmic connection is formed on the side surface of the trench 16.

Figure 59:
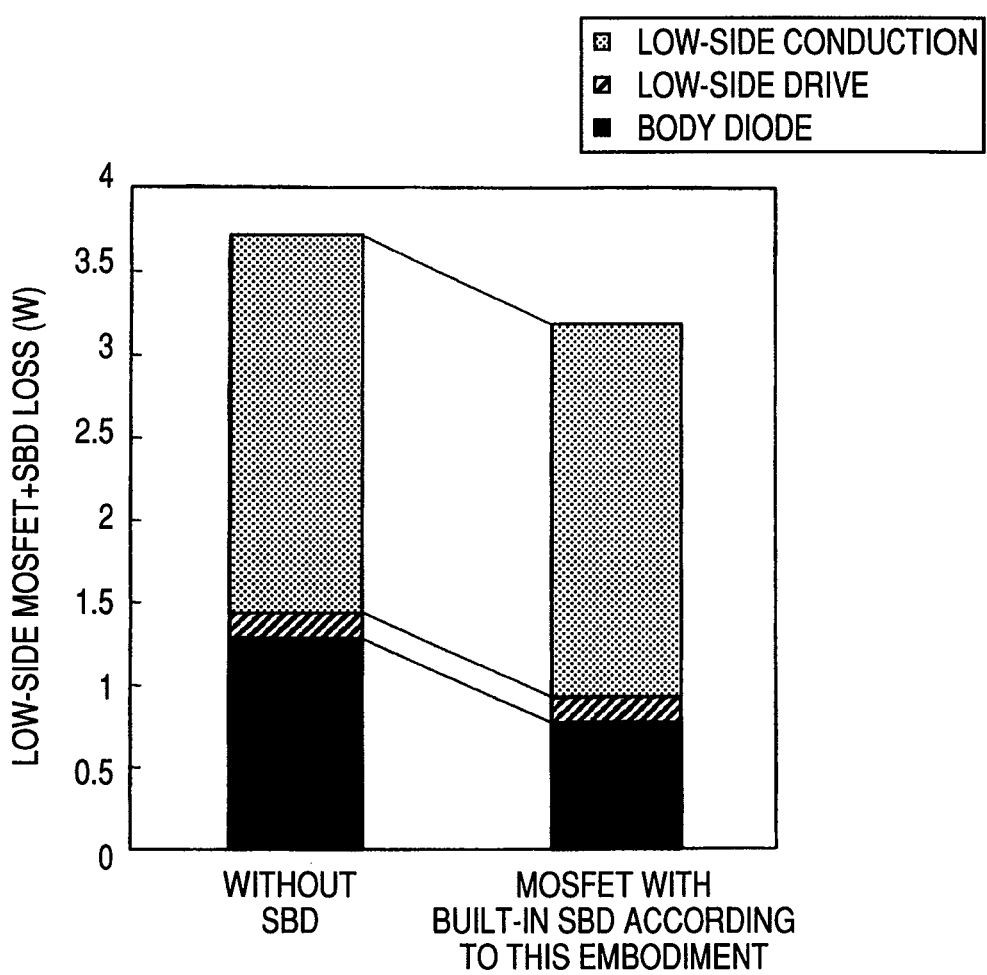
FIG. 59 is a graph showing the calculation results of a loss of the semiconductor device of FIG. 58.

By employing such a constitution, an exclusive region for the SBD D1 does not become necessary in the semiconductor chip 5b, whereby an SBD having a large area can be formed without decreasing the area of the power MOS Q2 formation region within the main surface of the semiconductor chip 5b. FIG. 59 shows the calculation results of loss analysis of Embodiment 8. In this structure, the parasitic diode (body diode) Dp of the power MOS Q2 and SBD D1 are treated as one because they cannot be discriminated upon calculation, but the graph suggests that there occurs no change in the conduction loss and drive loss but a great reduction in the loss of a body diode. A loss reducing effect when the SBD D1 is formed in a region different from the MOS region is about 0.2 W, while a loss reduction of about 0.55 W can be attained by the constitution in Embodiment 8.

The present inventors have however found that the below-described two problems occur only by deepening the trench 16 simply.

A first problem is insufficient connection between the barrier metal layer 10a and the p type semiconductor region 12. Described specifically, the p type semiconductor region 12 has usually an impurity concentration not greater than $10^{17}/cm^3$, which is not sufficient for the formation of an ohmic contact. It is therefore impossible to form a good connection between the pad BP1 and the p type semiconductor region 12.

A second problem is a large leak current at the Schottky junction, because the n⁻ type epitaxial layer 5LEP has a high impurity concentration. In the constitution of Embodiment 8, the power MOS Q2 and SBD D1 are formed in the same region so that it is impossible to form a deep n well only in the formation region of the power MOS Q2 or to form a Schottky connection in the formation region of the SBD D1 by using a low-concentration n⁻ type epitaxial layer, as Embodiments 1 to 7. When a Schottky junction is formed in the n⁻ type epitaxial layer having an impurity concentration not greater than $10^{16}/cm^3$, a loss due to the leak current increases by excessively large leak current of the SBD.

With a view to overcoming the first problem, In Embodiment 8, as illustrated in FIG. 58, a p⁺ type semiconductor region (sixth semiconductor layer) 41 is formed in the p type semiconductor region 12 so as to be brought into contact with the side surface of the trench 16, and on the side surface of the trench 16, the barrier metal layer 10a and the p⁺ type semiconductor region 41 form an ohmic contact. This enables the formation of a good connection between the pad BP1 and the p type semiconductor region 12. The p⁺ type semiconductor region 41 is formed so as not to reach the channel (that is, the side surface of the trench 14). When the p⁺ type semiconductor region 41 reaches the channel, formation of an inversion layer becomes difficult, which inevitably increases the threshold voltage Vt. By forming the layer so as not to reach the channel as in Embodiment 8, the above-described problem can be overcome.

With a view to overcoming the second problem, the impurity concentration of the n⁻ type epitaxial layer 5LEP at the Schottky junction is reduced locally by forming an n⁻⁻ type semiconductor region (fifth semiconductor layer) 42 in a region, on the bottom side of the trench (second trench) 16, with which the barrier metal layer 10a is in contact, in Embodiment 8. In other words, by the n⁻⁻ type semiconductor region 42, a region having a higher resistance than that of the n⁻ type epitaxial layer 5LEP is formed at the Schottky junction. This makes it possible to lower the leak current of the SBD D1 without increasing the on-resistance.

In this case, the SBD D1 may be formed in every line between two adjacent stripe-shaped gate electrodes 8 in each unit transistor cell formation region LQR of the power MOS Q2 of the semiconductor chip 5b as illustrated in FIG. 11. It may be formed alternately or at every several lines. The planar layout of the pads BP1, 6BP, gate fingers 6a and 6b, gate electrode 8B and gate interconnect 8L are similar to those as described referring to FIGS. 9 to 11 and 25 to 28.

Figure 60:
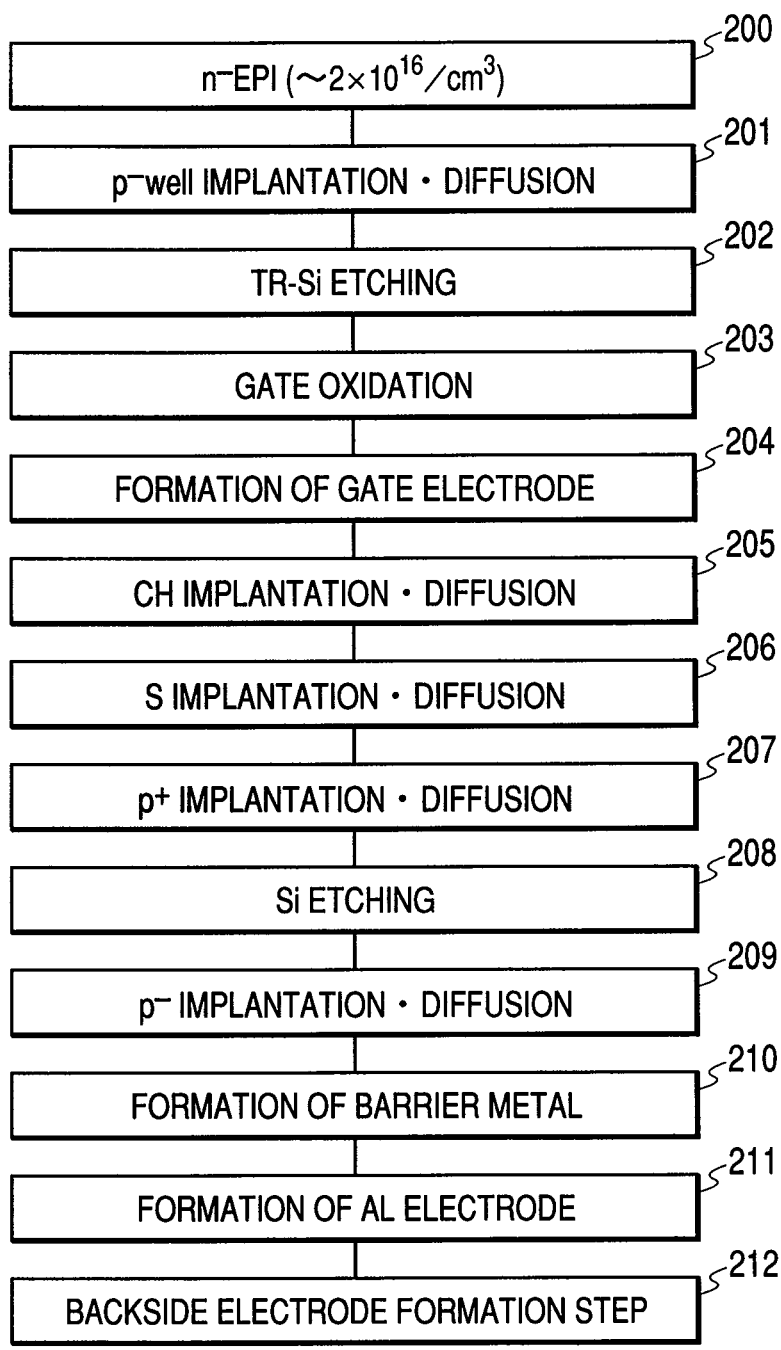
FIG. 60 is a flow chart of a manufacturing example of a second semiconductor chip of the semiconductor device of FIG. 58.

One example of the manufacturing method of the semiconductor chip 5b according to Embodiment 8 will be described based on the flow chart of FIG. 60 referring to FIGS. 61 to 66. For comparison, an example of the manufacturing method of a semiconductor chip having SBD and MOS, which was investigated by the present inventors, is illustrated in FIG. 67.

Figure 61:
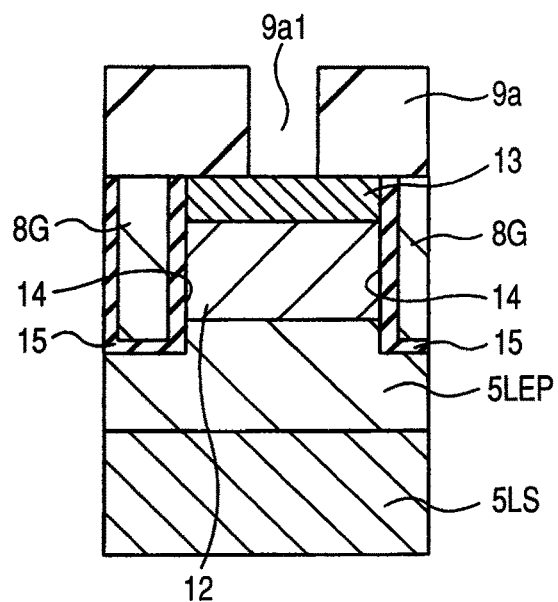
FIG. 61 is a fragmentary cross-sectional view of the second semiconductor chip of FIG. 58 during a manufacturing step.

As illustrated in FIG. 61, a semiconductor wafer (semiconductor substrate 5LS in the planar disc shape) made of an n⁺ type silicon single crystal is prepared and over its main surface, an n⁻ type epitaxial layer 5LEP having an impurity concentration of, for example, $2\times10^{16}/cm^3$ is formed by the epitaxial process (Step 200). In Step 300 of FIG. 67 which was investigated by the present inventors, the impurity concentration of the epitaxial layer is as low as about $5\times10^{15}/cm^3$, while in the method of Embodiment 8, it is not necessary to lower the impurity concentration of the epitaxial layer 5LEP in order to form the SBD D1 within the unit transistor cell formation region of the power MOS Q2.

The above-described p well PWL1 is formed in the epitaxial layer 5LEP of the semiconductor wafer by ion implantation and thermal diffusion treatment subsequent thereto (Step 201). In the semiconductor chip of FIG. 67 investigated by the present inventors, a deep n well NWL1 is formed (Step 300) in the epitaxial layer 5LEP in order to reduce the on-resistance of the power MOS Q2 prior to the formation step 201 of the p well PWL1. In Embodiment 8, on the other hand, a deep n well is not necessary because lowering in the impurity concentration of the epitaxial layer 5LEP is not required, whereby the formation step 300 can be omitted. This makes it possible to shorten the manufacturing time of the semiconductor chip 5b and improve the throughput.

After formation of a trench 14 (Step 202) reaching the epitaxial layer 5LEP on the main surface of the semiconductor wafer, the surface of the epitaxial layer 5LEP on the main surface of the semiconductor wafer is oxidized to form a gate insulating film 15 (Step 203) on the surface of the epitaxial layer 5LEP including the inside of the trench 14. A low-resistance polycrystalline silicon film is then deposited over the main surface of the semiconductor wafer and at the same time, is filled in the trench 14. By patterning the polycrystalline silicon film by etching, the gate electrode 8G is formed in the trench 14 and the gate interconnect 8L is formed (Step 204).

In the main surface of the semiconductor wafer, a p type impurity such as boron is ion implanted, followed by heat diffusion, whereby a p type semiconductor region 12 is formed (Step 205). In the main surface of the semiconductor wafer, an n type impurity such as phosphorus (P) or arsenic (As) is ion implanted, followed by heat diffusion, whereby an n⁺ type semiconductor region 13 is formed over the p type semiconductor region 12 between the gate electrodes 8G (Step 206).

Figure 62:
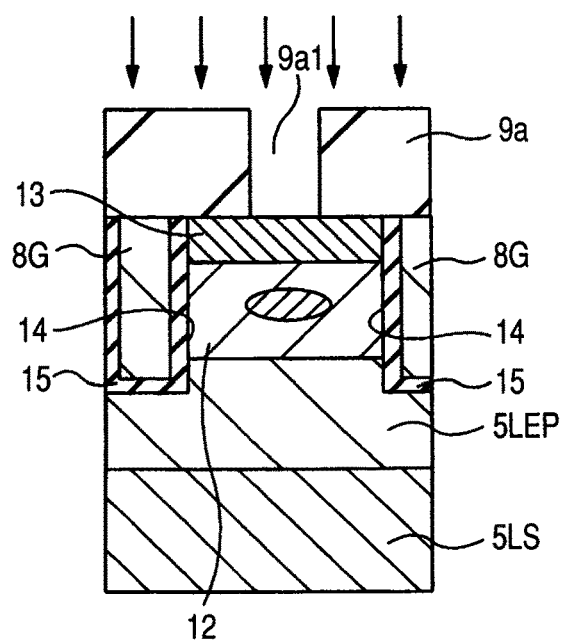
FIG. 62 is a fragmentary cross-sectional view of the second semiconductor chip during a manufacturing step following that of FIG. 61.
Figure 63:
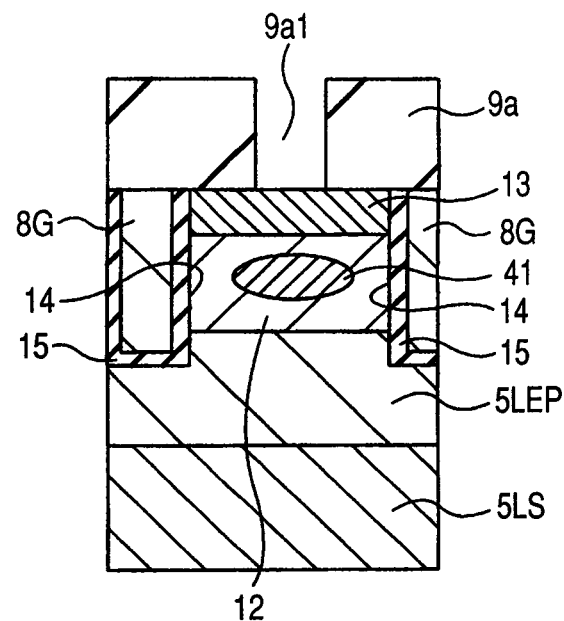
FIG. 63 is a fragmentary cross-sectional view of the second semiconductor chip during a manufacturing step following that of FIG. 62.

After deposition of an insulating layer 9a over the main surface of the semiconductor wafer, an opening portion 9a1 is formed in the insulating layer 9a. As illustrated in FIG. 62, with the insulating layer 9a as an ion implantation mask, a p type impurity such as boron is ion-implanted into the p-type semiconductor region 12, followed by heat diffusion treatment of the impurity, whereby a p$^+$ type semiconductor region 41 two-dimensionally wider than the opening portion 9a1 is formed in the p type semiconductor region 12 of the semiconductor wafer as illustrated in FIG. 63 (Step 207). This heat diffusion treatment is preferably conducted at low temperature for short hours so that the p$^+$ type semiconductor region 41 does not reach the channel side (side surface of the trench 14).

Figure 64:
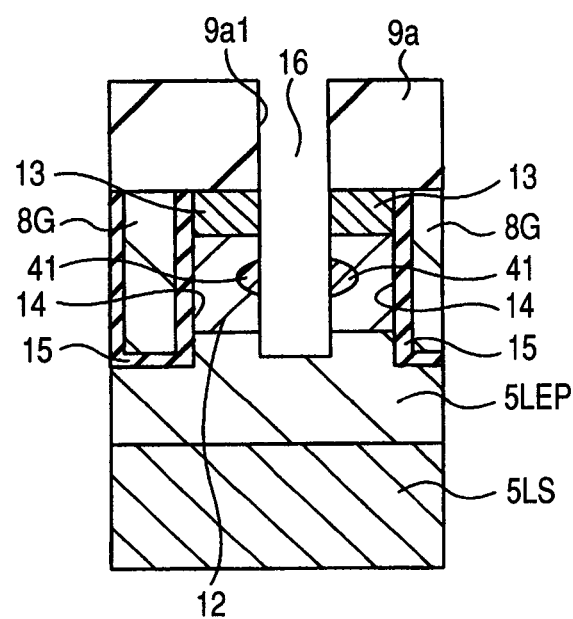
FIG. 64 is a fragmentary cross-sectional view of the second semiconductor chip during a manufacturing step following that of FIG. 63.

With the insulating layer 9a as an etching mask, a silicon portion exposed therefrom (that is, n$^+$ type semiconductor region 13, p type semiconductor region 12, p$^+$ type semiconductor region 41, p type semiconductor region 12 and the upper portion of the n$^-$ type epitaxial layer 5LEP in this order) is etched, whereby a trench 16 going through the p type semiconductor region 12 and reaching the n$^-$ type epitaxial layer 5LEP lying thereunder is formed (Step 208) as illustrated in FIG. 64. The p$^+$ type semiconductor region 41 is exposed from the side surface of the trench 16.

Figure 65:
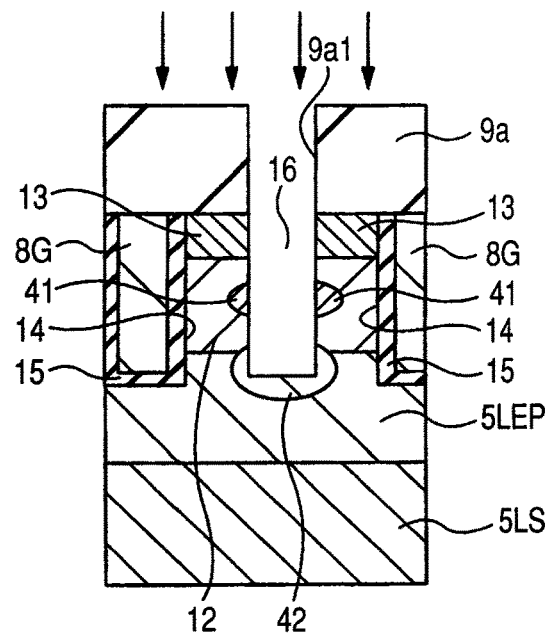
FIG. 65 is a fragmentary cross-sectional view of the second semiconductor chip during a manufacturing step following that of FIG. 64.

As illustrated in FIG. 65, with the insulating layer 9a as an ion implantation mask, a p type impurity is ion-implanted into the bottom of the trench 16 to locally lower the concentration of the n type impurity of the n$^-$ type epitaxial layer 5LEP on the bottom of the trench 16. By the heat diffusion treatment, then, an n$^{--}$ type semiconductor region 42 is formed on the bottom region of the trench 16 (Step 209). In this Embodiment 8, the p$^+$ type semiconductor region 41 has already been formed so that the p$^+$ implantation diffusion step of FIG. 67 is not necessary.

Figure 66:
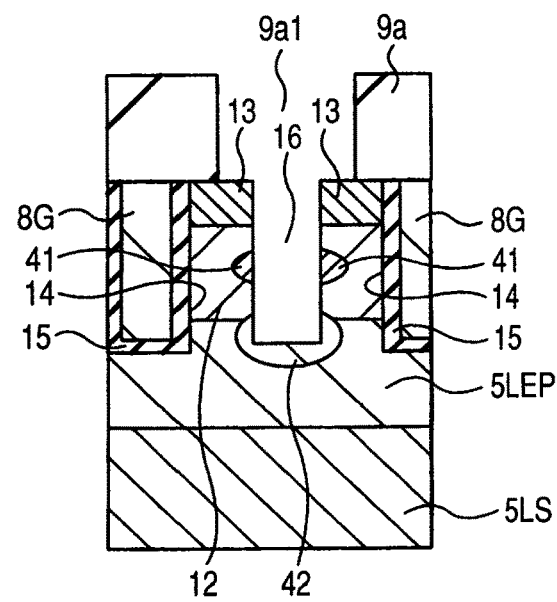
FIG. 66 is a fragmentary cross-sectional view of the second semiconductor chip during a manufacturing step following that of FIG. 65.
Figure 67:
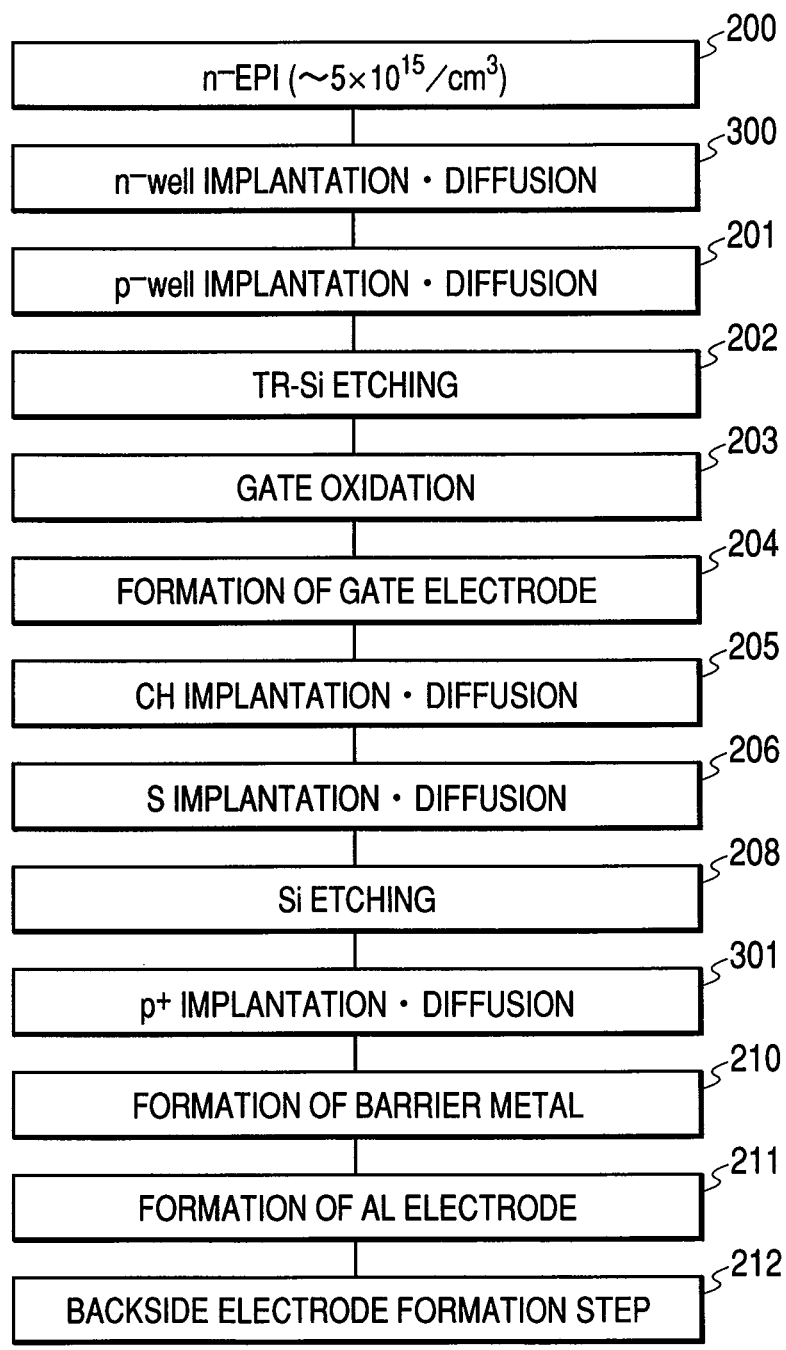
FIG. 67 is a flow chart showing manufacturing steps of the second semiconductor chip investigated by the present inventors.

The insulating layer 9a is etched to widen the opening width of the opening portion 9a1 as illustrated in FIG. 66. The opening portion 9a1 in this stage is the above-described contact hole 11c, from the bottom of which the n$^+$ type semiconductor region 13 is exposed. Then, as illustrated in FIG. 58, a barrier metal layer 10a and a metal layer 10b are deposited successively (Steps 210 and 211) and by patterning of them by etching, the pad BP1 and 6BP and gate fingers 6a and 6b are formed. Gold (Au) is then deposited over the backside of the semiconductor wafer to form a backside electrode LBE (Step 212). After conventionally employed steps, the semiconductor wafer is cut into individual semiconductor chips.

Inventions made by the present inventors were described based on some embodiments. It should however be borne in mind that the present invention is not limited to them. It is needless to say that the invention can be modified to an extent not departing from the gist of the invention.

For example, a flat package structure is given as an example of the package structure in the above-described embodiment. The package structure is not limited to it, but, for example, a BGA (Ball Grid Array) package structure can also be adopted.

In the above-described description, the present invention made by the present inventors is applied to a power supply circuit for driving CPR or DSP which is an application field becoming the background of the invention. It can be applied to various fields without being limited to the above-described field, for example, power supply circuit for driving another circuit.

The present invention can be applied to the manufacture of semiconductor devices.

What is claimed is:

1. A semiconductor device including a DC-DC converter, comprising:
    first and second die pads;
    a lead arranged near the second die pad than the first die pad;
    a first semiconductor chip formed over the first die pad and electrically connected with the first die pad;
    a second semiconductor chip formed over the second die pad and electrically connected with the second die pad; and
    a driver chip configured to control the first and second semiconductor chips,
    wherein the first semiconductor chip includes a first MOSFET having a first gate electrode, a first source and a first drain,
    wherein the second semiconductor chip includes a schottky barrier diode and a plurality of power MOSFETs which are formed on a semiconductor substrate,
    wherein the semiconductor substrate includes a first long side, a second long side located on the opposite side of the first long side, a first short side and a second short side located on the opposite side of the first short side,
    wherein the schottky barrier diode is formed in a first region of the semiconductor substrate and includes an anode electrode and a cathode electrode,
    wherein the plurality of power MOSFETs are formed in a plurality of second regions of the semiconductor substrate and respectively include a second gate electrode, a second source and a second drain,
    wherein a first gate metal electrically connected with the first gate electrode and a first source metal electrically connected with the first source are formed over a top surface of the first semiconductor chip,
    wherein a first drain electrode electrically connected with the first drain is formed over a rear surface of the first semiconductor chip,
    wherein a second gate metal is formed over the semiconductor substrate, is electrically connected to the second gate electrodes and surrounds the first region and the second regions in a planar view,
    wherein a plurality of gate fingers are unified with the first metal layer, are extending to a direction along the first short side and are arranged between each of the second regions,
    wherein a second source metal is formed over the first region and the second regions and is electrically connected to the second sources and the anode electrode,
    wherein a second drain electrode electrically connected with the second drains is formed over a rear surface of the second semiconductor chip,
    wherein the driver chip includes a first electrode pad and a second electrode pad,
    wherein the first electrode pad and the first gate metal are electrically connected by a first wire,
    wherein the second electrode pad and the second gate metal are electrically connected by a second wire,
    wherein the first source metal and the second die pad are electrically connected by a first metal sheet,
    wherein the second source metal and the lead are electrically connected by a second metal sheet, and
    wherein a length along the first long side of the first region is larger than a length along the first short side of the first region.

2. The semiconductor device according to claim 1,
    wherein the second semiconductor chip has a first long side, a second long side, a first short side and a second short side, and
    wherein the lead is arranged along a first long side and a first short side.

3. The semiconductor device according to claim 2,
wherein the first semiconductor chip has a third long side, a fourth long side, a third short side and a fourth short side, and
wherein the first, second, third and fourth long sides are parallel.

4. The semiconductor device according to claim 1,
wherein the first source metal and the first metal sheet are connected by a first bump,
wherein the first metal sheet and the second die pad are connected by a second bump,
wherein the second source metal and the second metal sheet are connected by a third bump, and
wherein the second metal sheet and the lead are connected by a fourth bump.

* * * * *